(12) United States Patent
Itasaka et al.

(10) Patent No.: US 11,496,093 B2
(45) Date of Patent: Nov. 8, 2022

(54) OSCILLATOR CIRCUIT, OSCILLATOR, AND METHOD FOR CONTROLLING OSCILLATOR CIRCUIT

(71) Applicant: SEIKO EPSON CORPORATION, Tokyo (JP)

(72) Inventors: Yosuke Itasaka, Minowa-machi (JP); Mitsuaki Sawada, Fujimi-machi (JP); Masataka Nomura, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/452,469

(22) Filed: Oct. 27, 2021

(65) Prior Publication Data

US 2022/0140785 A1    May 5, 2022

(30) Foreign Application Priority Data

Oct. 29, 2020   (JP) .............................. JP2020-181710

(51) Int. Cl.

| | |
|---|---|
| *H03B 5/06* | (2006.01) |
| *H03B 17/00* | (2006.01) |
| *H03L 7/06* | (2006.01) |
| *H03B 5/32* | (2006.01) |
| *H03B 5/36* | (2006.01) |
| *H03B 7/00* | (2006.01) |
| *H03B 5/04* | (2006.01) |

(52) U.S. Cl.
CPC ................ *H03B 5/06* (2013.01); *H03B 5/32* (2013.01); *H03B 5/362* (2013.01); *H03B 5/364* (2013.01); *H03B 7/00* (2013.01); *H03B 17/00* (2013.01); *H03L 7/06* (2013.01); *H03B 5/04* (2013.01); *H03B 2200/004* (2013.01); *H03B 2200/0038* (2013.01); *H03B 2201/025* (2013.01); *H03B 2201/0208* (2013.01)

(58) Field of Classification Search
CPC ...... H03B 2200/004; H03B 5/04; H03B 7/06; H03B 17/00; H03B 5/06; H03B 5/364; H03B 5/362; H03B 2201/025; H03B 2201/0208; H03B 2200/0038; H03B 5/32; H03B 7/00; H03L 7/06
USPC .......................................... 331/158, 116 FE
See application file for complete search history.

(56) References Cited

U.S. PATENT DOCUMENTS

2019/0007012 A1\*   1/2019   Marques ................... H03F 3/16

FOREIGN PATENT DOCUMENTS

JP           62-109511        7/1987

\* cited by examiner

*Primary Examiner* — Arnold M Kinkead
(74) *Attorney, Agent, or Firm* — Rankin, Hill & Clark LLP

(57) ABSTRACT

An oscillator circuit includes an oscillating circuit coupled to a vibrator, and a control circuit that controls the oscillating circuit. The oscillator circuit has a normal operation mode in which the oscillating circuit oscillates in a state where a negative resistance value is a first value, and a start mode in which the oscillator circuit shifts from a state where oscillation is stopped to the normal operation mode. In the start mode, the control circuit controls the negative resistance value to increase from a second value which is smaller than the first value.

14 Claims, 26 Drawing Sheets

FIG. 7

| trimI[4:0] | trimI[4] | trimI[3] | trimI[2] | trimI[1] | trimI[0] |
|---|---|---|---|---|---|
| 0 | 0 | 0 | 0 | 0 | 0 |
| 1 | 0 | 0 | 0 | 0 | 1 |
| 2 | 0 | 0 | 0 | 1 | 0 |
| 3 | 0 | 0 | 0 | 1 | 1 |
| 4 | 0 | 0 | 1 | 0 | 0 |
| 5 | 0 | 0 | 1 | 0 | 1 |
| 6 | 0 | 0 | 1 | 1 | 0 |
| 7 | 0 | 0 | 1 | 1 | 1 |
| 8 | 0 | 1 | 0 | 0 | 0 |
| 9 | 0 | 1 | 0 | 0 | 1 |
| 10 | 0 | 1 | 0 | 1 | 0 |
| 11 | 0 | 1 | 0 | 1 | 1 |
| 12 | 0 | 1 | 1 | 0 | 0 |
| 13 | 0 | 1 | 1 | 0 | 1 |
| 14 | 0 | 1 | 1 | 1 | 0 |
| 15 | 0 | 1 | 1 | 1 | 1 |
| 16 | 1 | 0 | 0 | 0 | 0 |
| 17 | 1 | 0 | 0 | 0 | 1 |
| 18 | 1 | 0 | 0 | 1 | 0 |
| 19 | 1 | 0 | 0 | 1 | 1 |
| 20 | 1 | 0 | 1 | 0 | 0 |
| 21 | 1 | 0 | 1 | 0 | 1 |
| 22 | 1 | 0 | 1 | 1 | 0 |
| 23 | 1 | 0 | 1 | 1 | 1 |
| 24 | 1 | 1 | 0 | 0 | 0 |
| 25 | 1 | 1 | 0 | 0 | 1 |
| 26 | 1 | 1 | 0 | 1 | 0 |
| 27 | 1 | 1 | 0 | 1 | 1 |
| 28 | 1 | 1 | 1 | 0 | 0 |
| 29 | 1 | 1 | 1 | 0 | 1 |
| 30 | 1 | 1 | 1 | 1 | 0 |
| 31 | 1 | 1 | 1 | 1 | 1 |

FIG. 8

| trimC1[4:0] | trimCN1[4] | trimCN1[3] | trimCN1[2] | trimCN1[1] | trimCN1[0] |
|---|---|---|---|---|---|
| 0 | 1 | 1 | 1 | 1 | 1 |
| 1 | 1 | 1 | 1 | 1 | 0 |
| 2 | 1 | 1 | 1 | 0 | 1 |
| 3 | 1 | 1 | 1 | 0 | 0 |
| 4 | 1 | 1 | 0 | 1 | 1 |
| 5 | 1 | 1 | 0 | 1 | 0 |
| 6 | 1 | 1 | 0 | 0 | 1 |
| 7 | 1 | 1 | 0 | 0 | 0 |
| 8 | 1 | 0 | 1 | 1 | 1 |
| 9 | 1 | 0 | 1 | 1 | 0 |
| 10 | 1 | 0 | 1 | 0 | 1 |
| 11 | 1 | 0 | 1 | 0 | 0 |
| 12 | 1 | 0 | 0 | 1 | 1 |
| 13 | 1 | 0 | 0 | 1 | 0 |
| 14 | 1 | 0 | 0 | 0 | 1 |
| 15 | 1 | 0 | 0 | 0 | 0 |
| 16 | 0 | 1 | 1 | 1 | 1 |
| 17 | 0 | 1 | 1 | 1 | 0 |
| 18 | 0 | 1 | 1 | 0 | 1 |
| 19 | 0 | 1 | 1 | 0 | 0 |
| 20 | 0 | 1 | 0 | 1 | 1 |
| 21 | 0 | 1 | 0 | 1 | 0 |
| 22 | 0 | 1 | 0 | 0 | 1 |
| 23 | 0 | 1 | 0 | 0 | 0 |
| 24 | 0 | 0 | 1 | 1 | 1 |
| 25 | 0 | 0 | 1 | 1 | 0 |
| 26 | 0 | 0 | 1 | 0 | 1 |
| 27 | 0 | 0 | 1 | 0 | 0 |
| 28 | 0 | 0 | 0 | 1 | 1 |
| 29 | 0 | 0 | 0 | 1 | 0 |
| 30 | 0 | 0 | 0 | 0 | 1 |
| 31 | 0 | 0 | 0 | 0 | 0 |

FIG. 30

| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 | Iosc |
|---|---|---|---|---|---|---|---|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | $I_b$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | $I_b + I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | $I_b + 2I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | $I_b + 3I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | $I_b + 4I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | $I_b + 5I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | $I_b + 6I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | $I_b + 7I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | $I_b + 8I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | $I_b + 9I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | $I_b + 10I_0$ |
| 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | $I_b + 11I_0$ |
| 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | $I_b + 12I_0$ |
| 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | $I_b + 13I_0$ |
| 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | $I_b + 14I_0$ |
| 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | $I_b + 15I_0$ |
| 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | $I_b + 16I_0$ |
| 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | $I_b + 17I_0$ |
| 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | $I_b + 18I_0$ |
| 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | $I_b + 19I_0$ |
| 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | $I_b + 20I_0$ |
| 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 21I_0$ |
| 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 22I_0$ |
| 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 23I_0$ |
| 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 24I_0$ |
| 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 25I_0$ |
| 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 26I_0$ |
| 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 27I_0$ |
| 0 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 28I_0$ |
| 0 | 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 29I_0$ |
| 0 | 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 30I_0$ |
| 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 31I_0$ |
| 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | $I_b + 32I_0$ |

OSCILLATOR CIRCUIT, OSCILLATOR, AND METHOD FOR CONTROLLING OSCILLATOR CIRCUIT

The present application is based on, and claims priority from JP Application Serial Number 2020-181710, filed Oct. 29, 2020, the disclosure of which is hereby incorporated by reference herein in its entirety.

BACKGROUND

1. Technical Field

The present disclosure relates to an oscillator circuit, an oscillator, and a method for controlling an oscillator circuit.

2. Related Art

JP-UM-A-62-109511 discloses an oscillator circuit as follows. A control circuit for increasing a load capacitance of the oscillator circuit only when oscillation starts is provided so that a growth factor of main vibration during when the oscillation starts becomes greater than a growth factor of spurious vibration.

However, when the load capacitance is configured to vary between start and non-start as in the oscillator circuit disclosed in JP-UM-A-62-109511, there is a possibility that normal oscillation may not be guaranteed due to variations in characteristics of a vibrator. That is, when the vibrator is used which does not resonate with the main vibration or sub-vibration such as the spurious vibration under the load capacitance when the oscillation starts, and resonates with both the main vibration and the sub-vibration under the load capacitance during a normal operation, there is a possibility of abnormal oscillation.

SUMMARY

An oscillator circuit according to an aspect of the present disclosure includes an oscillating circuit coupled to a vibrator, and a control circuit that controls the oscillating circuit. The oscillator circuit has a normal operation mode in which the oscillating circuit oscillates in a state where a negative resistance value is a first value, and has a start mode until a state where the oscillating circuit stops oscillation is shifted to the normal operation mode. In the start mode, the control circuit controls the negative resistance value to increase from a second value which is smaller than the first value.

An oscillator according to another aspect of the present disclosure includes the aspect of the oscillator circuit and the vibrator.

A method for controlling an oscillator according to still another aspect of the present disclosure is a method for controlling an oscillator circuit including an oscillating circuit coupled to a vibrator. The oscillator circuit has a normal operation mode in which the oscillating circuit oscillates in a state where a negative resistance value is a first value, and a start mode until a state where the oscillating circuit stops oscillation is shifted to the normal operation mode. The method includes controlling the negative resistance value to increase from a second value which is smaller than the first value in the start mode.

BRIEF DESCRIPTION OF THE DRAWINGS

FIG. 7 is a view illustrating an example of current adjustment data.

FIG. 8 is a view illustrating an example of capacitance adjustment data.

FIG. 30 is a view illustrating an example of current adjustment data according to the seventh embodiment.

DESCRIPTION OF EXEMPLARY EMBODIMENTS

Hereinafter, preferred embodiments of the present disclosure will be described in detail with reference to the drawings. The embodiments described below do not unreasonably limit contents of the present disclosure described in the appended claims. In addition, all configurations described below are not necessarily essential configuration requirements of the present disclosure.

1. First Embodiment

1-1. Configuration of Oscillator

Figure 1:
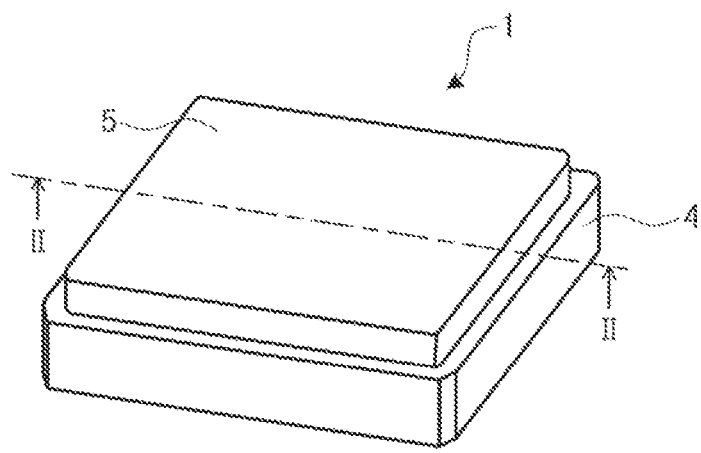
FIG. 1 is a perspective view of an oscillator of the present embodiment.
Figure 2:
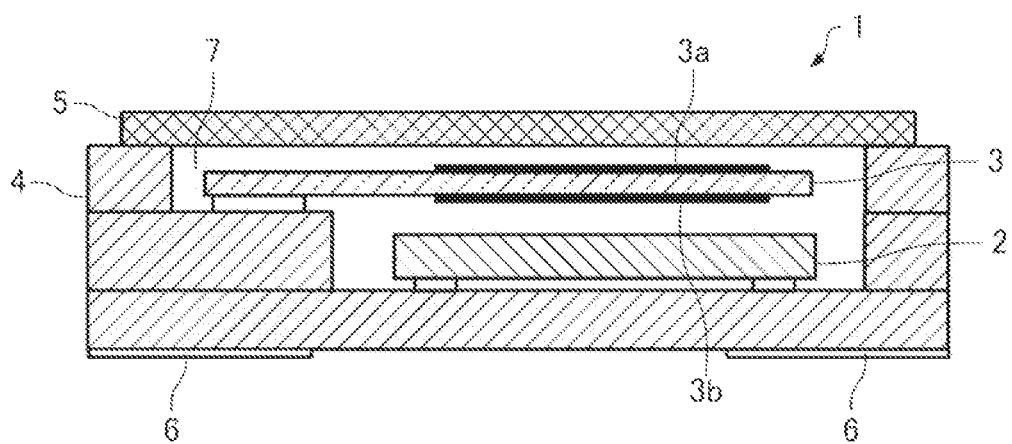
FIG. 2 is a cross-sectional view of the oscillator of the present embodiment.
Figure 3:
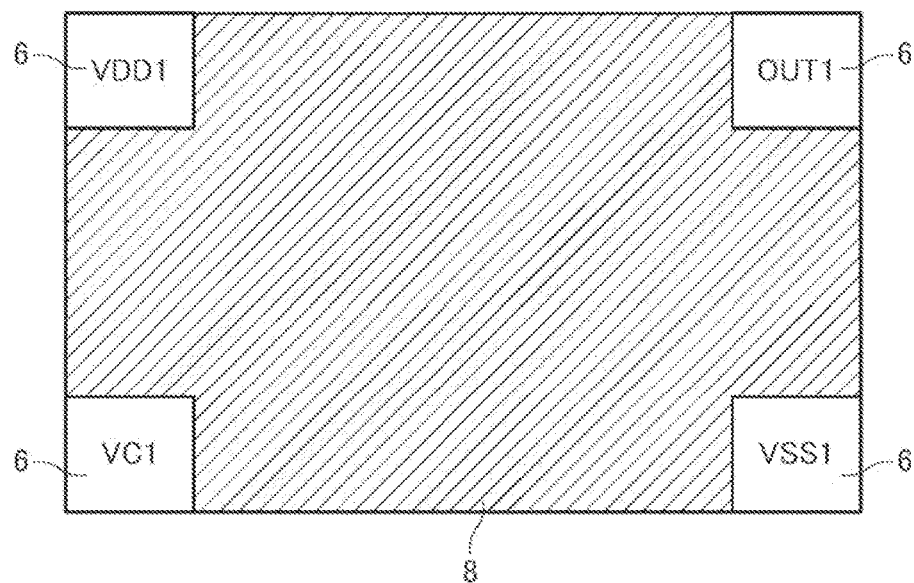
FIG. 3 is a bottom view of the oscillator of the present embodiment.

FIGS. 1, 2, and 3 are views illustrating an example of a structure of an oscillator 1 of the present embodiment. FIG. 1 is a perspective view of the oscillator 1. FIG. 2 is a cross-sectional view taken along line II-II in FIG. 1. FIG. 3 is a bottom view of the oscillator 1.

As illustrated in FIGS. 1, 2, and 3, the oscillator 1 includes an oscillator circuit 2, a vibrator 3, a package 4, a lid 5, and a plurality of external terminals 6. In the present embodiment, the vibrator 3 is a quartz crystal resonator using a quartz crystal as a substrate material, and is an AT cut quartz crystal resonator or a tuning fork type quartz crystal resonator, for example. The vibrator 3 may be a surface acoustic wave (SAW) resonator or a micro electro mechanical systems (MEMS) vibrator. The SAW is an abbreviation for the surface acoustic wave. In addition, the MEMS is an abbreviation for the micro electro mechanical systems. As the substrate material of the vibrator 3, in addition to the quartz crystal, a piezoelectric single crystal such as lithium tantalate and lithium niobate, a piezoelectric material such as piezoelectric ceramics of lead zirconate titanate, or a silicon semiconductor material can be used. As a unit that excites the vibrator 3, a unit realized by a piezoelectric effect may be used, or electrostatic drive realized by a Coulomb force may be used. In addition, in the present embodiment, the oscillator circuit 2 is realized by a one-chip integrated circuit. However, at least a portion of the oscillator circuit 2 may be configured to include a discrete component.

The package 4 accommodates the oscillator circuit 2 and the vibrator 3 in the same space. Specifically, the package 4 is provided with a recess portion, and the recess portion is covered with the lid 5, thereby forming an accommodation chamber 7. Wires (not illustrated) for electrically coupling two terminals of the oscillator circuit 2, specifically, an XI terminal and an XO terminal in FIG. 4 (to be described later) and two excitation electrodes 3a and 3b of the vibrator 3, respectively, are provided inside the package 4 or on a surface of the recess portion. In addition, wires (not illustrated) for electrically coupling terminals of the oscillator circuit 2 and external terminals 6 provided on a bottom surface of the package 4 are provided inside the package 4 or on the surface of the recess portion. The package 4 is not limited to a configuration in which the oscillator circuit 2 and the vibrator 3 are accommodated in the same space. For example, the package 4 may be a so-called H-shaped package in which the oscillator circuit 2 is mounted on one surface of a substrate of the package and the vibrator 3 is mounted on the other surface of the package.

A front surface and a rear surface of the vibrator 3 respectively have the excitation electrodes 3a and 3b made of metal, and the vibrator 3 oscillates at a desired frequency corresponding to a shape or mass of the vibrator 3 including the excitation electrodes 3a and 3b.

As illustrated in FIG. 3, a bottom surface of the oscillator 1 of the present embodiment, specifically, a rear surface of the package 4 is provided with four external terminals 6 such as an external terminal VDD1 serving as a power supply terminal, an external terminal VSS1 serving as a ground terminal, an external terminal VC1 serving as a terminal to which a signal for controlling a frequency of the oscillator circuit 2 is input, and an external terminal OUT1 serving as an output terminal for outputting an oscillation signal. A power supply voltage is supplied to the external terminal VDD1, and the external terminal VSS1 is grounded.

Figure 4:
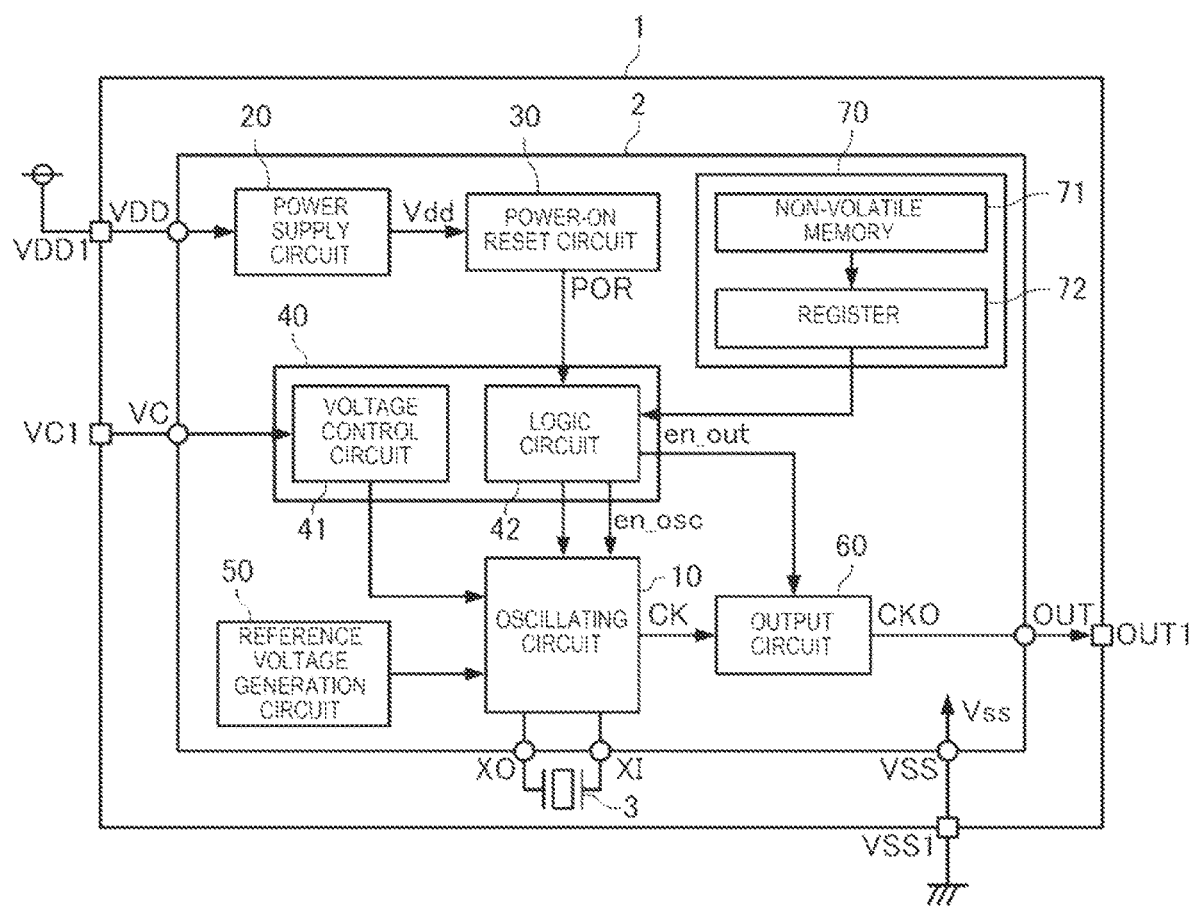
FIG. 4 is a functional block diagram of an oscillator of a first embodiment.

FIG. 4 is a functional block diagram of the oscillator 1 of a first embodiment. As illustrated in FIG. 4, the oscillator 1 of the present embodiment includes the oscillator circuit 2 and the vibrator 3. As external coupling terminals, the oscillator circuit 2 has a VDD terminal, a VSS terminal, an OUT terminal, a VC terminal, the XI terminal, and the XO terminal. The VDD terminal, the VSS terminal, the OUT terminal, and the VC terminal are electrically coupled to the external terminal VDD1, the external terminal VSS1, the external terminal OUT1, and the external terminal VC1, respectively, which are the four external terminals 6 of the oscillator 1 illustrated in FIG. 3. The XI terminal is electrically coupled to the excitation electrode 3a which is one end of the vibrator 3, and the XO terminal is electrically coupled to the excitation electrode 3b which is the other end of the vibrator 3.

In the present embodiment, the oscillator circuit 2 includes an oscillating circuit 10, a power supply circuit 20, a power-on reset circuit 30, a control circuit 40, a reference voltage generation circuit 50, an output circuit 60, and a memory circuit 70. The oscillator circuit 2 may have a configuration in which elements thereof are partially omitted or changed, or other elements are added thereto.

The power supply circuit 20 generates various voltages including a power supply voltage Vdd of a logic circuit 42, based on an external power supply voltage which is input from the external terminal VDD1 and which is supplied via the VDD terminal, and supplies various generated voltages to each circuit. In addition, a ground voltage Vss is supplied to each circuit via the VSS terminal.

When power is supplied to the oscillator 1, the power supply voltage Vdd output from the power supply circuit 20 rises from 0 V to a predetermined voltage value. When the power supply voltage Vdd reaches a predetermined threshold voltage, the power-on reset circuit 30 generates a power-on reset signal POR in a high level for a certain period of time. The power-on reset signal POR causes the logic circuit 42 to be initialized to a desired state. When the power-on reset signal POR is changed from the high level to a low level, the logic circuit 42 starts an operation.

The oscillating circuit 10 is coupled to the vibrator 3 via the XI terminal and the XO terminal, causes an amplifier element to amplify a signal output from the vibrator 3, supplies the signal to the vibrator 3, and causes the vibrator 3 to oscillate. For example, the amplifier element may be a bipolar transistor, may be a MOS transistor, or may be a CMOS inverter. The MOS is an abbreviation for a metal oxide semiconductor. The CMOS is an abbreviation for a complementary metal oxide semiconductor. The oscillating circuit 10 is adjusted so that an oscillation frequency reaches a target frequency, based on various setting signals supplied from the logic circuit 42.

The output circuit 60 buffers and outputs an oscillation signal CK output from the oscillating circuit 10. An oscillation signal CKO output from the output circuit 60 is output outward of the oscillator 1 via the OUT terminal and the external terminal OUT1. The output circuit 60 may output a differential oscillation signal. That is, the output circuit 60 may output an oscillation signal XCKO obtained by inverting a polarity of the oscillation signal CKO, together with the oscillation signal CKO. In this case, the oscillator circuit 2 further has an XOUT terminal for outputting the oscillation signal XCKO, and the oscillator 1 further has an external terminal XOUT1 for outputting the oscillation signal XCKO.

The control circuit 40 controls the oscillating circuit 10. In the present embodiment, the control circuit includes a voltage control circuit 41 and the logic circuit 42.

The voltage control circuit 41 generates a control voltage for changing the oscillation frequency of the oscillating circuit 10 in accordance with a voltage level of a frequency control signal supplied from the external terminal VC1 via the VC terminal, and supplies the control voltage to the oscillating circuit 10. That is, a frequency of the oscillation signal CKO output from the external terminal OUT1 is changed in accordance with the voltage level of the frequency control signal input from the external terminal VC1.

The logic circuit 42 outputs an oscillation enable signal en_osc to the oscillating circuit 10, and controls an operation of the oscillating circuit 10. Specifically, the logic circuit 42 causes the oscillating circuit 10 to oscillate by setting the oscillation enable signal en_osc to a high level, and stops oscillation of the oscillating circuit 10 by setting the oscillation enable signal en_osc to a low level. In addition, the logic circuit 42 outputs various setting signals to the oscillating circuit 10, and controls the oscillation frequency of the oscillating circuit 10. In addition, the logic circuit 42 outputs an output enable signal en_out to the output circuit 60, and controls an operation of the output circuit 60. Specifically, the logic circuit 42 controls the output circuit 60 to output the oscillation signal CKO by setting the output enable signal en_out to the high level, and controls the output circuit 60 to stop outputting of the oscillation signal CKO by setting the output enable signal en_out to the low level.

The reference voltage generation circuit 50 generates various reference voltages, based on a voltage output from the power supply circuit 20, and outputs the reference voltages to the oscillating circuit 10.

The memory circuit 70 stores various information, and has a non-volatile memory 71 and a register 72. For example, the non-volatile memory 71 may be FAMOS, MONOS type memory, or EEPROM. The FAMOS is an abbreviation for a floating gate avalanche injection metal oxide semiconductor. The MONOS is an abbreviation for a metal oxide nitride oxide silicon. The EEPROM is an abbreviation for an electrically erasable programmable read-only memory. In a manufacturing process of the oscillator 1, various information is stored in the non-volatile memory 71. Then, when the power is supplied to the oscillator 1, various information stored in the non-volatile memory 71 is transferred to the register 72, and various information stored in the register 72 is appropriately supplied to each circuit. For example, information for adjusting the oscillation frequency which is transferred from the non-volatile memory 71 to the register 72 is supplied to the oscillating circuit 10 via the logic circuit 42, as various setting signals. The information for adjusting the oscillation frequency is current adjustment data or capacitance adjustment data (to be described later).

1-2. Configuration of Oscillating Circuit

Figure 5:
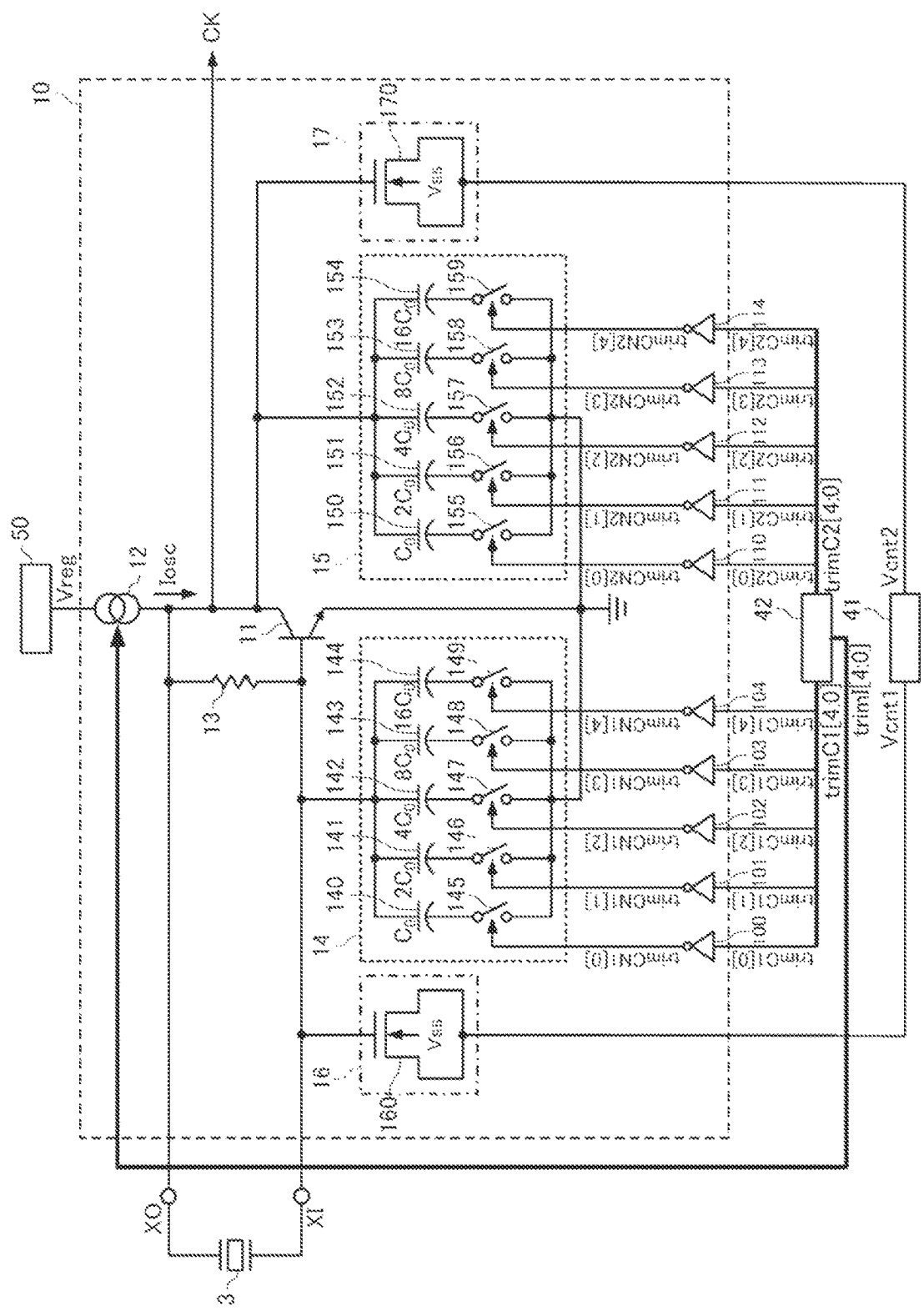
FIG. 5 is a view illustrating a configuration example of an oscillating circuit.

FIG. 5 is a view illustrating a configuration example of the oscillating circuit 10. In the example of FIG. 5, the oscillating circuit 10 includes an amplifier element 11, a variable current source 12, a resistor 13, a variable capacitance circuit 14, a variable capacitance circuit 15, a variable capacitance circuit 16, and a variable capacitance circuit 17. In addition, the oscillating circuit 10 includes 10 CMOS inverters 100, 101, 102, 103, 104, 110, 111, 112, 113, and 114.

The amplifier element 11 is an NPN type bipolar transistor. A base terminal is coupled to the XI terminal, a collector terminal is coupled to the XO terminal, and an emitter terminal is grounded. In addition, the resistor 13 is coupled between the base terminal and the collector terminal of the amplifier element 11. Then, an oscillation stage current Iosc is supplied from the variable current source 12 to the collector terminal of the amplifier element 11, and a signal of the collector terminal is output as the oscillation signal CK. A MOS transistor or a CMOS inverter may be used as the amplifier element 11.

The variable current source 12 generates the oscillation stage current Iosc having a magnitude corresponding to 5-bit current adjustment data trimI[4:0] as a setting signal supplied from the logic circuit 42, based on a voltage Vreg generated by the reference voltage generation circuit 50. Then, the variable current source supplies the oscillation stage current Iosc to the amplifier element 11. The number of bits of the current adjustment data trimI is not limited to 5.

Figure 6:
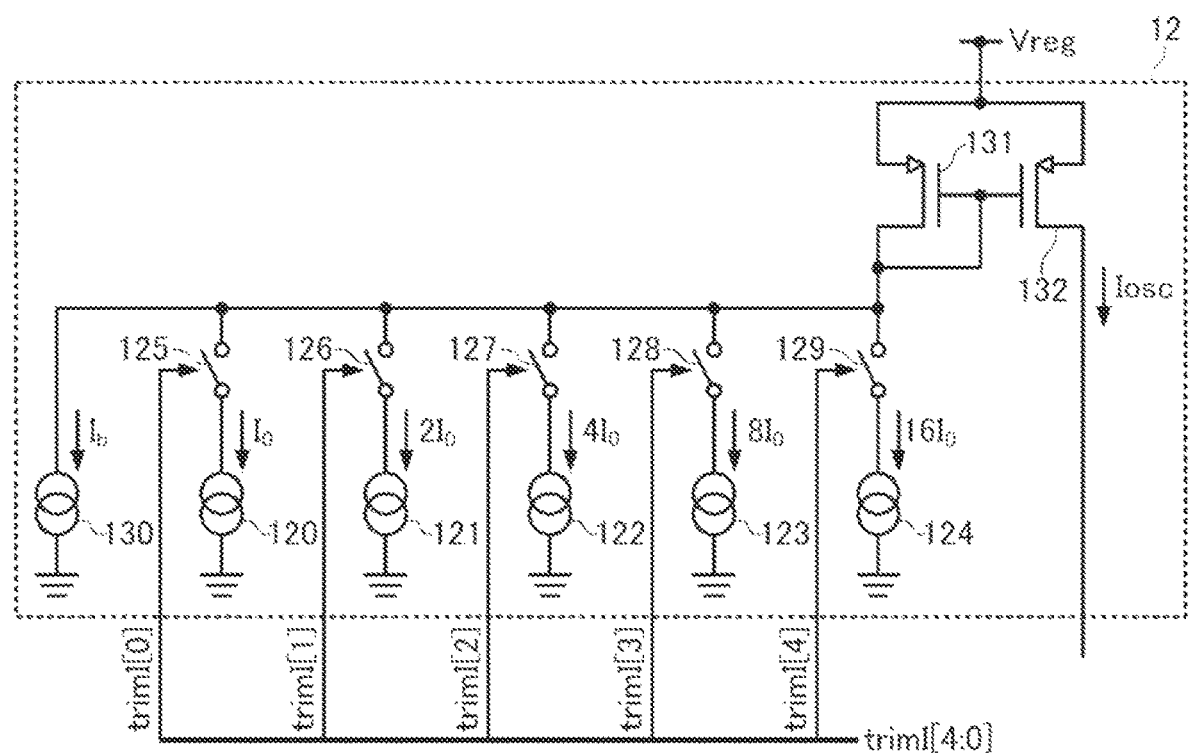
FIG. 6 is a view illustrating a configuration example of a variable current source.

FIG. 6 is a view illustrating a configuration example of the variable current source 12. In the example of FIG. 6, the variable current source 12 includes six current sources 120, 121, 122, 123, 124, and 130, five switch elements 125, 126, 127, 128, and 129, and two P-channel type MOS transistors 131 and 132.

In the P-channel type MOS transistor 131, a gate and a drain are coupled to each other, and the voltage Vreg is supplied to a source. In the P-channel type MOS transistor 132, a gate is coupled to the gate of the P-channel type MOS transistor 131, the voltage Vreg is supplied to a source, and a drain is coupled to the collector of the amplifier element 11 in FIG. 5.

One end of the current source 130 is coupled to the drain of the P-channel type MOS transistor 131, and the other end is grounded. A constant bias current $I_b$ flows. One end of the current source 120 is coupled to the drain of the P-channel type MOS transistor 131 via the switch element 125, and the other end is grounded. When the switch element 125 is in a conductive state, a constant current $I_0$ flows. One end of the current source 121 is coupled to the drain of the P-channel type MOS transistor 131 via the switch element 126, and the other end is grounded. When the switch element 126 is in a conductive state, a current having a magnitude which is twice that of the current $I_0$ flows. One end of the current source 122 is coupled to the drain of the P-channel type MOS transistor 131 via the switch element 127, and the other end is grounded. When the switch element 127 is in a conductive state, a current having a magnitude which is four times that of the current $I_0$ flows. One end of the current source 123 is coupled to the drain of the P-channel type MOS transistor 131 via the switch element 128, and the other end is grounded. When the switch element 128 is in a conductive state, a current having a magnitude which is eight times that of the current $I_0$ flows. One end of the current source 124 is coupled to the drain of the P-channel type MOS transistor 131 via the switch element 129, and the other end is grounded. When the switch element 129 is in a conductive state, a current having a magnitude which is 16 times that of the current $I_0$ flows. For example, the current sources 120, 121, 122, 123, 124, and 130 may be configured by using a depletion type N-channel type MOS transistor, or may be configured by using a current mirror circuit.

The switch element 125 is conductive when data trimI[0] of the bit 0 of the current adjustment data trimI[4:0] is input to the control terminal and the data trimI[0] is in a high level, and is not conductive when the data trimI[0] is in a low level.

The switch element 126 is conductive when data trimI[1] of a bit 1 of the current adjustment data trimI[4:0] is input to the control terminal and the data trimI[1] is in the high level, and is not conductive when the data trimI[1] is in the low level. The switch element 127 is conductive when data trimI[2] of a bit 2 of the current adjustment data trimI[4:0] is input to the control terminal and the data trimI[2] is in the high level, and is not conductive when the data trimI[2] is in the low level. The switch element 128 is conductive when data trimI[3] of a bit 3 of the current adjustment data trimI[4:0] is input to the control terminal and the data trimI[3] is in the high level, and is not conductive when the data trimI[3] is in the low level. The switch element 129 is conductive when data trimI[4] of a bit 4 of the current adjustment data trimI[4:0] is input to the control terminal and the data trimI[4] is in the high level, and is not conductive when the data trimI[4] is in the low level. For example, the switch elements 125, 126, 127, 128, and 129 may be N-channel type MOS transistors, or may be transmission gates.

FIG. 7 is a view illustrating a relationship between a value of the current adjustment data trimI[4:0] which is expressed in decimal number and a value of each bit of the current adjustment data trimI[4:0] which is expressed in binary number. 0 in each bit corresponds to the low level, and 1 in each bit corresponds to the high level. For example, when the current adjustment data trimI[4:0] is 1, the bit 0 is 1, and the bits 1, 2, 3, and 4 are 0. Therefore, the switch element 125 is conductive, and the current $I_0$ flows in the current source 120. In addition, for example, when the current adjustment data trimI[4:0] is 2, the bit 1 is 1, and the bits 0, 2, 3, and 4 are 0. Therefore, the switch element 126 is conductive, and the current having the magnitude which is twice that of the current $I_0$ flows in the current source 121.

A current obtained by adding the current flowing in each of the current sources 120, 121, 122, 123, and 124 to the bias current $I_b$ flows between the source and the drain of the P-channel type MOS transistor 131. For example, when the current adjustment data trimI[4:0] is 1, the current $I_0$ flows in the current source 120, and the current flowing in each of the current sources 121, 122, 123, and 124 is 0. Accordingly, a current obtained by adding the current $I_0$ to the bias current $I_b$ flows between the source and the drain of the P-channel type MOS transistor 131. In addition, for example, when the current adjustment data trimI[4:0] is 1, the current having the magnitude which is twice that of the current $I_0$ flows in the current source 121, and the current flowing in each of the current sources 120, 122, 123, and 124 is 0. Accordingly, the current obtained by adding the current having the magnitude which is twice that of the current $I_0$ to the bias current $I_b$ flows between the source and the drain of the P-channel type MOS transistor 131. Then, due to the current mirror circuit configured to include the two P-channel type MOS transistors 131 and 132, a current having a magnitude which is predetermined times that of the current flowing between the source and the drain of the P-channel type MOS transistor 131 flows between the source and the drain of the P-channel type MOS transistor 132. The current is supplied to the amplifier element 11 as the oscillation stage current Iosc. Therefore, the magnitude of the oscillation stage current Iosc is changed in accordance with a value of the current adjustment data trimI[4:0]. Specifically, as the value of the current adjustment data trimI[4:0] becomes greater, the oscillation stage current Iosc becomes higher.

In a manufacturing process of the oscillator 1, the value of the current adjustment data trimI[4:0] for setting the oscillation stage current Iosc to a desired value corresponding to the resonance frequency of the vibrator 3 is written in the non-volatile memory 71.

Referring back to the description of FIG. 5, the CMOS inverter 100 outputs data trimCN1[0] obtained by logically inverting the data trimC1[0] of the bit 0 of the capacitance adjustment data trimC1[4:0] having 5 bits as a setting signal supplied from the logic circuit 42. The CMOS inverter 101 outputs data trimCN1[1] obtained by logically inverting data trimC1[1] of the bit 1 of the capacitance adjustment data trimC1[4:0]. The CMOS inverter 102 outputs data trimCN1[2] obtained by logically inverting data trimC1[2] of the bit 2 of the capacitance adjustment data trimC1[4:0]. The CMOS inverter 103 outputs data trimCN1[3] obtained by logically inverting data trimC1[3] of the bit 3 of the capacitance adjustment data trimC1[4:0]. The CMOS inverter 104 outputs data trimCN1[4] obtained by logically inverting data trimC1[4] of the bit 4 of the capacitance adjustment data trimC1[4:0].

The variable capacitance circuit 14 is a capacitance circuit having a capacitance value $C_1$ having a magnitude corresponding to the capacitance adjustment data trimCN1[4:0] in which each bit of the capacitance adjustment data trimC1[4:0] is logically inverted by the CMOS inverters 100, 101, 102, 103, and 104. The variable capacitance circuit 14 includes five capacitance elements 140, 141, 142, 143, and 144, and five switch elements 145, 146, 147, 148, and 149.

One end of the capacitance element 140 is coupled to the XI terminal, and the other end is grounded via the switch element 145. A capacitance value thereof is $C_0$. One end of the capacitance element 141 is coupled to the XI terminal, and the other end is grounded via the switch element 146. The capacitance value is twice that of $C_0$. One end of the capacitance element 142 is coupled to the XI terminal, and the other end is grounded via the switch element 147. The capacitance value is four times that of $C_0$. One end of the capacitance element 143 is coupled to the XI terminal, and the other end is grounded via the switch element 148. The capacitance value is eight times that of $C_0$. One end of the capacitance element 144 is coupled to the XI terminal, and the other end is grounded via the switch element 149. The capacitance value is 16 times that of $C_0$. For example, the capacitance elements 140, 141, 142, 143, and 144 may be MIM type capacitance elements using metal for two electrodes, or may be PIP type capacitance elements using polysilicon for two electrodes. The MIM is an abbreviation for metal insulator metal. The PIP is an abbreviation for poly insulator poly.

The switch element 145 is conductive when data trimCN1[0] of the bit 0 of the capacitance adjustment data trimCN1[4:0] is input to the control terminal and the data trimCN1[0] is in a high level, and is not conductive when the data trimCN1[0] is in a low level. The switch element 146 is conductive when data trimCN1[1] of the bit 1 of the capacitance adjustment data trimCN1[4:0] is input to the control terminal and the data trimCN1[1] is in the high level, and is not conductive when the data trimCN1[1] is in the low level. The switch element 147 is conductive when data trimCN1[2] of the bit 2 of the capacitance adjustment data trimCN1[4:0] is input to the control terminal and the data trimCN1[2] is in the high level, and is not conductive when the data trimCN1[2] is in the low level. The switch element 148 is conductive when data trimCN1[3] of the bit 3 of the capacitance adjustment data trimCN1[4:0] is input to the control terminal and the data trimCN1[3] is in the high level, and is not conductive when the data trimCN1[3] is in the low level. The switch element 149 is conductive when data trimCN1

[4] of the bit 4 of the capacitance adjustment data trimCN1[4:0] is input to the control terminal and the data trimCN1[4] is in the high level, and is not conductive when the data trimCN1[4] is in the low level. For example, the switch elements 145, 146, 147, 148, and 149 may be the N-channel type MOS transistors, or may be the transmission gates.

FIG. 8 is a view illustrating a relationship between a value of the capacitance adjustment data trimC1[4:0] which is expressed in decimal number and a value of each bit of the capacitance adjustment data trimCN1[4:0] obtained by logically inverting the capacitance adjustment data trimC1[4:0] and expressed in binary number. 0 in each bit corresponds to the low level, and 1 in each bit corresponds to the high level. For example, when the capacitance adjustment data trimC1[4:0] is 1, the bits 1, 2, 3, and 4 of the capacitance adjustment data trimCN1[4:0] are 1, and the bit 0 is 0. Therefore, the switch elements 146, 147, 148, and 149 are conductive, and the other ends of the capacitance elements 141, 142, 143, and 144 each are grounded. In addition, for example, when the capacitance adjustment data trimC1[4:0] is 2, the bits 0, 2, 3, and 4 of the capacitance adjustment data trimCN1[4:0] are 1, and the bit 1 is 0. Therefore, the switch elements 145, 147, 148, and 149 are conductive, and the other ends of the capacitance elements 140, 142, 143, and 144 each are grounded.

A capacitance value $C_1$ of the variable capacitance circuit 14 is a value obtained by adding the capacitance value of the capacitance elements 140, 141, 142, 143, and 144 whose other ends are grounded since each of the switch elements 145, 146, 147, 148, and 149 is conductive. For example, when the capacitance adjustment data trimC1[4:0] is 1, the other ends of the capacitance elements 141, 142, 143, and 144 each are grounded, and the other end of the capacitance element 140 is not grounded. Accordingly, the capacitance value $C_1$ of the variable capacitance circuit 14 is $2C_0+4C_0+8C_0+16C_0=30C_0$. In addition, for example, when the capacitance adjustment data trimC1[4:0] is 2, the other ends of the capacitance elements 140, 142, 143, and 144 each are grounded, and the other end of the capacitance element 141 is not grounded. Accordingly, the capacitance value $C_1$ of the variable capacitance circuit 14 is $C_0+4C_0+8C_0+16C_0=29C_0$. In this way, the capacitance value $C_1$ of the variable capacitance circuit 14 is changed in accordance with the value of the capacitance adjustment data trimC1[4:0]. Specifically, as the value of the capacitance adjustment data trimC1[4:0] becomes greater, the capacitance value $C_1$ of the variable capacitance circuit 14 becomes smaller.

The CMOS inverter 110 outputs data trimCN2[0] obtained by logically inverting data trimC2[0] of the bit 0 of the capacitance adjustment data trimC2[4:0] having 5 bits as a setting signal supplied from the logic circuit 42. The CMOS inverter 111 outputs data trimCN2[1] obtained by logically inverting data trimC2[1] of the bit 1 of the capacitance adjustment data trimC2[4:0]. The CMOS inverter 112 outputs data trimCN2[2] obtained by logically inverting data trimC2[2] of the bit 2 of the capacitance adjustment data trimC2[4:0]. The CMOS inverter 113 outputs data trimCN2[3] obtained by logically inverting data trimC2[3] of the bit 3 of the capacitance adjustment data trimC2[4:0]. The CMOS inverter 114 outputs data trimCN2[4] obtained by logically inverting data trimC2[4] of the bit 4 of the capacitance adjustment data trimC2[4:0].

The variable capacitance circuit 15 is a capacitance circuit having a capacitance value $C_2$ having a magnitude corresponding to the capacitance adjustment data trimCN2[4:0] in which each bit of the capacitance adjustment data trimC2[4:0] is logically inverted by the CMOS inverters 110, 111, 112, 113, and 114. The variable capacitance circuit 15 includes five capacitance elements 150, 151, 152, 153, and 154, and five switch elements 155, 156, 157, 158, and 159.

One end of the capacitance element 150 is coupled to the XO terminal, and the other end is grounded via the switch element 155. The capacitance value is $C_0$. One end of the capacitance element 151 is coupled to the XO terminal, and the other end is grounded via the switch element 156. The capacitance value is twice that of $C_0$. One end of the capacitance element 152 is coupled to the XO terminal, and the other end is grounded via the switch element 157. The capacitance value is four times that of $C_0$. One end of the capacitance element 153 is coupled to the XO terminal, and the other end is grounded via the switch element 158. The capacitance value is eight times that of $C_0$. One end of the capacitance element 154 is coupled to the XO terminal, and the other end is grounded via the switch element 159. The capacitance value is 16 times that of $C_0$. For example, the capacitance elements 150, 151, 152, 153, and 154 may be MIM type capacitance elements using metal for two electrodes, or may be PIP type capacitance elements using polysilicon for two electrodes. The MIM is an abbreviation for metal insulator metal. The PIP is an abbreviation for poly insulator poly.

The switch element 155 is conductive when the data trimCN2[0] of the bit 0 of the capacitance adjustment data trimCN2[4:0] is input to the control terminal and the data trimCN2[0] is in a high level, and is not conductive when the data trimCN2[0] is in a low level. The switch element 156 is conductive when the data trimCN2[1] of the bit 1 of the capacitance adjustment data trimCN2[4:0] is input to the control terminal and the data trimCN2[1] is in the high level, and is not conductive when the data trimCN2[1] is in the low level. The switch element 157 is conductive when the data trimCN2[2] of the bit 2 of the capacitance adjustment data trimCN2[4:0] is input to the control terminal and the data trimCN2[2] is in the high level, and is not conductive when the data trimCN2[2] is in the low level. The switch element 158 is conductive when the data trimCN2[3] of the bit 3 of the capacitance adjustment data trimCN2[4:0] is input to the control terminal and the data trimCN2[3] is in the high level, and is not conductive when the data trimCN2[3] is in the low level. The switch element 159 is conductive when the data trimCN2[4] of the bit 4 of the capacitance adjustment data trimCN2[4:0] is input to the control terminal and the data trimCN2[4] is in the high level, and is not conductive when the data trimCN2[4] is in the low level. For example, the switch elements 155, 156, 157, 158, and 159 may be the N-channel type MOS transistors, or may be the transmission gates.

A relationship between a value of the capacitance adjustment data trimC2[4:0] which is expressed in decimal number and a value of each bit of the capacitance adjustment data trimCN2[4:0] obtained by logically inverting the capacitance adjustment data trimC2[4:0] which is expressed in binary number is the same as a relationship between a value of the capacitance adjustment data trimC1[4:0] illustrated in FIG. 8 which is expressed in decimal number and a value of each bit of the capacitance adjustment data trimCN1[4:0] which is expressed in binary number. Accordingly, illustration thereof is omitted. For example, when the capacitance adjustment data trimC2[4:0] is 1, the bits 1, 2, 3, and 4 of the capacitance adjustment data trimCN2[4:0] are 1, and the bit 0 is 0. Therefore, the switch elements 156, 157, 158, and 159 are conductive, and the other ends of the capacitance elements 151, 152, 153, and 154 each are grounded. In addition, for example, when the capacitance adjustment data trimC2[4:0] is 2, the bits 0, 2, 3, and 4 of the capacitance adjustment data trimCN2[4:0] are 1, and the bit 1 is 0. Therefore, the switch elements 155, 157, 158, and 159 are conductive, and the other ends of the capacitance elements 150, 152, 153, and 154 each are grounded.

The capacitance value $C_2$ of the variable capacitance circuit 15 is a value obtained by adding the capacitance value of the capacitance elements 150, 151, 152, 153, and 154 whose other ends are grounded since each of the switch elements 155, 156, 157, 158, and 159 is conductive. For example, when the capacitance adjustment data trimC2[4:0] is 1, the other ends of the capacitance elements 151, 152, 153, and 154 each are grounded, and the other end of the capacitance element 150 is not grounded. Accordingly, the capacitance value $C_2$ of the variable capacitance circuit 15 is $2C_0+4C_0+8C_0+16C_0=30C_0$. In addition, for example, when the capacitance adjustment data trimC2[4:0] is 2, the other ends of the capacitance elements 150, 152, 153, and 154 each are grounded, and the other end of the capacitance element 151 is not grounded. Accordingly, the capacitance value $C_2$ of the variable capacitance circuit is $C_0+4C_0+8C_0+16C_0=29C_0$. In this way, the capacitance value $C_2$ of the variable capacitance circuit 15 is changed in accordance with the value of the capacitance adjustment data trimC2[4:0]. Specifically, as the value of the capacitance adjustment data trimC2[4:0] is greater, the capacitance value $C_2$ of the variable capacitance circuit 15 is smaller.

The variable capacitance circuit 14 is coupled to the excitation electrode 3a of the vibrator 3 via the XI terminal, and the variable capacitance circuit 15 is coupled to the excitation electrode 3b of the vibrator 3 via the XO terminal. That is, the variable capacitance circuits 14 and 15 are coupled to the node coupled to the vibrator 3, and serve as a portion of the load capacitance of the vibrator 3. In a manufacturing process of the oscillator 1, the values of the capacitance adjustment data trimC1[4:0] and trimC2[4:0] for setting a frequency of the oscillation signal CK output from the oscillating circuit 10 to a target frequency are written in the non-volatile memory 71.

The variable capacitance circuit 16 is a capacitance circuit having a capacitance value $C_3$ having a magnitude corresponding to a control voltage Vcnt1 supplied from the voltage control circuit 41. The variable capacitance circuit 16 includes a variable capacitance element 160. For example, the variable capacitance element 160 is a varactor in which the source and the drain of the NMOS transistor are coupled to each other. The gate of the NMOS transistor is coupled to the XI terminal, a ground voltage Vss is supplied to a back gate, and the control voltage Vcnt1 is supplied to the source and the drain. As the control voltage Vcnt1 is higher, the capacitance value $C_3$ of the variable capacitance circuit 16 is smaller.

The variable capacitance circuit 17 is a capacitance circuit having a capacitance value $C_4$ having a magnitude corresponding to a control voltage Vcnt2 supplied from the voltage control circuit 41. The variable capacitance circuit 17 includes a variable capacitance element 170. For example, the variable capacitance element 170 is a varactor to which the source and the drain of the NMOS transistor are coupled. The gate of the NMOS transistor is coupled to the XO terminal, the ground voltage Vss is supplied to the back gate, and the control voltage Vcnt2 is supplied to the source and the drain. As the control voltage Vcnt2 is higher, the capacitance value $C_4$ of the variable capacitance circuit 17 is smaller.

Figure 9:
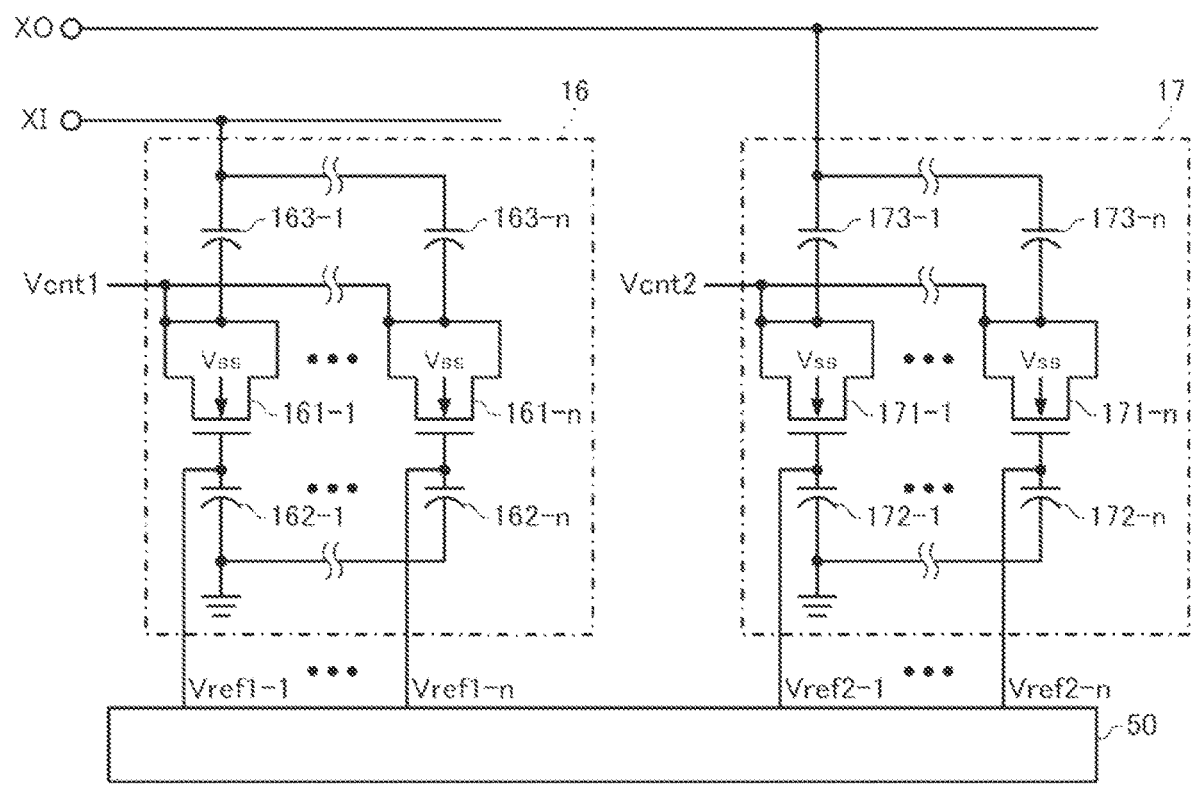
FIG. 9 is a view illustrating another configuration example of a variable capacitance circuit.

FIG. 9 is a view illustrating another configuration example of the variable capacitance circuits and 17. In the example of FIG. 9, the variable capacitance circuit 16 includes n-number of variable capacitance elements 161-1 to 161-n, n-number of capacitance elements 162-1 to 162-n, and n-number of capacitance elements 163-1 to 163-n. n is an integer of 2 or more. For each integer i of 1 or more and n or less, the variable capacitance element 161-i is a varactor in which the source and the drain of the NMOS transistor are coupled to each other. The source and the drain of the NMOS transistor are coupled to the XI terminal via the capacitance element 163-i, the ground voltage Vss is supplied to the back gate, and the gate is grounded via the capacitance element 162-i. In addition, a reference voltage Vref1-i generated by the reference voltage generation circuit 50 is supplied to the gate of the NMOS transistor, and the control voltage Vcnt1 is supplied to the source and the drain. As the control voltage Vcnt1 is higher, the capacitance value $C_3$ of the variable capacitance circuit 16 is smaller.

In addition, the variable capacitance circuit 17 includes n-number of variable capacitance elements 171-1 to 171-n, n-number of capacitance elements 172-1 to 172-n, and n-number of capacitance elements 173-1 to 173-n. n is an integer of 2 or more. For each integer i of 1 or more and n or less, the variable capacitance element 171-i is a varactor in which the source and the drain of the NMOS transistor are coupled to each other. The source and the drain of the NMOS transistor are coupled to the XI terminal via the capacitance element 173-i, the ground voltage Vss is supplied to the back gate, and the gate is grounded via a capacitance element 172-i. In addition, a reference voltage Vref2-i generated by the reference voltage generation circuit 50 is supplied to the gate of the NMOS transistor, and the control voltage Vcnt2 is supplied to the source and the drain. As the control voltage Vcnt2 is higher, the capacitance value $C_4$ of the variable capacitance circuit 17 is smaller.

In any of FIGS. 5 and 9, the variable capacitance circuit 16 is coupled to the excitation electrode 3a of the vibrator 3 via the XI terminal, and the variable capacitance circuit 17 is coupled to the excitation electrode 3b of the vibrator 3 via the XO terminal. That is, the variable capacitance circuits 16 and 17 are coupled to the node coupled to the vibrator 3, and serve as a portion of the load capacitance of the vibrator 3. Capacitance values $C_3$ and $C_4$ of the variable capacitance circuits 16 and 17 are changed in accordance with the control voltages Vcnt1 and Vcnt2, respectively, and the control voltages Vcnt1 and Vcnt2 are changed in accordance with a voltage level of a frequency control signal input from the external terminal VC1 via the VC terminal. Therefore, the oscillation frequency of the oscillating circuit 10 can be changed by the frequency control signal input from the external terminal VC1. In this way, in the present embodiment, the voltage control circuit 41 generates the control voltages Vcnt1 and Vcnt2 corresponding to the voltage level of the frequency control signal input from the external terminal VC1. However, the voltage control circuit 41 may be a temperature compensation circuit, and the control voltages Vcnt1 and Vcnt2 may be temperature compensation voltages.

A circuit for stopping the oscillation when the oscillation enable signal en_osc is in a low level is omitted in the illustration in FIG. 5. However, for example, the circuit may be a switch circuit that cuts off the supply of the oscillation stage current Iosc to the amplifier element 11 when the oscillation enable signal en_osc is in a low level.

1-3. Start Sequence

In the present embodiment, the oscillator circuit has a plurality of operation modes including a normal operation mode and a start mode. The normal operation mode is an operation mode in which the oscillating circuit 10 oscillates in a state where a negative resistance value |nR| which is an absolute value of the negative resistance becomes a predetermined first value |nR$_1$|. The start mode is an operation mode until a state where the oscillating circuit 10 stops oscillation is shifted to the normal operation mode. For example, the start mode is an operation mode until a state where the power is supplied to the oscillator 1 is shifted to the normal operation mode. In addition, when as the operation mode, the oscillator circuit has a standby mode in which the oscillation of the oscillating circuit 10 is stopped in a state where the power is supplied to the oscillator 1, the operation mode until the standby mode is shifted to the normal operation mode is also the start mode.

In the present embodiment, the vibrator 3 is a quartz crystal resonator, and can resonate with a main vibration or a sub-vibration. When polarizations of an X-axis, a Y-axis, and a Z-axis of vibration are illustrated, each of the Y-axis and the Z-axis represents a cosine wave. When the numbers of peaks are defined as p, q, r, respectively, a vibration mode is expressed as (p.q.r). For example, when the vibrator 3 is an AT cut quartz crystal resonator, the main vibration is a thickness main vibration having a vibration mode of (1.0.0). The thickness main vibration is a pure sliding vibration only for displacement in an X-axis direction, and has a constant polarization in a Z-axis direction. In addition, for example, the sub-vibration is a thickness sub-vibration having a vibration mode of (3.1.0), (5.1.0), or (7.1.0). The thickness sub-vibration is a sliding vibration only in the X-axis direction, but has an odd number of sinusoidal polarizations in the X-axis direction. Signs of polar values adjacent to each other are opposite to each other. Alternatively, the sub-vibration may be the thickness sub-vibration having a vibration mode of (1.1.1) or (1.1.2). The thickness sub-vibration is close to the thickness main vibration, and is the vibration interposed between the thickness main vibration and the thickness sub-vibration having a vibration mode of (3.1.0), (5.1.0), or (7.1.0). The thickness sub-vibration has one sinusoidal polarization in the X-axis direction, and has one or two cosine wave-like polarizations in the Z-axis direction. The signs of the polar values adjacent to each other are opposite to each other. Alternatively, the sub-vibration may be generated by higher-order contour vibration having a vibration mode of (21.0.0). The sub-vibration generated by the higher-order contour vibration has an odd number of sinusoidal polarizations in the X-axis direction. The signs of the polar values adjacent to each other are opposite to each other. The sub-vibration has a substantially constant polarization in the Z-axis direction. Alternatively, the sub-vibration may be generated by higher-order contour vibration having a vibration mode of (0.0.33). The sub-vibration generated by the higher-order contour vibration has an odd number of sinusoidal polarizations in the Z-axis direction. The signs of the polar values adjacent to each other are opposite to each other. The sub-vibration has a substantially constant polarization in the X-axis direction. Alternatively, the sub-vibration may be generated by the higher-order contour vibration having a vibration mode of (40.1.0), (42.1.0), or (12.1.0). The sub-vibration generated by the higher-order contour vibration has an odd number of sinusoidal polarizations in the X-axis direction. The signs of the polar values adjacent to each other are opposite to each other.

A load series resistance value R$_{Lm}$ when the vibrator 3 resonates with the main vibration is smaller than a load series resistance value R$_{Ls}$ when the vibrator 3 resonates with the sub-vibration. In other words, the vibration having the smallest load series resistance value is the main vibration. In the normal operation mode, when the vibrator 3 resonates with the main vibration, the oscillating circuit 10 normally oscillates, and the oscillation signal CK having the target frequency can be obtained. However, when the vibrator 3 resonates with the sub-vibration, the oscillating circuit 10 abnormally oscillates, and the oscillation signal CK having the target frequency cannot be obtained. In the normal operation mode, in order that the oscillating circuit 10 stably oscillates with the main vibration, the negative resistance value |nR| is set to the first value |nR$_1$| which is sufficiently greater than R$_{Lm}$. Specifically, the logic circuit 42 of the control circuit 40 supplies the current adjustment data trimI[4:0] and the capacitance adjustment data trimC1[4:0] and trimC2[4:0] which are transferred from the non-volatile memory 71 to the register 72 to the oscillating circuit 10, and performs control so that the negative resistance value |nR| of the oscillating circuit 10 becomes the first value |nR$_1$| determined by the current adjustment data trimI[4:0] and the capacitance adjustment data trimC1[4:0] and trimC2[4:0].

However, since the first value |nR$_1$| is sufficiently greater than R$_{Lm}$, the first value |nR$_1$| becomes greater than R$_{Ls}$ as a result. Then, the first value |nR$_1$| is greater than R$_{Ls}$. Accordingly, when the negative resistance value |nR| is immediately set to the first value |nR$_1$| in a state where the oscillation of the oscillating circuit 10 is stopped, the vibrator 3 may resonate with the sub-vibration depending on conditions, and there is a possibility that the oscillating circuit 10 may cause abnormal oscillation. Therefore, in the present embodiment, in order to reduce the possibility that the oscillating circuit 10 may cause abnormal oscillation, in the start mode, the logic circuit 42 of the control circuit 40 controls the negative resistance value |nR| of the oscillating circuit 10 to increase from a second value |nR$_2$| which is smaller than the first value |nR$_1$|.

Here, as described above, the first value |nR$_1$| is a value greater than the load series resistance value R$_{Lm}$ when the vibrator 3 resonates with the main vibration, and greater than the load series resistance value R$_{Ls}$ when the vibrator 3 resonates with the sub-vibration. In addition, the second value |nR$_2$| is at least a value smaller than the load series resistance value R$_{Ls}$ when the vibrator 3 resonates with the sub-vibration, that is, a negative resistance value in which the vibrator 3 cannot resonate with the sub-vibration. The second value |nR$_2$| may be smaller or greater than the load series resistance value R$_{Lm}$ when the vibrator 3 resonates with the main vibration. For example, in view of variations in the characteristics of the vibrator 3 coupled to the oscillator circuit 2, the second value |nR$_2$| may be set to be smaller than R$_{Lm}$ so that the second value |nR$_2$| is reliably smaller than R$_{Ls}$.

In this way, in the present embodiment, in the start mode, the logic circuit 42 controls the negative resistance value |nR| of the oscillating circuit 10 to increase from the second value |nR$_2$| in which the vibrator 3 cannot resonate with at least the sub-vibration. In this manner, a state always exists where the negative resistance value |nR| becomes greater than R$_{Lm}$ and smaller than R$_{Ls}$. In this state, the vibrator 3 can resonate with the main vibration, but cannot resonate with the sub-vibration. Therefore, the vibrator 3 resonates with the main vibration before the vibrator 3 resonates with the sub-vibration, and the oscillating circuit 10 normally oscillates, based on the resonance with the main vibration.

Here, in the oscillating circuit 10 illustrated in FIG. 5, when mutual conductance of the amplifier element 11 is defined as g$_m$, a capacitance value coupled to the XI terminal is defined as $C_{XT}$, a capacitance value coupled to the XO terminal is defined as $C_{XO}$, and the oscillation frequency of the oscillating circuit 10 is defined as $f=\omega/2\pi$, a theoretical equation of the negative resistance value $|nR|$ of the oscillating circuit 10 is expressed by Equation (1).

$$|nR| = \frac{g_m}{\omega^2 C_{XI} C_{XO}} \quad (1)$$

In addition, the mutual conductance $g_m$ of the amplifier element 11 is expressed by Equation (2). In Equation (2), q is a charge of an electron, k is a Boltzmann constant, and T is an absolute temperature.

$$g_m = \frac{q \cdot Iosc}{kT} \quad (2)$$

According to Equation (1), as the mutual conductance $g_m$ of the amplifier element 11 increases, the negative resistance value $|nR|$ is greater. In Equation (2), q, k, and T are constants. Accordingly, as the oscillation stage current Iosc increases, the mutual conductance $g_m$ increases. Therefore, as the oscillation stage current Iosc increases, the negative resistance value $|nR|$ becomes greater.

Therefore, in the present embodiment, in the start mode, the logic circuit 42 of the control circuit 40 increases the negative resistance value $|nR|$ of the oscillating circuit 10 from the second value $|nR_2|$ by increasing a value of the oscillation stage current Iosc. Specifically, in the start mode, the logic circuit 42 changes a value of the current adjustment data trimI[4:0] output to the oscillating circuit 10, and increases the value of the oscillation stage current Iosc in a stepwise manner so that the negative resistance value $|nR|$ is controlled to increase in a stepwise manner.

Figure 10:
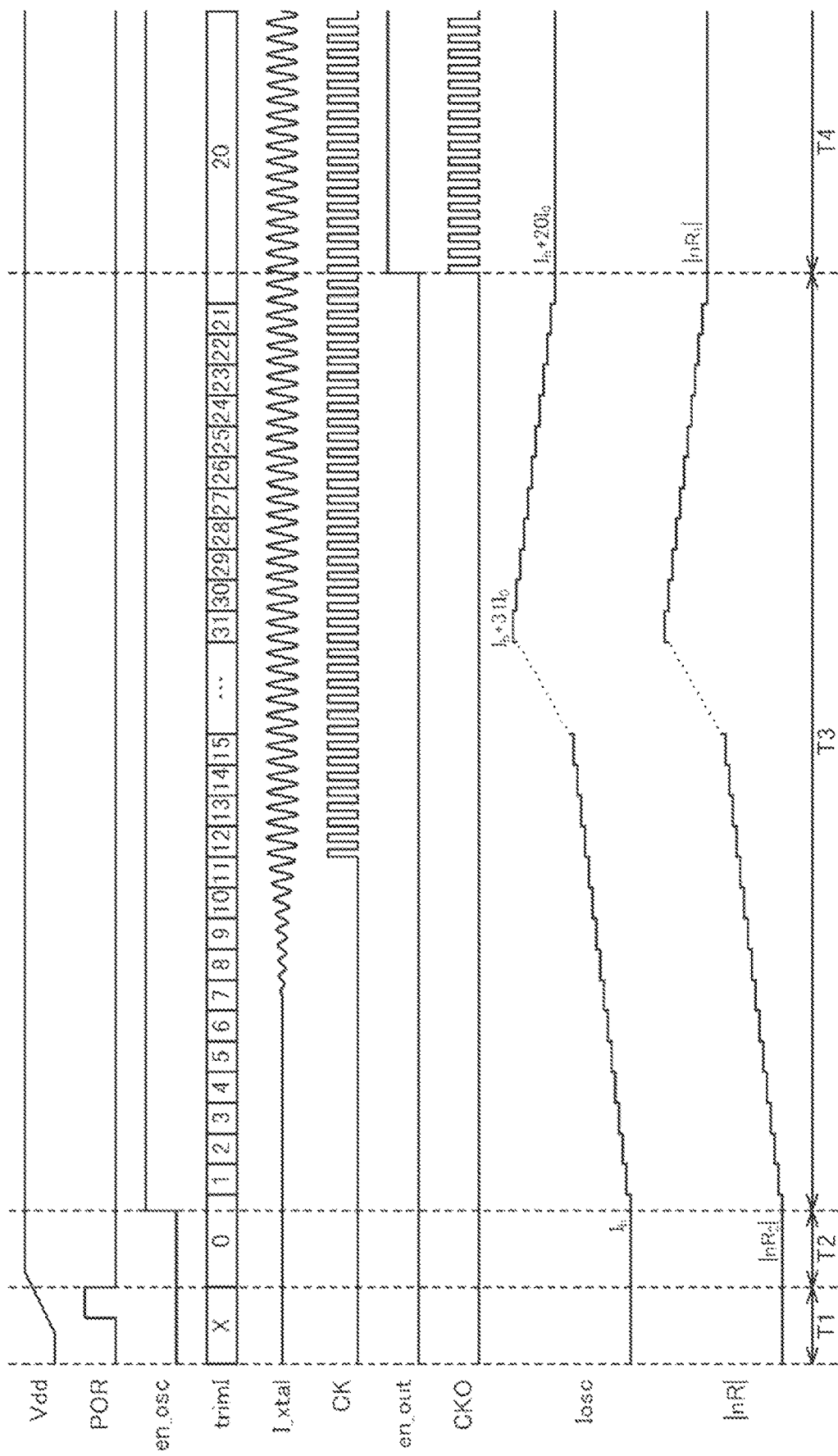
FIG. 10 is a waveform chart illustrating an example of a sequence according to the first embodiment.

FIG. 10 is a waveform chart illustrating an example of a sequence in which a state where the power is supplied to the oscillator circuit 2 is shifted to the normal operation mode. In the example of FIG. 10, when the power is supplied to the oscillator 1, a reset period T1 starts, the power supply voltage Vdd rises from 0 V to a predetermined voltage value, the power-on reset signal POR is changed from a low level to a high level, and the logic circuit 42 is initialized. Thereafter, when the power-on reset signal POR is changed from the high level to the low level, the reset period T1 ends, and a memory load period T2 starts.

In the memory load period T2, various information stored in the non-volatile memory 71 is transferred to the register 72. After the transfer ends, the logic circuit 42 changes the oscillation enable signal en_osc from the low level to the high level. In this manner, the memory load period T2 ends, and a start period T3 starts.

In the start period T3, the logic circuit 42 gradually increases the current adjustment data trimI[4:0] from a start value to an end value by any desired value. As a result, a value of the oscillation stage current Iosc gradually increases. For example, the start value and the end value of the current adjustment data trimI[4:0] may be written in the non-volatile memory 71 in advance so that the values can be set to any desired value. In the example of FIG. 10, the logic circuit 42 gradually increases the current adjustment data trimI[4:0] by 1 in order from 0 of the start value. As a result, the value of the oscillation stage current Iosc gradually increases by $I_0$ from $I_b$. As a result, in the start period T3, the negative resistance value $|nR|$ of the oscillating circuit 10 increases in a stepwise manner from the second value $|nR_2|$. When the negative resistance value $|nR|$ becomes greater than $R_{Lm}$ and smaller than $R_{Ls}$, the vibrator 3 starts resonance with the main vibration, and an amplitude of a current I_xtal output from the vibrator 3 increases. Then, when the amplitude of the current I_xtal exceeds a predetermined threshold value, a pulse is generated in the oscillation signal CK. Thereafter, the current adjustment data trimI[4:0] also increases, and the negative resistance value $|nR|$ also becomes greater than $R_{Ls}$. However, at this time, the oscillation of the oscillating circuit 10 sufficiently grows by the resonance with the main vibration of the vibrator 3. Accordingly, the resonance with the sub-vibration of the vibrator 3 does not occur. When the current adjustment data trimI[4:0] further increases to reach 31 of the end value, the value of the oscillation stage current Iosc becomes $I_b+31I_0$. Thereafter, the logic circuit 42 gradually changes the value of the current adjustment data trimI[4:0] by any desired value from the end value to a setting value in the normal operation mode. In the example of FIG. 10, the logic circuit 42 gradually decreases the value of the current adjustment data trimI[4:0] by 1 from 31 of the end value. When the setting value of the current adjustment data trimI[4:0] in the normal operation mode reaches 20 which is a value transferred to the register 72 in the memory load period T2, the value of the oscillation stage current Iosc becomes $I_b+20I_0$, and the negative resistance value $|nR|$ becomes the first value $|nR_1|$. Then, the logic circuit 42 holds the value of the current adjustment data trimI[4:0] at 20, and changes the output enable signal en_out from the low level to the high level. In this manner, the start period T3 ends, and a normal operation period T4 starts.

In the normal operation period T4, the output enable signal en_out is in the high level. Accordingly, the oscillation signal CK is buffered, and a pulse is generated in the oscillation signal CKO.

In the example of FIG. 10, the operation mode in the start period T3 is the start mode, and the operation mode in the normal operation period T4 is the normal operation mode. Alternatively, the operation mode in the reset period T1, the memory load period T2, and the start period T3 is the start mode.

In the example of FIG. 10, in the start mode, the logic circuit 42 increases the current adjustment data trimI[4:0] from a minimum value to a maximum value, and thereafter, decreases the current adjustment data trimI[4:0] to the setting value in the normal operation mode. Accordingly, the start period T3 is lengthened. In contrast, it is also conceivable to adopt another sequence in which the start period T3 is shortened.

Figure 11:
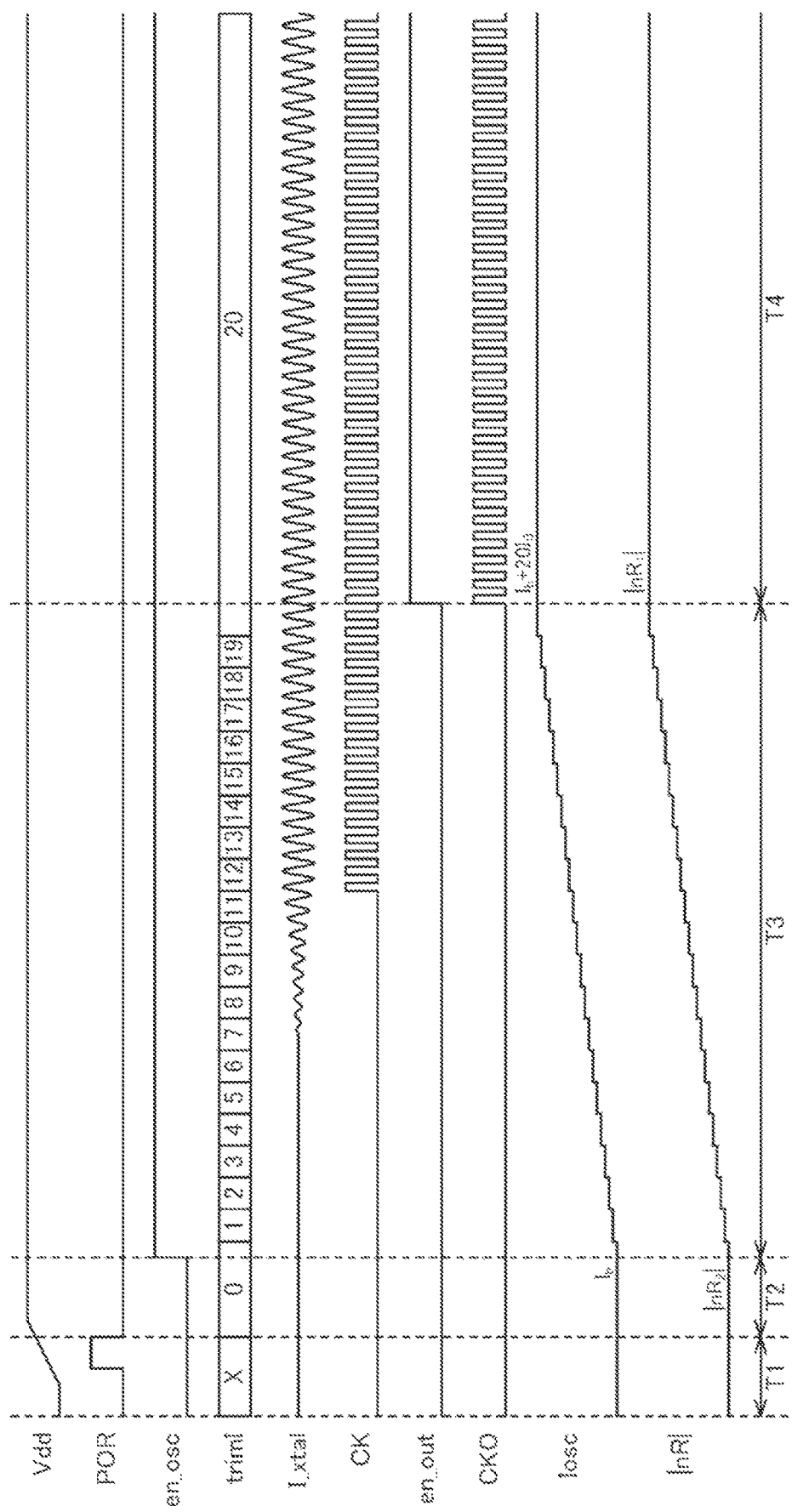
FIG. 11 is a waveform chart illustrating another example of the sequence according to the first embodiment.

FIG. 11 is a waveform chart illustrating another example of a sequence in which a state where the power is supplied to the oscillator circuit 2 is shifted to the normal operation mode. In the example of FIG. 11, in the start period T3, the logic circuit 42 gradually increases the current adjustment data trimI[4:0] by any desired value from the start value to the setting value in the normal operation mode. As a result, the value of the oscillation stage current Iosc gradually increases. For example, the start value of the current adjustment data trimI[4:0] may be written in the non-volatile memory 71 in advance so that the start value can be set to any desired value. In the example of FIG. 11, the logic circuit 42 gradually increases the current adjustment data trimI[4:0] by 1 from 0 of the start value to 20 of the setting value in the normal operation mode. As a result, the value of the oscillation stage current Iosc increases by $I_0$ from $I_b$ to $I_b+20I_0$. As a result, in the start period T3, the negative resistance value |nR| of the oscillating circuit 10 increases in a stepwise manner from the second value |nR$_2$| to the first value |nR$_1$|. Then, the logic circuit 42 holds the value of the current adjustment data trimI[4:0] at 20, and changes the output enable signal en_out from the low level to the high level. In this manner, the start period T3 ends, and the normal operation period T4 starts.

In the example of FIG. 11, the logic circuit 42 does not need to increase the current adjustment data trimI[4:0] from the start value to the end value. Accordingly, the start period T3 is shortened. In addition, in the example of FIG. 11, the first value |nR$_1$| which is the setting value of the negative resistance value |nR| in the normal operation mode is equal to or greater than the maximum value of the negative resistance value |nR| in the start period T3. That is, in the start period T3, the negative resistance value |nR| is not greater than the first value |nR$_1$|. Accordingly, a time during which the negative resistance value |nR| becomes a value greater than the load series resistance value $R_{Ls}$ when the vibrator 3 resonates with the sub-vibration is short. The resonance with the sub-vibration of the vibrator 3 is less likely to occur.

In the example of FIG. 11, the operation mode in the start period T3 is also the start mode, and the operation mode in the normal operation period T4 is also the normal operation mode. Alternatively, the operation mode in the reset period T1, the memory load period T2, and the start period T3 is the start mode.

1-4. Method for Controlling Oscillator Circuit

Figure 12:
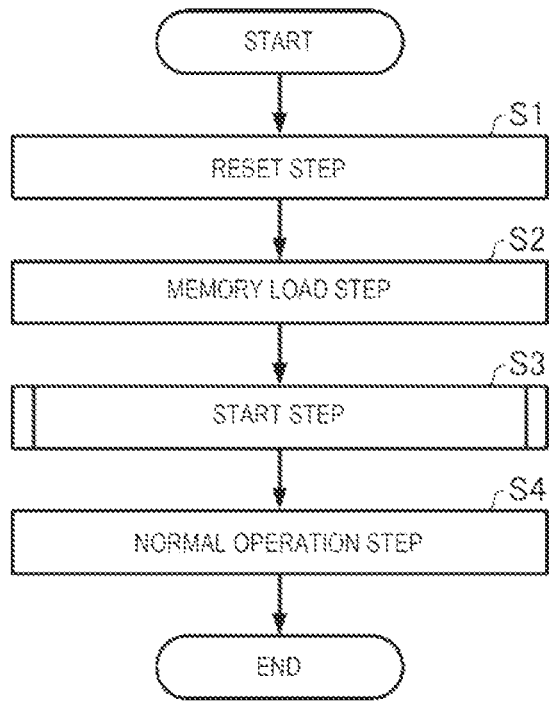
FIG. 12 is a flowchart illustrating an example of a procedure of a method for controlling an oscillator circuit.

FIG. 12 is a flowchart illustrating an example of a procedure of a method for controlling the oscillator circuit 2. As illustrated in FIG. 12, when the power is supplied to the oscillator 1, the oscillator circuit 2 first performs a reset step S1. Specifically, in the reset step S1, the power-on reset circuit 30 changes the power-on reset signal POR from a low level to a high level to initialize the logic circuit 42. Then, the power-on reset circuit 30 changes the power-on reset signal POR from the high level to the low level, and the reset step S1 ends. A period of the reset step S1 corresponds to the reset period T1 in FIG. 10 or 11.

Next, the oscillator circuit 2 performs a memory load step S2. Specifically, in the memory load step S2, the memory circuit 70 transfers various information stored in the non-volatile memory 71 to the register 72. Then, after the transfer ends, the logic circuit 42 sets the oscillation enable signal en_osc to the high level, and the memory load step S2 ends. A period of the memory load step S2 corresponds to the memory load period T2 in FIG. 10 or 11.

Next, the oscillator circuit 2 performs a start step S3. Specifically, in the start step S3, the logic circuit 42 sets the oscillation enable signal en_osc to the high level, and controls the negative resistance value |nR| of the oscillating circuit 10 to increase from the second value |nR$_2$| which is smaller than the first value |nR$_1$|. Then, the logic circuit 42 changes the output enable signal en_out from the low level to the high level, and the start step S3 ends. A period of the start step S3 corresponds to the start period T3 in FIG. 10 or 11.

Finally, the oscillator circuit 2 performs a normal operation step S4. Specifically, in the normal operation step S4, the oscillating circuit 10 oscillates in a state where the negative resistance value |nR| is the second value |nR$_2$|, and the oscillation signal CKO output from the output circuit 60 is output from the external terminal OUT1 of the oscillator 1 via the OUT terminal. A period of the normal operation step S4 corresponds to the normal operation period T4 in FIG. 10 or 11.

The operation mode in the start step S3 is the start mode, and the operation mode in the normal operation step S4 is the normal operation mode. Alternatively, the operation mode in the reset step S1, the memory load step S2, and the start step S3 is the start mode.

Figure 13:
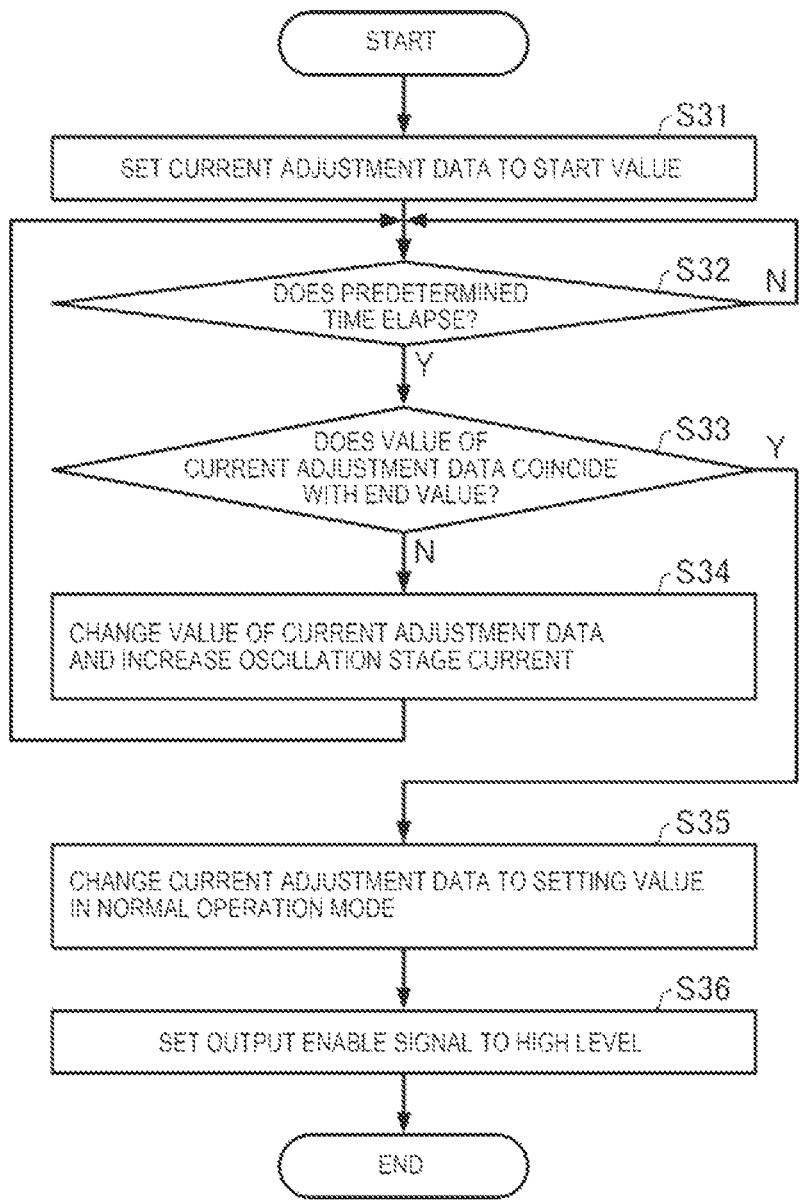
FIG. 13 is a flowchart illustrating an example of a procedure of a start step according to the first embodiment.

FIG. 13 is a flowchart illustrating an example of a procedure of the start step S3 in FIG. 12 according to the first embodiment. The procedure illustrated in FIG. 13 corresponds to an operation of the start period T3 in FIG. 10. As illustrated in FIG. 13, in Step S31, the logic circuit 42 first sets the current adjustment data trimI[4:0] to the start value. In the example of FIG. 10, the start value is 0. Since the current adjustment data trimI[4:0] is set to the start value, the negative resistance value |nR| of the oscillating circuit 10 becomes the second value |nR$_2$|.

Next, when a predetermined time elapses in Step S32, the logic circuit 42 determines in Step S33 whether or not the value of the current adjustment data trimI[4:0] coincides with the end value. In the example of FIG. 10, the end value is 20.

When the value of the current adjustment data trimI[4:0] does not coincide with the end value in Step S33, the logic circuit 42 changes the value of the current adjustment data trimI[4:0] in Step S34 to increase the oscillation stage current Iosc.

Steps S32, S33, and S34 are repeatedly performed until the value of the current adjustment data trimI[4:0] coincides with the end value. When the value of the current adjustment data trimI[4:0] coincides with the end value, in Step S35, the logic circuit 42 changes the current adjustment data trimI[4:0] to the setting value in the normal operation mode.

Then, in Step S36, the logic circuit 42 sets the output enable signal en_out to the high level, and the start step S3 ends.

Figure 14:
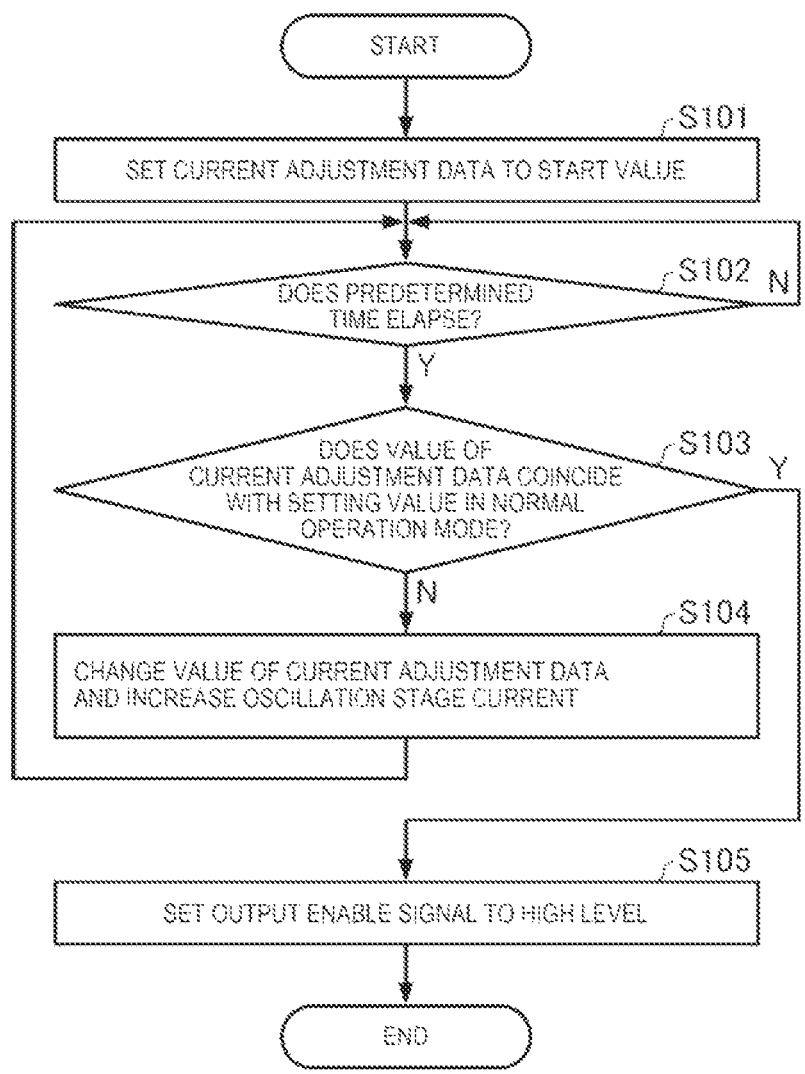
FIG. 14 is a flowchart illustrating another example of the procedure of the start step according to the first embodiment.

FIG. 14 is a flowchart illustrating another example of the procedure of the start step S3 in FIG. 12 according to the first embodiment. The procedure illustrated in FIG. 14 corresponds to an operation of the start period T3 of FIG. 11. As illustrated in FIG. 14, in Step S101, the logic circuit 42 first sets the current adjustment data trimI[4:0] to the start value. In the example of FIG. 11, the start value is 0. Since the current adjustment data trimI[4:0] is set to the start value, the negative resistance value |nR| of the oscillating circuit 10 becomes the second value |nR$_2$|.

Next, when a predetermined time elapses in Step S102, the logic circuit 42 determines in Step S103 whether or not the value of the current adjustment data trimI[4:0] coincides with the setting value in the normal operation mode. The setting value of the current adjustment data trimI[4:0] in the normal operation mode is a value stored in the non-volatile memory 71.

When the value of the current adjustment data trimI[4:0] does not coincide with the setting value in the normal operation mode in Step S103, the logic circuit 42 changes the value of the current adjustment data trimI[4:0] in Step S104 to increase the oscillation stage current Iosc.

Then, Steps S102, S103, and S104 are repeatedly performed until the value of the current adjustment data trimI[4:0] coincides with the setting value in the normal operation mode. When the value of the current adjustment data trimI[4:0] coincides with the setting value in the normal operation mode, the logic circuit 42 sets the output enable signal en_out to the high level in Step S105, and the start step S3 ends.

1-5. Operational Effect

In the oscillator 1 of the first embodiment described above, in the oscillator circuit 2, in the start mode until a state where the oscillating circuit 10 stops the oscillation is shifted to the normal operation mode in which the oscillating circuit 10 oscillates in a state where the negative resistance value |nR| of the oscillating circuit 10 is the first value |nR$_1$|, the negative resistance value |nR| of the oscillating circuit 10 increases from the second value |nR$_2$| which is smaller than the first value |nR$_1$|. The load series resistance value R$_{Lm}$ when the vibrator 3 resonates with the main vibration is smaller than the load series resistance value R$_{Ls}$ when the vibrator 3 resonates with the sub-vibration. Accordingly, the negative resistance value |nR| of the oscillating circuit 10 increases from the second value |nR$_2$|, and becomes a value greater than R$_{Lm}$ and smaller than R$_{Ls}$. Therefore, in the start mode, the oscillation based on the resonance with the main vibration of the vibrator 3 grows before the oscillation based on the resonance with the sub-vibration of the vibrator 3. Therefore, according to the oscillator 1 of the first embodiment, a possibility of abnormal oscillation can be reduced even when the characteristics of the vibrator 3 vary.

In particular, in the oscillator 1 of the first embodiment, in the start mode, the negative resistance value |nR| of the oscillating circuit 10 gradually increases in a stepwise manner from the second value |nR$_2$| by increasing the value of the oscillation stage current Iosc. Accordingly, a time during which the negative resistance value |nR| becomes a value greater than R$_{Lm}$ and smaller than R$_{Ls}$ is further lengthened. Therefore, the oscillation based on the resonance with the main vibration of the vibrator 3 grows before the oscillation based on the resonance with the sub-vibration of the vibrator 3. Therefore, according to the oscillator 1 of the first embodiment, a possibility of abnormal oscillation can be reduced even when the characteristics of the vibrator 3 vary.

In addition, according to the oscillator 1 of the first embodiment, the variable current source 12 for setting the oscillation stage current Iosc to a desired value corresponding to the resonance frequency of the vibrator 3 in the normal operation mode can also be used to increase the negative resistance value |nR| of the oscillating circuit 10 in the start mode.

2. Second Embodiment

Hereinafter, with regard to the oscillator 1 of a second embodiment, the same reference numerals will be assigned to configurations the same as those of the first embodiment, and description the same as that of the first embodiment will be omitted or simplified. Contents different from those of the first embodiment will be mainly described.

The configurations of the oscillator 1 of the second embodiment are the same as those in FIGS. 1 to 4. Accordingly, illustration and description thereof will be omitted. In addition, the configuration of the oscillating circuit 10 in the second embodiment is the same as that in FIG. 5. Accordingly, illustration and description thereof will be omitted. The oscillator 1 of the second embodiment has an operation in the start mode which is different from that of the oscillator 1 of the first embodiment.

According to Equation (1) above, as at least one of the capacitance values C$_{XI}$ and C$_{XO}$ becomes smaller, the negative resistance value |nR| becomes greater. Therefore, in the second embodiment, in the start mode, the logic circuit 42 of the control circuit 40 increases the negative resistance value |nR| of the oscillating circuit 10 from the second value |nR$_2$| by decreasing at least one of the capacitance values C$_1$ and C$_2$ of the variable capacitance circuits 14 and 15. Specifically, in the start mode, the logic circuit 42 changes at least one value of the capacitance adjustment data trimC1[4:0] and trimC2[4:0] output to the oscillating circuit 10, and increases at least one of the capacitance values C$_1$ and C$_2$ of the variable capacitance circuits 14 and 15 in a stepwise manner. In this manner, the logic circuit 42 controls the negative resistance value |nR| to increase in a stepwise manner.

Other configurations of the oscillator 1 of the second embodiment are the same as those of the first embodiment. Accordingly, illustration and description thereof will be omitted.

Figure 15:
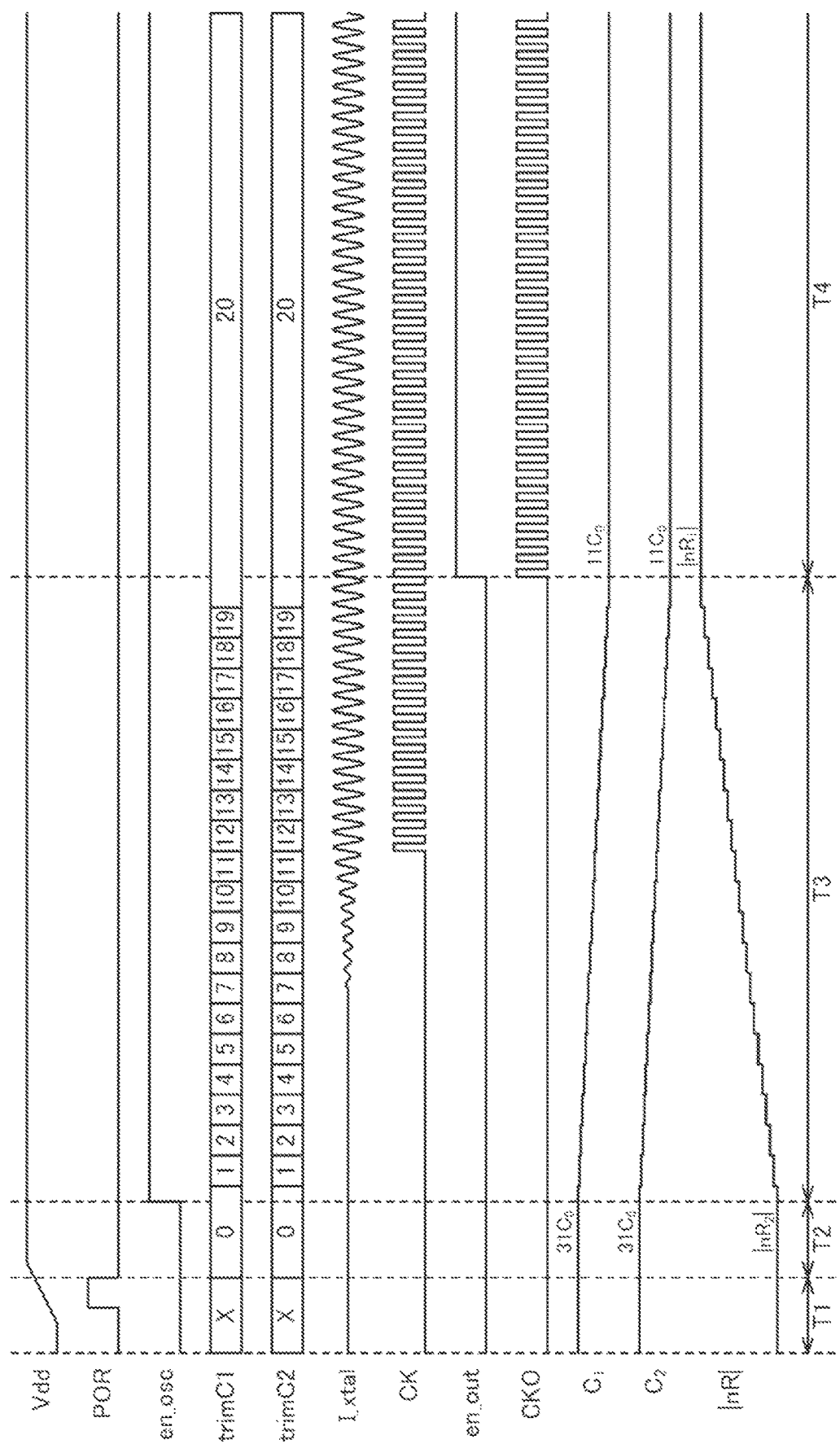
FIG. 15 is a waveform chart illustrating an example of a sequence according to a second embodiment.

FIG. 15 is a waveform chart illustrating an example of a sequence in the second embodiment in which a state where the power is supplied to the oscillator circuit 2 is shifted to the normal operation mode. In the example of FIG. 15, when the power is supplied to the oscillator 1, the reset period T1 starts, the power supply voltage Vdd rises from 0 V to a predetermined voltage value, the power-on reset signal POR is changed from a low level to a high level, and the logic circuit 42 is initialized. Thereafter, when the power-on reset signal POR is changed from the high level to the low level, the reset period T1 ends, and a memory load period T2 starts.

In the memory load period T2, various information stored in the non-volatile memory 71 is transferred to the register 72. After the transfer ends, the logic circuit 42 changes the oscillation enable signal en_osc from the low level to the high level. In this manner, the memory load period T2 ends, and a start period T3 starts.

In the start period T3, the logic circuit 42 gradually increases the capacitance adjustment data trimC1[4:0] and trimC2[4:0] by any desired value from the start value to the setting value in the normal operation mode. As a result, the capacitance values C$_1$ and C$_2$ gradually increase. For example, the start value of the capacitance adjustment data trimC1[4:0] and trimC2[4:0] may be written in the non-volatile memory 71 in advance so that the start value can be set to any desired value. In the example of FIG. 15, the logic circuit 42 gradually increases each of the capacitance adjustment data trimC1[4:0] and trimC2[4:0] by 1 in order from 0 of the start value. As a result, each of the capacitance values C$_1$ and C$_2$ decreases by C$_0$ from 31C$_0$. As a result, in the start period T3, the negative resistance value |nR| of the oscillating circuit increases in a stepwise manner from the second value |nR$_2$|. When the negative resistance value |nR| becomes greater than R$_{Lm}$ and smaller than R$_{Ls}$, the vibrator 3 starts resonance with the main vibration, and an amplitude of a current I_xtal output from the vibrator 3 increases. Then, when the amplitude of the current I_xtal exceeds a predetermined threshold value, a pulse is generated in the oscillation signal CK. Thereafter, the capacitance adjustment data trimC1[4:0] and trimC2[4:0] also increase, and the negative resistance value |nR| is also greater than R$_{Ls}$. However, at this time, the oscillation of the oscillating circuit 10 sufficiently grows by the resonance with the main vibration of the vibrator 3. Accordingly, the resonance with the sub-vibration of the vibrator 3 does not occur. When the capacitance adjustment data trimC1[4:0] and trimC2[4:0] further increase and reach 20 which is a value transferred to the register 72 in the memory load period T2, each of the capacitance values C$_1$ and C$_2$ becomes 11C$_0$, and the negative resistance value |nR| becomes the first value |nR$_1$|. Then, the logic circuit 42 holds the value of the capacitance adjustment data trimC1[4:0] and trimC2[4:0] at 20, and changes the output enable signal en_out from the low level to the high level. In this manner, the start period T3 ends, and the normal operation period T4 starts.

In the normal operation period T4, the output enable signal en_out is in the high level. Accordingly, the oscillation signal CK is buffered, and a pulse is generated in the oscillation signal CKO.

In the start period T3, both the capacitance values $C_1$ and $C_2$ are decreased by increasing both the capacitance adjustment data trimC1[4:0] and trimC2[4:0]. However, one of the capacitance adjustment data trimC1[4:0] and trimC2[4:0] may be fixed, and the other may be increased. In this manner, one of the capacitance values $C_1$ and $C_2$ may be fixed, and the other may be decreased.

In the example of FIG. 15, the first value $|nR_1|$ which is the setting value of the negative resistance value $|nR|$ in the normal operation mode is equal to or greater than the maximum value of the negative resistance value $|nR|$ in the start period T3. That is, in the start period T3, the negative resistance value $|nR|$ is not greater than the first value $|nR_1|$. Accordingly, a time during which the negative resistance value $|nR|$ becomes a value greater than the load series resistance value $R_{Ls}$ when the vibrator 3 resonates with the sub-vibration is short. The resonance with the sub-vibration of the vibrator 3 is less likely to occur.

In the example of FIG. 15, the operation mode in the start period T3 is the start mode, and the operation mode in the normal operation period T4 is the normal operation mode. Alternatively, the operation mode in the reset period T1, the memory load period T2, and the start period T3 is the start mode.

Although the sequence is omitted in the illustration, in the start period T3, the logic circuit 42 may gradually increase at least one of the capacitance adjustment data trimC1[4:0] and trimC2[4:0] by any desired value from the start value to the end value. Thereafter, the logic circuit 42 may gradually decrease the at least one of the capacitance adjustment data trimC1[4:0] and trimC2[4:0] by any desired value to the setting value in the normal operation mode.

The flowchart illustrating the procedure of the method for controlling the oscillator circuit 2 in the second embodiment is the same as that in FIG. 12. Accordingly, illustration and description thereof will be omitted. However, in the second embodiment, the procedure of the start step S3 in FIG. 12 is different from that of the first embodiment.

Figure 16:
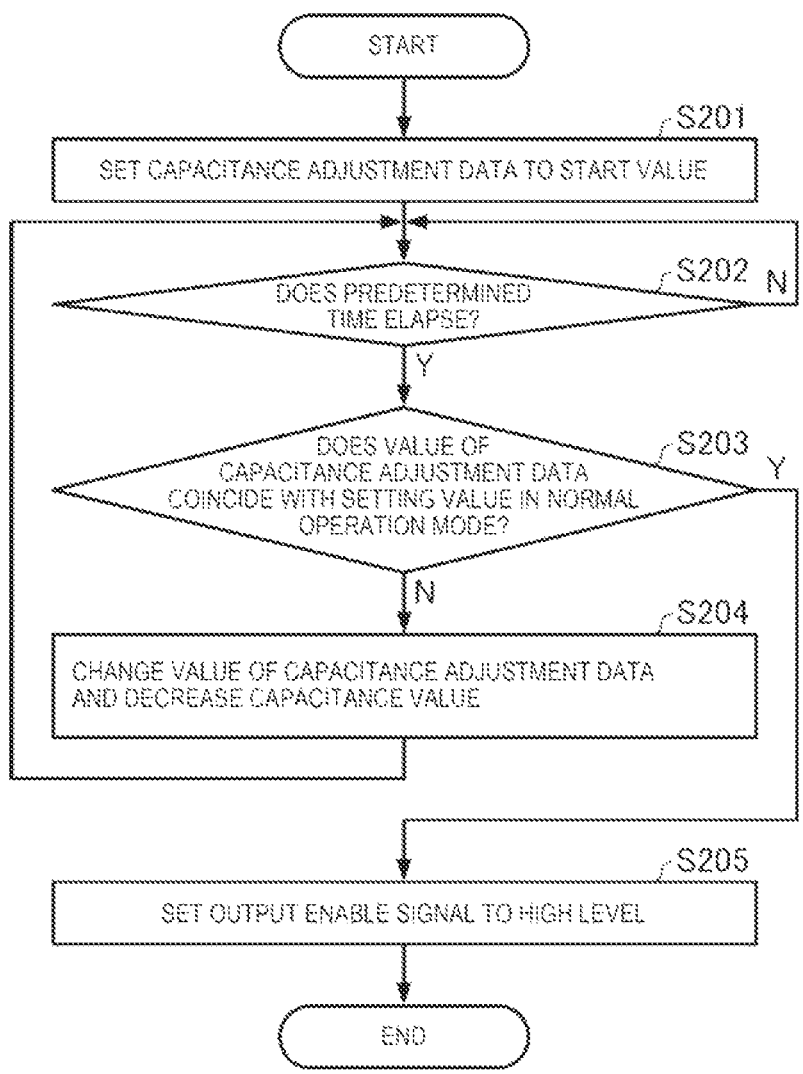
FIG. 16 is a flowchart illustrating an example of a procedure of a start step according to the second embodiment.

FIG. 16 is a flowchart illustrating an example of the procedure of the start step S3 in FIG. 12 in the second embodiment. The procedure illustrated in FIG. 16 corresponds to an operation of the start period T3 in FIG. 15. As illustrated in FIG. 16, in Step S201, the logic circuit 42 first sets each of the capacitance adjustment data trimC1[4:0] and trimC2[4:0] to the start value. In the example of FIG. 15, the start values are both 0. Since each of the capacitance adjustment data trimC1[4:0] and trimC2[4:0] is set to the start value, the negative resistance value $|nR|$ of the oscillating circuit 10 becomes the second value $|nR_2|$.

Next, when a predetermined time elapses in Step S202, the logic circuit 42 determines in Step S203 whether or not each value of the capacitance adjustment data trimC1[4:0] and trimC2[4:0] coincides with the setting value in the normal operation mode. The setting value of the capacitance adjustment data trimC1[4:0] and trimC2[4:0] in the normal operation mode is the value stored in the non-volatile memory 71.

In Step S203, when the value of the capacitance adjustment data trimC1[4:0] and trimC2[4:0] does not coincide with the setting value in the normal operation mode, the logic circuit 42 changes the value of the capacitance adjustment data trimC1[4:0] and trimC2[4:0] in Step S204 to decrease the capacitance values $C_1$ and $C_2$.

Then, Steps S202, S203, and S204 are repeatedly performed until the value of the capacitance adjustment data trimC1[4:0] and trimC2[4:0] coincides with the setting value in the normal operation mode. When the value of the capacitance adjustment data trimC1[4:0] and trimC2[4:0] coincides with the setting value in the normal operation mode, the logic circuit 42 sets the output enable signal en_out to the high level in Step S205, and the start step S3 ends.

The logic circuit 42 may fix one value of the capacitance adjustment data trimC1[4:0] and trimC2[4:0], and may change the other value. In this manner, the logic circuit 42 may fix one of the capacitance values $C_1$ and $C_2$, and may decrease the other.

In the oscillator 1 of the second embodiment described above, in the start mode, the capacitance values $C_1$ and $C_2$ of the variable capacitance circuits 14 and 15 are decreased so that the negative resistance value $|nR|$ of the oscillating circuit 10 gradually increases in a stepwise manner from the second value $|nR_2|$. Accordingly, a time during which the negative resistance value $|nR|$ becomes a value greater than the load series resistance value $R_{Lm}$ when the vibrator 3 resonates with the main vibration and smaller than the load series resistance value $R_{Ls}$ when the vibrator 3 resonates with the sub-vibration is further lengthened. Therefore, the oscillation based on the resonance with the main vibration of the vibrator 3 grows before the oscillation based on the resonance with the sub-vibration of the vibrator 3. Therefore, according to the oscillator of the second embodiment, a possibility of abnormal oscillation can be reduced even when the characteristics of the vibrator 3 vary.

In addition, according to the oscillator 1 of the second embodiment, the variable capacitance circuits 14 and 15 for setting the oscillation frequency of the oscillating circuit 10 to the target frequency in the normal operation mode can also be used to increase the negative resistance value $|nR|$ of the oscillating circuit 10 in the start mode.

3. Third Embodiment

Hereinafter, with regard to the oscillator 1 of a third embodiment, the same reference numerals will be assigned to configurations the same as those of any one of the above-described embodiments, and description the same as that of any one of the above-described embodiments will be omitted or simplified. Contents different from those of any one of the above-described embodiments will be mainly described.

The configurations of the oscillator 1 of the third embodiment are the same as those in FIGS. 1 to 4. Accordingly, illustration and description thereof will be omitted. In addition, the configuration of the oscillating circuit 10 in the third embodiment is the same as that in FIG. 5. Accordingly, illustration and description thereof will be omitted. The oscillator 1 of the third embodiment has an operation in the start mode which is different from that of the oscillator 1 of each of the above-described embodiments.

According to Equation (1) above, as at least one of the capacitance values $C_{XI}$ and $C_{XO}$ becomes smaller, the negative resistance value $|nR|$ becomes greater. Therefore, in the third embodiment, in the start mode, the voltage control circuit 41 of the control circuit 40 increases the negative resistance value $|nR|$ of the oscillating circuit 10 from the second value $|nR_2|$ by decreasing at least one of the capacitance values $C_3$ and $C_4$ of the variable capacitance circuits 16 and 17. Specifically, in the start mode, the voltage control circuit 41 changes at least one value of the control voltages Vcnt1 and Vcnt2 output to the oscillating circuit 10, and continuously increases at least one of the capacitance values $C_3$ and $C_4$ of the variable capacitance circuits 16 and 17. In this manner, the voltage control circuit 41 controls the negative resistance value |nR| to continuously increase.

Figure 17:
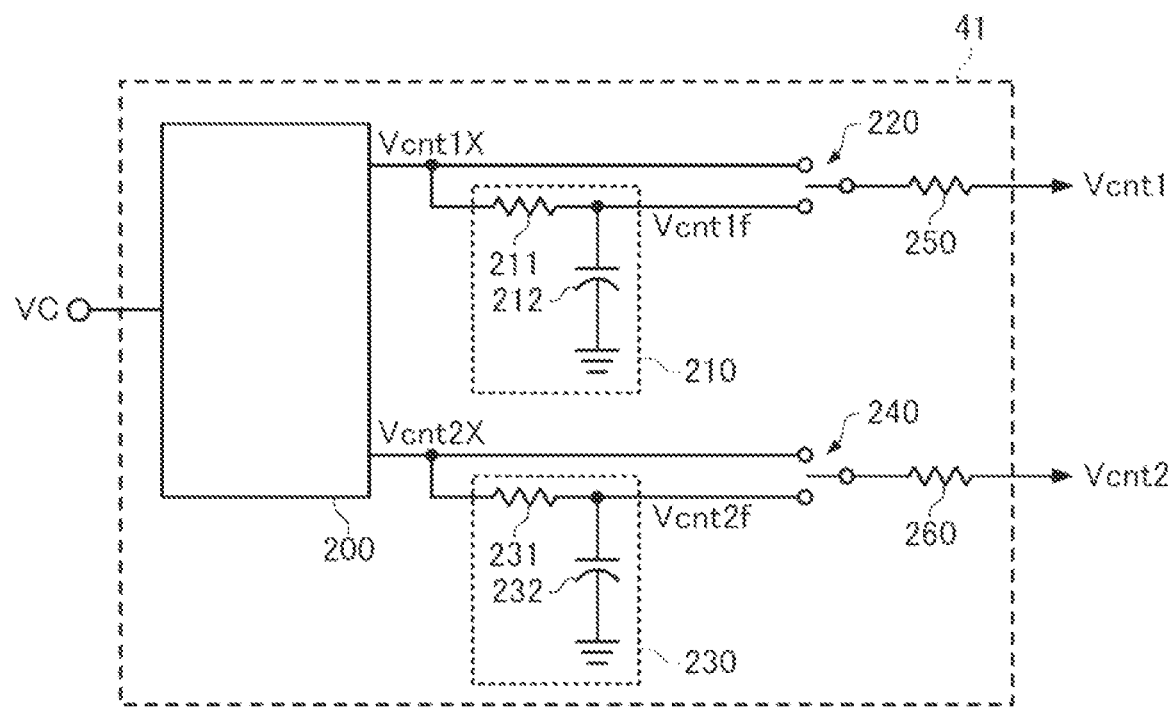
FIG. 17 is a view illustrating a configuration example of a voltage control circuit according to a third embodiment.

FIG. 17 is a view illustrating a configuration example of the voltage control circuit 41 according to the third embodiment. As illustrated in FIG. 17, the voltage control circuit 41 includes a control voltage generation circuit 200, a filter circuit 210, a switch circuit 220, a filter circuit 230, a switch circuit 240, a resistor 250, and a resistor 260.

In the normal operation mode, the control voltage generation circuit 200 generates control voltages Vcnt1X and Vcnt2X for changing the oscillation frequency of the oscillating circuit 10 in accordance with a voltage level of the frequency control signal supplied from the external terminal VC1 via the VC terminal. In addition, in the start mode, the control voltage generation circuit 200 outputs the control voltages Vcnt1X and Vcnt2X in accordance with the control from the logic circuit 42. The control voltage Vcnt1X is input to the filter circuit 210, and the control voltage Vcnt2X is input to the filter circuit 230.

The filter circuit 210 is a low-pass filter circuit including a resistor 211 and a capacitance element 212, and outputs the control voltage Vcnt1$f$ in which rise or fall of the control voltage Vcnt1 becomes gentle.

In accordance with the control from the logic circuit 42, the switch circuit 220 selects and outputs the control voltage Vcnt1X in the normal operation mode, and selects and outputs the control voltage Vcnt1$f$ in the start mode. The voltage output from the switch circuit 220 is supplied to the variable capacitance circuit 16 in FIG. 5 via the resistor 250, as the control voltage Vcnt1.

The filter circuit 230 is a low-pass filter circuit including a resistor 231 and a capacitance element 232, and outputs the control voltage Vcnt2$f$ in which rise or fall of the control voltage Vcnt2 becomes gentle.

In accordance with the control from the logic circuit 42, the switch circuit 240 selects and outputs the control voltage Vcnt2X in the normal operation mode, and selects and outputs the control voltage Vcnt2$f$ in the start mode. The voltage output from the switch circuit 240 is supplied to the variable capacitance circuit 17 in FIG. 5 via the resistor 260, as the control voltage Vcnt2.

Other configurations of the oscillator 1 of the third embodiment are the same as those of each of the above-described embodiments. Accordingly, illustration and description thereof will be omitted.

Figure 18:
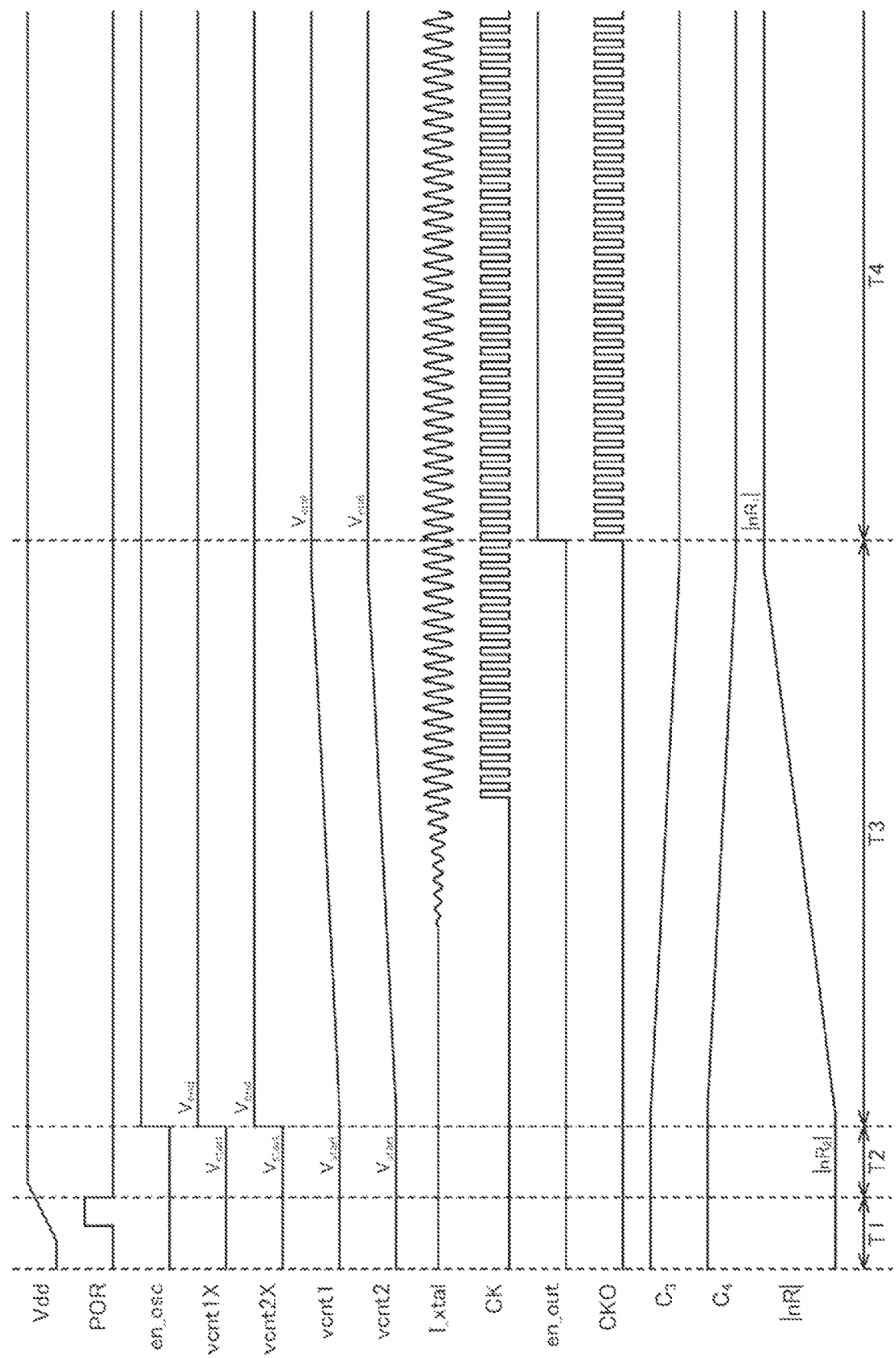
FIG. 18 is a waveform chart illustrating an example of a sequence according to the third embodiment.

FIG. 18 is a waveform chart illustrating an example of a sequence in the third embodiment in which a state where the power is supplied to the oscillator circuit 2 is shifted to the normal operation mode. In the example of FIG. 18, when the power is supplied to the oscillator 1, the reset period T1 starts, the power supply voltage Vdd rises from 0 V to a predetermined voltage value, the power-on reset signal POR is changed from the low level to the high level, and the logic circuit 42 is initialized. Thereafter, when the power-on reset signal POR is changed from the high level to the low level, the reset period T1 ends, and a memory load period T2 starts.

In the memory load period T2, various information stored in the non-volatile memory 71 is transferred to the register 72. After the transfer ends, the logic circuit 42 changes the oscillation enable signal en_osc from the low level to the high level. In this manner, the memory load period T2 ends, and a start period T3 starts.

In the start period T3, under the control of the logic circuit 42, in the voltage control circuit 41, the control voltage generation circuit 200 raises the control voltages Vcnt1X and Vcnt2X from a start value $V_{start}$ to an end value $V_{end}$, and the switch circuits 220 and 240 select and output the control voltages Vcnt1$f$ and Vcnt2$f$ output from the filter circuits 210 and 230. In this manner, the rise of the control voltages Vcnt1 and Vcnt2 becomes gentle, and the control voltages Vcnt1 and Vcnt2 continuously increase. As a result, each of the capacitance values $C_3$ and $C_4$ continuously decreases. As a result, in the start period T3, the negative resistance value |nR| of the oscillating circuit 10 continuously increases from the second value $|nR_2|$. When the negative resistance value |nR| becomes greater than $R_{Lm}$ and smaller than $R_{Ls}$, the vibrator 3 starts resonance with the main vibration, and an amplitude of a current I_xtal output from the vibrator 3 increases. Then, when the amplitude of the current I_xtal exceeds a predetermined threshold value, a pulse is generated in the oscillation signal CK. Thereafter, the control voltages Vcnt1 and Vcnt2 also increase, and the negative resistance value |nR| is also greater than $R_{Ls}$. However, at this time, the oscillation of the oscillating circuit 10 sufficiently grows by the resonance with the main vibration of the vibrator 3. Accordingly, the resonance with the sub-vibration of the vibrator 3 does not occur. When the control voltages Vcnt1 and Vcnt2 further increase and reach the end value $V_{end}$, each of the capacitance values $C_3$ and $C_4$ becomes a predetermined value, and the negative resistance value |nR| becomes the first value $|nR_1|$. For example, the end value $V_{end}$ may be a voltage value of the frequency control signal input from the VC terminal. Then, the logic circuit changes the output enable signal en_out from the low level to the high level. In this manner, the start period T3 ends, and the normal operation period T4 starts. For example, the start value $V_{start}$ and the end value $V_{end}$ may be written in the non-volatile memory 71 in advance so that the values can be set to any desired value.

In the normal operation period T4, the output enable signal en_out is in a high level. Accordingly, the oscillation signal CK is buffered, and a pulse is generated in the oscillation signal CKO.

In the start period T3, both the capacitance values $C_3$ and $C_4$ are decreased by increasing both the control voltages Vcnt1 and Vcnt2. However, one of the control voltages Vcnt1 and Vcnt2 may be fixed, and the other may be increased. In this manner, one of the capacitance values $C_3$ and $C_4$ may be fixed, and the other may be decreased.

In the example of FIG. 18, the operation mode in the start period T3 is the start mode, and the operation mode in the normal operation period T4 is the normal operation mode. Alternatively, the operation mode in the reset period T1, the memory load period T2, and the start period T3 is the start mode.

Although the sequence is omitted in the illustration, at least one of the control voltages Vcnt1 and Vcnt2 may be continuously increased from the start value $V_{start}$ to the end value $V_{end}$ in the start period T3, and thereafter, may be continuously changed from the end value $V_{end}$ to a voltage value of the frequency control signal input from the VC terminal. For example, the minimum value and the maximum value within a variable range of the control voltages Vcnt1 and Vcnt2 may be set to the start value $V_{start}$ and the end value $V_{end}$, respectively.

The flowchart illustrating the procedure of the method for controlling the oscillator circuit 2 in the third embodiment is the same as that in FIG. 12. Accordingly, illustration and description thereof will be omitted. However, in the third embodiment, the procedure of the start step S3 in FIG. 12 is different from that of each of the above-described embodiments.

Figure 19:
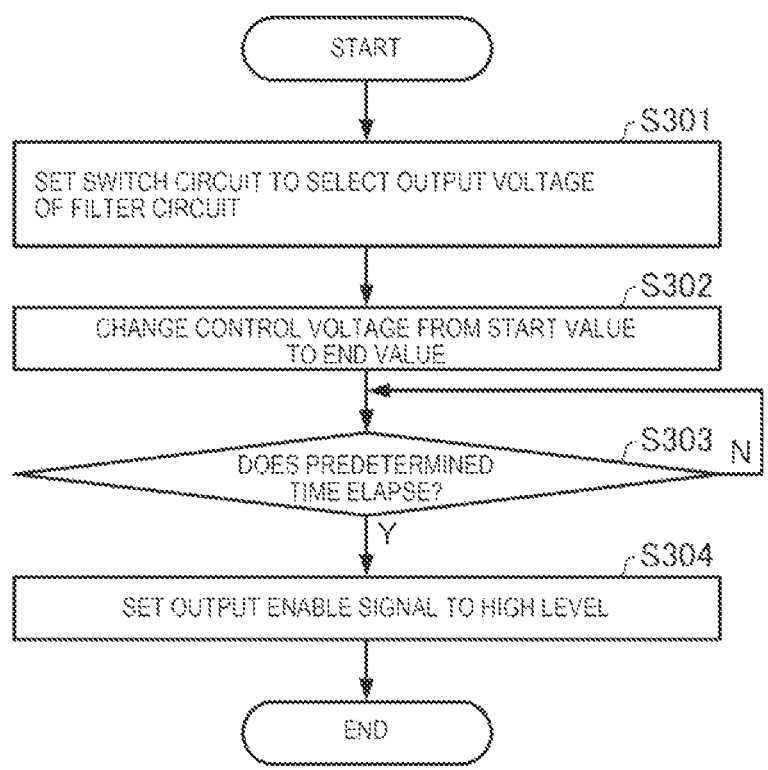
FIG. 19 is a flowchart illustrating an example of a procedure of a start step according to the third embodiment.

FIG. 19 is a flowchart illustrating an example of the procedure of the start step S3 in FIG. 12 in the third embodiment. The procedure illustrated in FIG. 19 corresponds to an operation of the start period T3 in FIG. 18. As illustrated in FIG. 19, in Step S301, the logic circuit 42 first sets the switch circuits 220 and 240 of the voltage control circuit 41 to select output voltages of the filter circuits 210 and 230.

Next, in Step S302, the logic circuit 42 controls the control voltage generation circuit 200 of the voltage control circuit 41 to change the control voltages Vcnt1X and Vcnt2X from the start value $V_{start}$ to the end value $V_{end}$. In this manner, the control voltages Vcnt1 and Vcnt2 are continuously changed from the start value to the end value.

Then, when a predetermined time elapses in the Step S303, the logic circuit 42 sets the output enable signal en_out to a high level in Step S304, and the start step S3 ends. For example, the predetermined time is longer than a time during which the control voltages Vcnt1 and Vcnt2 are changed from the start value $V_{start}$ to the end value and is appropriately determined, based on time constants of the filter circuits 210 and 230.

The logic circuit 42 may fix one of the control voltages Vcnt1X and Vcnt2X and may change the other value. In this manner, one of the capacitance values $C_1$ and $C_2$ may be fixed, and the other may be decreased.

In the oscillator 1 of the third embodiment described above, in the start mode, the capacitance values $C_3$ and $C_4$ of the variable capacitance circuits 16 and 17 are decreased so that the negative resistance value |nR| of the oscillating circuit 10 continuously and gradually increases from the second value $|nR_2|$. Accordingly, a time during which the negative resistance value |nR| becomes a value greater than the load series resistance value $R_{Lm}$ when the vibrator 3 resonates with the main vibration and smaller than the load series resistance value $R_{Ls}$ when the vibrator 3 resonates with the sub-vibration is further lengthened. Therefore, the oscillation based on the resonance with the main vibration of the vibrator 3 grows before the oscillation based on the resonance with the sub-vibration of the vibrator 3. Therefore, according to the oscillator 1 of the third embodiment, a possibility of abnormal oscillation can be reduced even when the characteristics of the vibrator 3 vary.

In addition, according to the oscillator 1 of the third embodiment, the variable capacitance circuits 16 and 17 for changing the oscillation frequency of the oscillating circuit 10 by the frequency control signal input from the external terminal VC1 in the normal operation mode can also be used to increase the negative resistance value |nR| of the oscillating circuit 10 in the start mode.

4. Fourth Embodiment

Hereinafter, with regard to the oscillator 1 of a fourth embodiment, the same reference numerals will be assigned to configurations the same as those of any one of the above-described embodiments, and description the same as that of any one of the above-described embodiments will be omitted or simplified. Contents different from those of any one of the above-described embodiments will be mainly described.

Configurations of the oscillator 1 of the fourth embodiment are the same as those in FIGS. 1 to 4. Accordingly, illustration and description thereof will be omitted. In addition, a configuration of the oscillating circuit 10 in the fourth embodiment is the same as that in FIG. 5. Accordingly, illustration and description thereof will be omitted. The oscillator 1 of the fourth embodiment has an operation in the start mode which is different from that of the oscillator 1 of each of the above-described embodiments.

In the fourth embodiment, in the start mode, the logic circuit 42 of the control circuit 40 increases the value of the oscillation stage current Iosc, and decreases at least one of the capacitance values $C_1$ and $C_2$ of the variable capacitance circuits 14 and 15 so that the negative resistance value |nR| increases from the second value $|nR_2|$. For example, in the start mode, the logic circuit 42 may increase the value of the oscillation stage current Iosc from a third value to a fourth value greater than the third value without changing the capacitance values $C_1$ and $C_2$ of the variable capacitance circuits 14 and 15, and may repeatedly perform control for decreasing at least one of the capacitance values $C_1$ and $C_2$ and changing the value of the oscillation stage current Iosc to the third value. For example, in the start mode, the logic circuit 42 first holds at least one value of the capacitance adjustment data trimC1[4:0] and trimC2[4:0] output to the oscillating circuit 10 at the start value, changes the value of the current adjustment data trimI[4:0] output to the oscillating circuit 10 from the start value to the end value, and increases the value of the oscillation stage current Iosc in a stepwise manner from the third value to the fourth value. In this manner, the logic circuit 42 controls the negative resistance value |nR| to increase in a stepwise manner. Next, the logic circuit 42 changes the value of the current adjustment data trimI[4:0] to the start value, and thereafter, changes and holds at least one of the capacitance adjustment data trimC1[4:0] and trimC2[4:0]. In this manner, the logic circuit 42 decreases at least one of the capacitance values $C_1$ and $C_2$ by one stage, changes the value of the current adjustment data trimI[4:0] from the start value to the end value, and increases the value of the oscillation stage current Iosc in a stepwise manner from the third value to the fourth value. In this manner, the logic circuit 42 controls the negative resistance value |nR| to increase in a stepwise manner. The logic circuit 42 repeatedly performs the same control while changing at least one value of the capacitance adjustment data trimC1[4:0] and trimC2[4:0]. Finally, the logic circuit 42 changes the value of the current adjustment data trimI[4:0] to the start value, and thereafter, changes and holds at least one value of the capacitance adjustment data trimC1[4:0] and trimC2[4:0] at the end value. In this manner, the logic circuit 42 decreases the capacitance values $C_1$ and $C_2$ by one stage, changes the value of the current adjustment data trimI[4:0] from the start value to the end value, and increases the value of the oscillation stage current Iosc in a stepwise manner from the third value to the fourth value. In this manner, the logic circuit 42 controls the negative resistance value |nR| to increase in a stepwise manner.

Other configurations of the oscillator 1 of the fourth embodiment are the same as those of each of the above-described embodiments. Accordingly, illustration and description thereof will be omitted.

Figure 20:
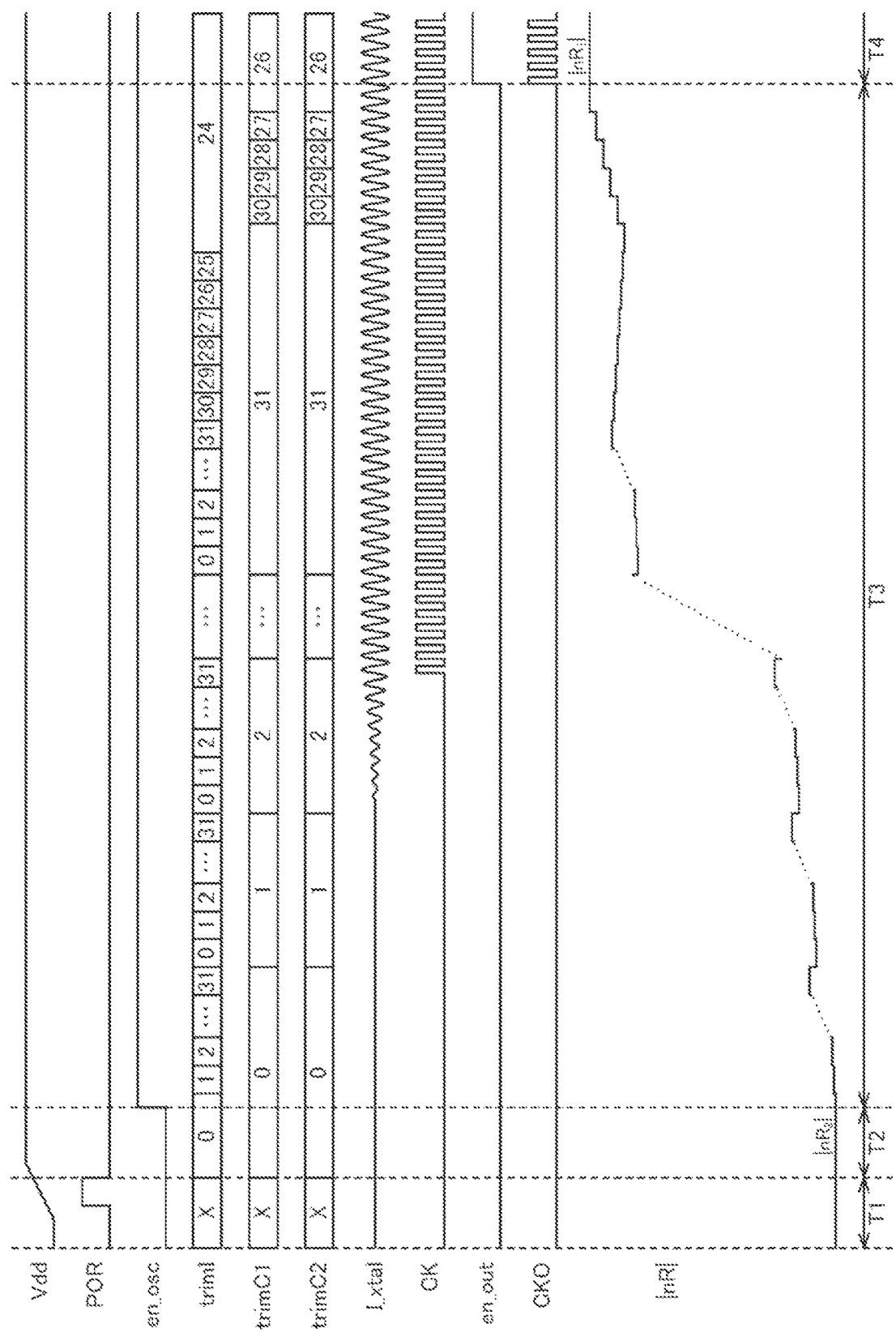
FIG. 20 is a waveform chart illustrating an example of a sequence according to a fourth embodiment.

FIG. 20 is a waveform chart illustrating another example of a sequence in which a state where the power is supplied to the oscillator circuit 2 is shifted to the normal operation mode in the fourth embodiment. In the example of FIG. 20, when the power is supplied to the oscillator 1, the reset period T1 starts, the power supply voltage Vdd rises from 0 V to a predetermined voltage value, the power-on reset signal POR is changed from a low level to a high level, and the logic circuit 42 is initialized. Thereafter, when the power-on reset signal POR is changed from the high level to the low level, the reset period T1 ends, and a memory load period T2 starts.

In the memory load period T2, various information stored in the non-volatile memory 71 is transferred to the register 72. After the transfer ends, the logic circuit 42 changes the oscillation enable signal en_osc from the low level to the high level. In this manner, the memory load period T2 ends, and a start period T3 starts.

In the start period T3, the logic circuit 42 first sets and holds each of the capacitance adjustment data trimC1[4:0] and trimC2[4:0] at the start value, and gradually increases the current adjustment data trimI[4:0] by any desired value from the start value to the end value. As a result, the value of the oscillation stage current Iosc is gradually increased. For example, the start value of the capacitance adjustment data trimC1[4:0] and trimC2[4:0], and the start value or the end value of the current adjustment data trimI[4:0] may be written in the non-volatile memory 71 in advance so that the values can be set to any desired value. In the example of FIG. 20, the logic circuit 42 sets and holds each of the capacitance adjustment data trimC1[4:0] and trimC2[4:0] at 0 of the start value, and gradually increases the current adjustment data trimI[4:0] by 1 from 0 of the start value to 31 of the end value. As a result, in a state where each of the capacitance values $C_1$ and $C_2$ is $31C_0$, the oscillation stage current Iosc increases in a stepwise manner from $I_b$ which is the third value to $I_b+31I_0$ which is the fourth value, and the negative resistance value |nR| of the oscillating circuit 10 increases in a stepwise manner from the second value |nR$_2$|.

Next, the logic circuit 42 changes the current adjustment data trimI[4:0] to 0 of the start value, and thereafter, increases each value of the capacitance adjustment data trimC1[4:0] and trimC2[4:0] by any desired value. In the example of FIG. 20, each value of the capacitance adjustment data trimC1[4:0] and trimC2[4:0] is set and held at 1 which is a value increased by 1 from 0, and the current adjustment data trimI[4:0] is gradually increased again by 1 from 0 of the start value to 31 of the end value. As a result, in a state where each of the capacitance values $C_1$ and $C_2$ is decreased to $30C_0$, the oscillation stage current Iosc increases in a stepwise manner from $I_b$ which is the third value to $I_b+31I_0$ which is the fourth value, and the negative resistance value |nR| of the oscillating circuit 10 increases in a stepwise manner.

Next, the logic circuit 42 changes the current adjustment data trimI[4:0] to 0 of the start value, and thereafter, increases each value of the capacitance adjustment data trimC1[4:0] and trimC2[4:0] by any desired value. In the example of FIG. 20, each value of the capacitance adjustment data trimC1[4:0] and trimC2[4:0] is set and held at 2 which is a value increased by 1 from 1, and gradually increases the current adjustment data trimI[4:0] again by 1 from 0 of the start value to 31 of the end value. As a result, in a state where each of the capacitance values $C_1$ and $C_2$ is decreased to $29C_0$, the oscillation stage current Iosc increases in a stepwise manner from $I_b$ which is the third value to $I_b+31I_0$ which is the fourth value, and the negative resistance value |nR| of the oscillating circuit 10 increases in a stepwise manner. When the negative resistance value |nR| becomes greater than $R_{Lm}$ and smaller than $R_{Ls}$, the vibrator 3 starts resonance with the main vibration, and an amplitude of a current I_xtal output from the vibrator 3 increases. Then, when the amplitude of the current I_xtal exceeds a predetermined threshold value, a pulse is generated in the oscillation signal CK. Thereafter, the capacitance adjustment data trimC1[4:0] and trimC2[4:0] also increase, and the negative resistance value |nR| is also greater than $R_{Ls}$. However, at this time, the oscillation of the oscillating circuit 10 sufficiently grows by the resonance with the main vibration of the vibrator 3. Accordingly, the resonance with the sub-vibration of the vibrator 3 does not occur.

Thereafter, when each value of the capacitance adjustment data trimC1[4:0] and trimC2[4:0] reaches 31 of the end value and the value of the current adjustment data trimI[4:0] reaches 31 of the end value, the logic circuit 42 gradually changes the value of the current adjustment data trimI[4:0] by any desired value from the end value to the setting value in the normal operation mode. For example, the end value of the capacitance adjustment data trimC1[4:0] and trimC2[4:0] may be written in the non-volatile memory 71 in advance so that the value can be set to any desired value. In the example of FIG. 20, the logic circuit 42 gradually decreases the value of the current adjustment data trimI[4:0] by 1 from 31 of the end value. Then, when the value of the current adjustment data trimI[4:0] reaches 24 which is a value transferred to the register 72 in the memory load period T2, the logic circuit 42 holds the value of the current adjustment data trimI[4:0] at 24, and the value of the oscillation stage current Iosc becomes $I_b+24I_0$. Furthermore, the logic circuit 42 gradually changes each value of the capacitance adjustment data trimC1[4:0] and trimC2[4:0] by any desired value from the end value to the setting value in the normal operation mode. In the example of FIG. 20, the logic circuit 42 gradually decreases each value of the capacitance adjustment data trimC1[4:0] and trimC2[4:0] by 1 from 31 of the end value. Then, when each value of the capacitance adjustment data trimC1[4:0] and trimC2[4:0] reaches 26 which is the value transferred to the register 72 in the memory load period T2, the logic circuit 42 holds each value of the capacitance adjustment data trimC1[4:0] and trimC2[4:0] at 26, and each of the capacitance values $C_1$ and $C_2$ becomes $5C_0$. The value of the oscillation stage current Iosc becomes $I_b+24I_0$, and each of the capacitance values $C_1$ and $C_2$ becomes $5C_0$. In this manner, the negative resistance value |nR| becomes the first value |nR$_1$|. Then, the logic circuit 42 changes the output enable signal en_out from the low level to the high level. In this manner, the start period T3 ends, and the normal operation period T4 starts.

In the normal operation period T4, the output enable signal en_out is in a high level. Accordingly, the oscillation signal CK is buffered, and a pulse is generated in the oscillation signal CKO.

In the start period T3, both the capacitance values $C_1$ and $C_2$ are decreased by increasing both the capacitance adjustment data trimC1[4:0] and trimC2[4:0]. However, one of the capacitance adjustment data trimC1[4:0] and trimC2[4:0] may be fixed, and the other may be increased. In this manner, one of the capacitance values $C_1$ and $C_2$ may be fixed, and the other may be decreased.

In the example of FIG. 20, the operation mode in the start period T3 is the start mode, and the operation mode in the normal operation period T4 is the normal operation mode. Alternatively, the operation mode in the reset period T1, the memory load period T2, and the start period T3 is the start mode.

Although the sequence is omitted in the illustration, in order to shorten the start period T3, the logic circuit 42 may decrease the value of the current adjustment data trimI[4:0] to the setting value in the normal operation mode when each value of the capacitance adjustment data trimC1[4:0] and trimC2[4:0] reaches the any desired set end value and the value of the current adjustment data trimI[4:0] reaches the end value, and the start period T3 may end. For example, the end value of the capacitance adjustment data trimC1[4:0] and trimC2[4:0] may be the setting value in the normal operation mode.

The flowchart illustrating the procedure of the method for controlling the oscillator circuit 2 in the fourth embodiment is the same as that in FIG. 12. Accordingly, illustration and description thereof will be omitted. However, in the fourth embodiment, the procedure of the start step S3 in FIG. 12 is different from that of each of the above-described embodiments.

Figure 21:
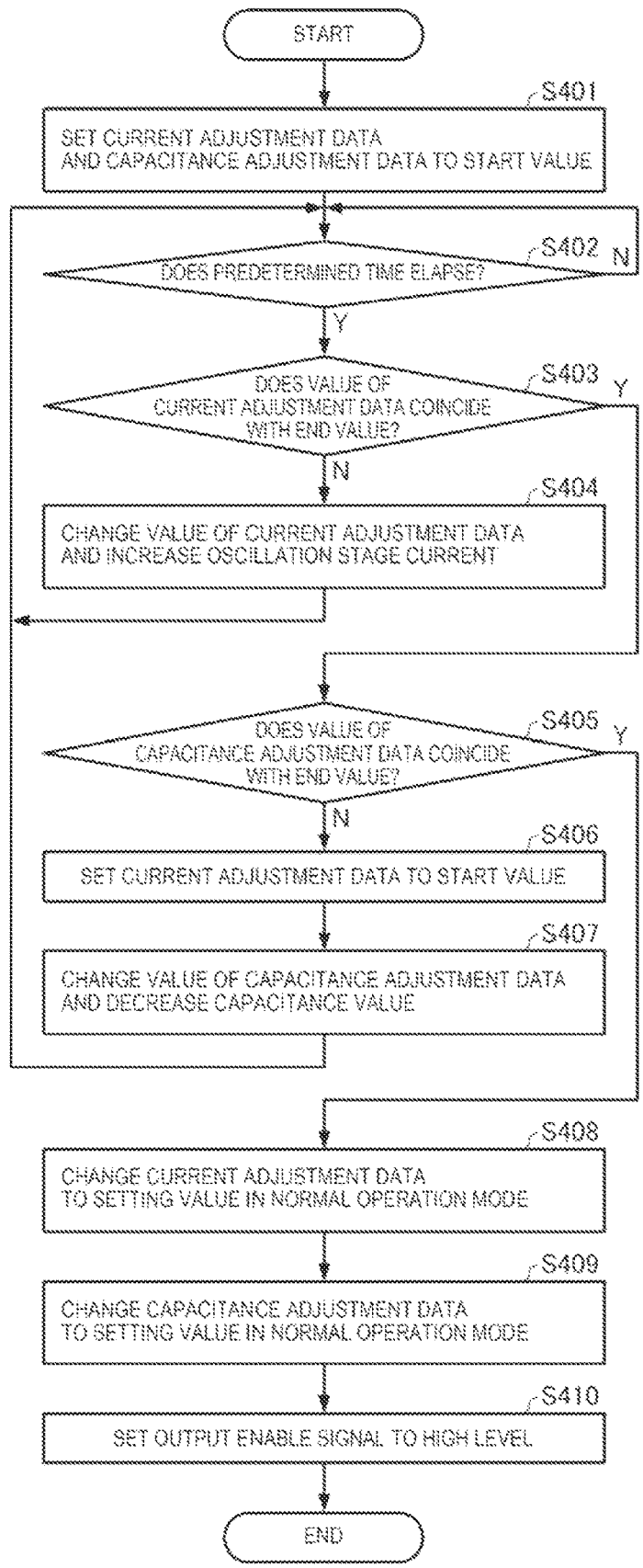
FIG. 21 is a flowchart illustrating an example of a procedure of a start step according to the fourth embodiment.

FIG. 21 is a flowchart illustrating an example of the procedure of the start step S3 in FIG. 12 in the fourth embodiment. The procedure illustrated in FIG. 21 corresponds to an operation of the start period T3 in FIG. 20. As illustrated in FIG. 21, in Step S401, the logic circuit 42 first sets the current adjustment data trimI[4:0] and the capacitance adjustment data trimC1[4:0] and trimC2[4:0] to the start value. In the example of FIG. 20, the start value of the current adjustment data trimI[4:0] is 0, and the start value of the capacitance adjustment data trimC1[4:0] and trimC2[4:0] is 0. Since the current adjustment data trimI[4:0] and the capacitance adjustment data trimC1[4:0] and trimC2[4:0] are set to the start value, the negative resistance value |nR| of the oscillating circuit 10 becomes the second value |nR$_2$|.

Next, when a predetermined time elapses in Step S402, the logic circuit 42 determines in Step S403 whether or not the value of the current adjustment data trimI[4:0] coincides with the end value. In the example of FIG. 20, the end value of the current adjustment data trimI[4:0] is 31.

When the value of the current adjustment data trimI[4:0] does not coincide with the end value in Step S403, the logic circuit 42 changes the value of the current adjustment data trimI[4:0] in step S404, and increases the oscillation stage current Iosc.

Steps S402, S403, and S404 are repeatedly performed until the value of the current adjustment data trimI[4:0] coincides with the end value. When the value of the current adjustment data trimI[4:0] coincides with the end value, the logic circuit 42 determines in Step S405 whether or not each value of the capacitance adjustment data trimC1[4:0] and trimC2[4:0] coincides with the end value. In the example of FIG. 20, the end values of the capacitance adjustment data trimC1[4:0] and trimC2[4:0] are both 31.

When the value of the capacitance adjustment data trimC1[4:0] and trimC2[4:0] does not coincide with the end value in Step S405, the logic circuit 42 sets the current adjustment data trimI[4:0] to the start value in Step S406. In addition, in Step S407, the logic circuit 42 changes the value of the capacitance adjustment data trimC1[4:0] and trimC2[4:0], and decreases each of the capacitance values $C_1$ and $C_2$.

Steps S402, S403, S404, S405, S406, and S407 are repeatedly performed until the value of the capacitance adjustment data trimC1[4:0] and trimC2[4:0] coincides with the end value. When the value of the capacitance adjustment data trimC1[4:0] and trimC2[4:0] coincides with the end value, in Step S408, the logic circuit 42 changes the current adjustment data trimI[4:0] to the setting value in the normal operation mode. Furthermore, in Step S409, the logic circuit 42 changes the capacitance adjustment data trimC1[4:0] and trimC2[4:0] to the setting value in the normal operation mode.

Then, in Step S410, the logic circuit 42 sets the output enable signal en_out to a high level, and the start step S3 ends.

The logic circuit 42 may fix one value of the capacitance adjustment data trimC1[4:0] and trimC2[4:0], and may change the other value. In this manner, one of the capacitance values $C_1$ and $C_2$ may be fixed, and the other may be decreased.

In the oscillator 1 of the fourth embodiment described above, in the start mode, the value of the oscillation stage current Iosc is increased, and the capacitance values $C_1$ and $C_2$ of the variable capacitance circuits 14 and 15 are decreased. In this manner, the negative resistance value |nR| of the oscillating circuit 10 gradually increases in a stepwise manner from the second value |nR$_2$|. Accordingly, a time during which the negative resistance value |nR| becomes a value greater than the load series resistance value $R_{Lm}$ when the vibrator 3 resonates with the main vibration and smaller than the load series resistance value $R_{Ls}$ when the vibrator 3 resonates with the sub-vibration is further lengthened. Therefore, the oscillation based on the resonance with the main vibration of the vibrator 3 grows before the oscillation based on the resonance with the sub-vibration of the vibrator 3. Therefore, according to the oscillator 1 of the fourth embodiment, a possibility of abnormal oscillation can be reduced even when the characteristics of the vibrator 3 vary.

In particular, in the oscillator 1 of the fourth embodiment, while the logic circuit 42 changes the capacitance values $C_1$ and $C_2$ of the variable capacitance circuits 14 and 15, the logic circuit 42 repeatedly performs control for increasing the value of the oscillation stage current Iosc from the third value to the fourth value. Therefore, according to the oscillator 1 of the fourth embodiment, it is possible to reduce a possibility that the oscillating circuit 10 may not oscillate since the capacitance values $C_1$ and $C_2$ of the variable capacitance circuits 14 and 15 are excessively great, or the value of the oscillation stage current Iosc is excessively small. In addition, the logic circuit 42 increases the value of the oscillation stage current Iosc from the third value to the fourth value, and thereafter, changes the value of the oscillation stage current Iosc to the third value before decreasing the capacitance values $C_1$ and $C_2$. In this manner, it is possible to reduce a possibility that the vibrator 3 may resonate with the sub-vibration since the negative resistance value |nR| suddenly increases when the capacitance values $C_1$ and $C_2$ are decreased.

In addition, according to the oscillator 1 of the fourth embodiment, the variable current source 12 for setting the oscillation stage current Iosc to a desired value corresponding to the resonance frequency of the vibrator 3 in the normal operation mode, and the variable capacitance circuits 14 and 15 for setting the oscillation frequency of the oscillating circuit 10 to the target frequency can also be used to increase the negative resistance value |nR| of the oscillating circuit 10 in the start mode.

5. Fifth Embodiment

Hereinafter, with regard to the oscillator 1 of a fifth embodiment, the same reference numerals will be assigned to configurations the same as those of any one of the above-described embodiments, and description the same as that of any one of the above-described embodiments will be omitted or simplified. Contents different from those of any one of the above-described embodiments will be mainly described.

A structure of the oscillator 1 of the fifth embodiment is the same as that in FIGS. 1 to 3. Accordingly, illustration and description thereof will be omitted.

Figure 22:
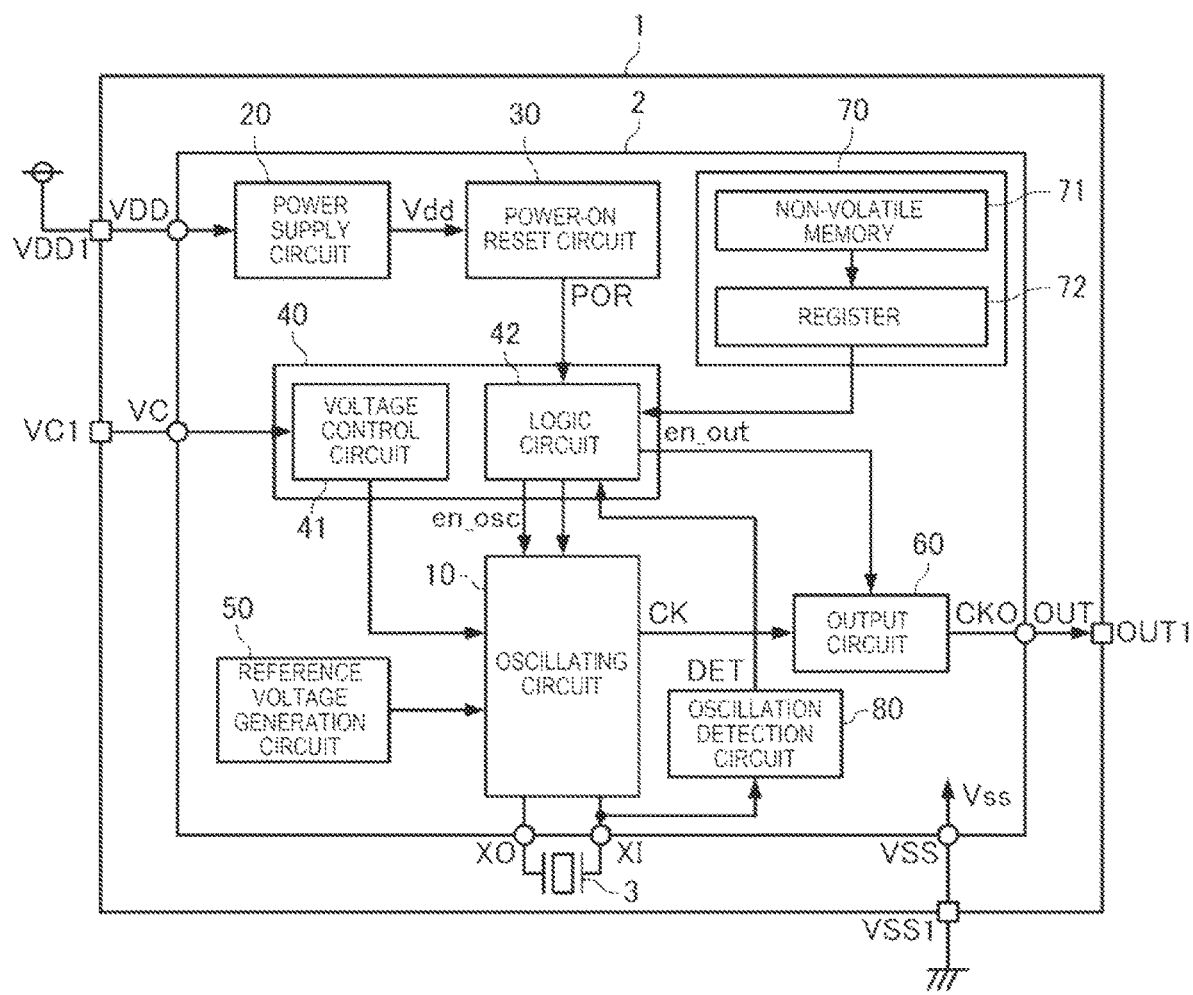
FIG. 22 is a functional block diagram of an oscillator of a fifth embodiment.

FIG. 22 is a functional block diagram of the oscillator 1 of the fifth embodiment. As illustrated in FIG. 22, as in each of the above-described embodiments, the oscillator 1 of the fifth embodiment includes the oscillator circuit 2 and the vibrator 3. As in each of the above-described embodiments, the oscillator circuit 2 includes the oscillating circuit 10, the power supply circuit 20, the power-on reset circuit 30, the control circuit 40, the reference voltage generation circuit 50, the output circuit 60, and the memory circuit 70. However, unlike each of the above-described embodiments, the oscillator circuit 2 further includes an oscillation detection circuit 80. The oscillator circuit 2 may have a configuration in which elements thereof are partially omitted or changed, or other elements are added thereto.

In the start mode, the oscillation detection circuit 80 detects that a signal output from the vibrator 3 has a predetermined or larger amplitude, and outputs a detection signal DET.

The logic circuit 42 of the control circuit 40 sets the negative resistance value |nR| of the oscillating circuit 10 to the first value |nR$_1$|, based on the detection signal DET.

Figure 23:
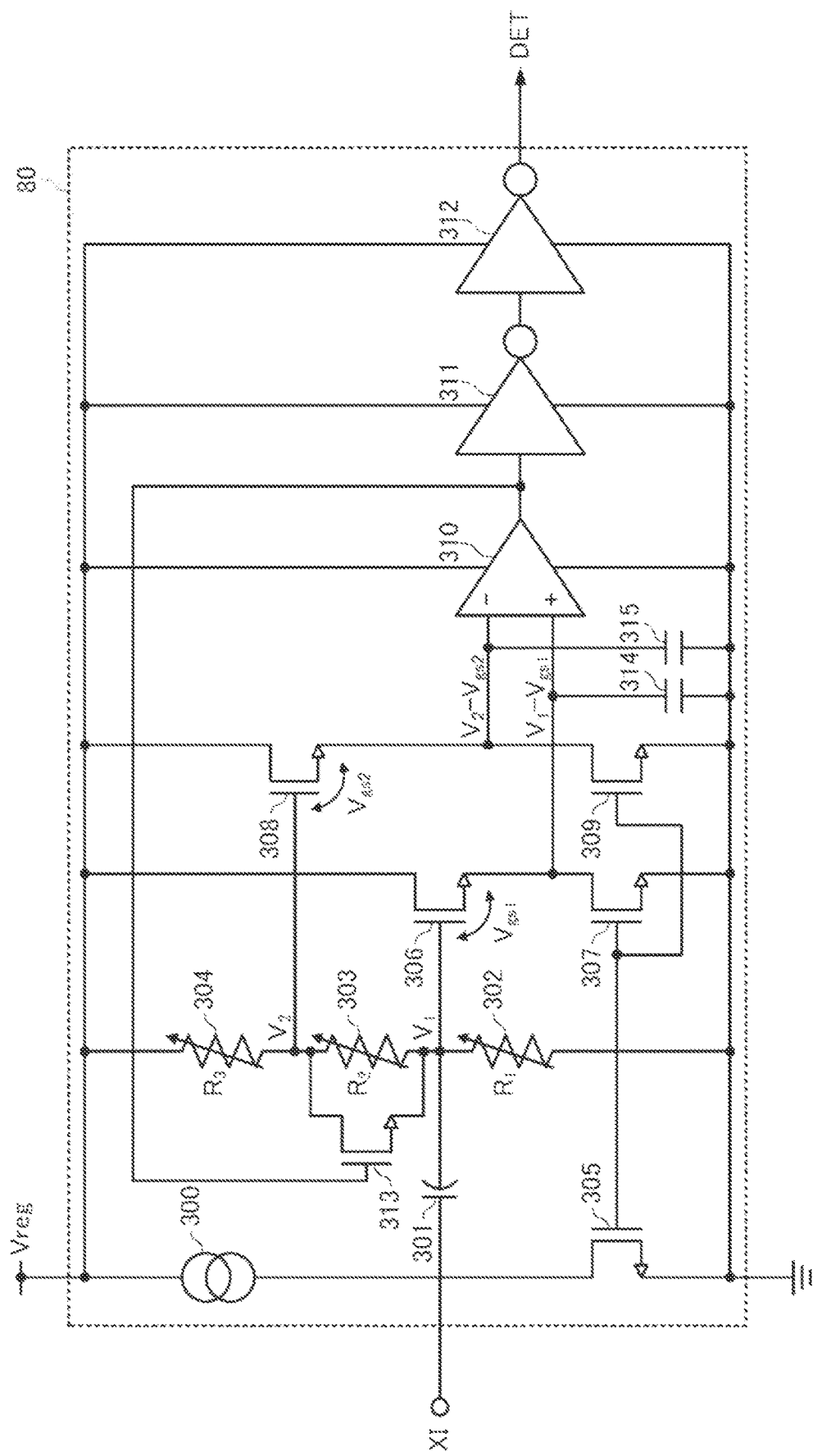
FIG. 23 is a view illustrating a configuration example of an oscillation detection circuit.

FIG. 23 is a view illustrating a configuration example of the oscillation detection circuit 80. In the example of FIG. 23, the oscillation detection circuit 80 includes a current source 300, three capacitance elements 301, 314, and 315, three variable resistors 302, 303, and 304, and six N-channel type MOS transistors 305, 306, 307, 308, 309, and 313, a comparator 310, and two CMOS inverters 311 and 312.

The voltage Vreg is supplied to one end of the current source 300, and the other end is coupled to the drain of the N-channel type MOS transistor 305.

The gate of the N-channel type MOS transistor 305 is coupled to the gate of the N-channel type MOS transistor 307 and the gate of the N-channel type MOS transistor 309, and each source of the N-channel type MOS transistors 305, 307, and 309 is grounded.

The drain of the N-channel type MOS transistor 307 is coupled to the source of the N-channel type MOS transistor 306, and the drain of the N-channel type MOS transistor 309 is coupled to the source of the N-channel type MOS transistor 308.

The voltage Vreg is supplied to one end of the variable resistor 304, and the other end is coupled to one end of the variable resistor 303. The other end of the variable resistor 303 is coupled to one end of the variable resistor 302, and the other end of the variable resistor 302 is grounded.

One end of the capacitance element 301 is coupled to the XI terminal, and the other end is coupled to the other end of the variable resistor 303, one end of the variable resistor 302, and the gate of the N-channel type MOS transistor 306. A signal output from the vibrator 3 is input to the XI terminal.

The gate of the N-channel type MOS transistor 308 is coupled to the other end of the variable resistor 304 and one end of the variable resistor 303, and the voltage Vreg is supplied to each drain of the N-channel type MOS transistors 306 and 308.

In the comparator 310, an inverting input terminal is coupled to the source of the N-channel type MOS transistor 308 and one end of the capacitance element 315, and a non-inverting input terminal is coupled to the source of the N-channel type MOS transistor 306 and one end of the capacitance element 314. The other end of the capacitance element 314 and the other end of the capacitance element 315 are grounded.

The output terminal of the comparator 310 is coupled to the input terminal of the CMOS inverter 311 and the gate of the N-channel type MOS transistor 313, and the output terminal of the CMOS inverter 311 is coupled to the input terminal of the CMOS inverter 312. The source and the drain of the N-channel type MOS transistor 313 are coupled to one end and the other end of the variable resistor 303, respectively.

In the oscillation detection circuit 80 configured in this way, a voltage $V_2$=Vreg×$(R_1+R_2)/(R_1+R_2+R_3)$ divided from the voltage Vreg by the variable resistors 302, 303, and 304 is input to the gate of the N-channel type MOS transistor 306. $R_1$, $R_2$, and $R_3$ are resistance values of the variable resistors 302, 303, and 304, respectively. In addition, a voltage $V_1$ obtained by adding a voltage Vreg×$R_1/(R_1+R_2+R_3)$, which is a voltage divided from the voltage Vreg by the variable resistors 302, 303, and 304, and an AC component, which is obtained by removing a DC component from a signal input from the XI terminal by the capacitance element 301, is input to the gate of the N-channel type MOS transistor 306. Therefore, a voltage $V_2-V_{gs2}$ is input to the inverting input terminal of the comparator 310, and a voltage $V_1-V_{gs1}$ is input to the non-inverting input terminal of the comparator 310. $V_{gs1}$ is a voltage between the gate and the source of the N-channel type MOS transistor 306, and $V_{gs2}$ is a voltage between the gate and the source of the N-channel type MOS transistor 308.

The comparator 310 outputs a low level signal when the voltage $V_1-V_{gs1}$ is lower than the voltage $V_2-V_{gs2}$, and outputs a high level signal when the voltage $V_1-V_{gs1}$ is higher than the voltage $V_2-V_{gs2}$. A logic level of the output signal of the comparator 310 is inverted by the CMOS inverter 311, and the logic level is further inverted by the CMOS inverter 312. Then, the output signal of the CMOS inverter 312 is output to the logic circuit 42 as the detection signal DET. Accordingly, the logic level of the detection signal DET is the same as the logic level of the output signal of the comparator 310. Therefore, the detection signal DET is in a low level when the voltage $V_1-V_{gs1}$ is lower than the voltage $V_2-V_{gs2}$, and the detection signal DET is in a high level when the voltage $V_1-V_{gs1}$ is higher than $V_2-V_{gs2}$. When the start mode starts, the amplitude of the signal output from the vibrator 3 and input from the XI terminal is 0. Accordingly, the voltage $V_1-V_{gs1}$ is lower than the voltage $V_2-V_{gs2}$. Therefore, the detection signal DET is in the low level. As the amplitude of the signal input from the XI terminal increases, a DC level of the voltage $V_1-V_{gs1}$ rises while momentary voltage fluctuations are suppressed by the capacitance elements 314 and 315. When the voltage $V_1-V_{gs1}$ is higher than the voltage $V_2-V_{gs2}$, the output signal of the comparator 310 is changed to the high level, and the detection signal DET is also changed to the high level. When the detection signal DET is changed from the low level to the high level, the logic circuit 42 sets the negative resistance value |nR| of the oscillating circuit 10 to the first value |nR$_1$|. In addition, when the output signal of the comparator 310 is changed to the high level, the drain and the source of the N-channel type MOS transistor 313 are conductive, and there is no longer difference between the voltage $V_1$ and the voltage $V_2$. The output signal of the comparator 310 maintains the high level, and the detection signal DET also maintains the high level.

According to the oscillation detection circuit 80, the voltages $V_1$ and $V_2$ are not determined by absolute values of the variable resistors 302, 303, and 304 or absolute values of resistance values $R_1$, $R_2$, and $R_3$ but determined by ratios. Accordingly, an error of the voltages $V_1$ and $V_2$ which is caused by a manufacturing error of the variable resistors 302, 303, and 304 is small. Therefore, the amplitude of the signal output from the vibrator 3 can be detected with high accuracy.

Other configurations of the oscillator 1 of the fifth embodiment are the same as those of each of the above-described embodiments. Accordingly, illustration and description thereof will be omitted.

Figure 24:
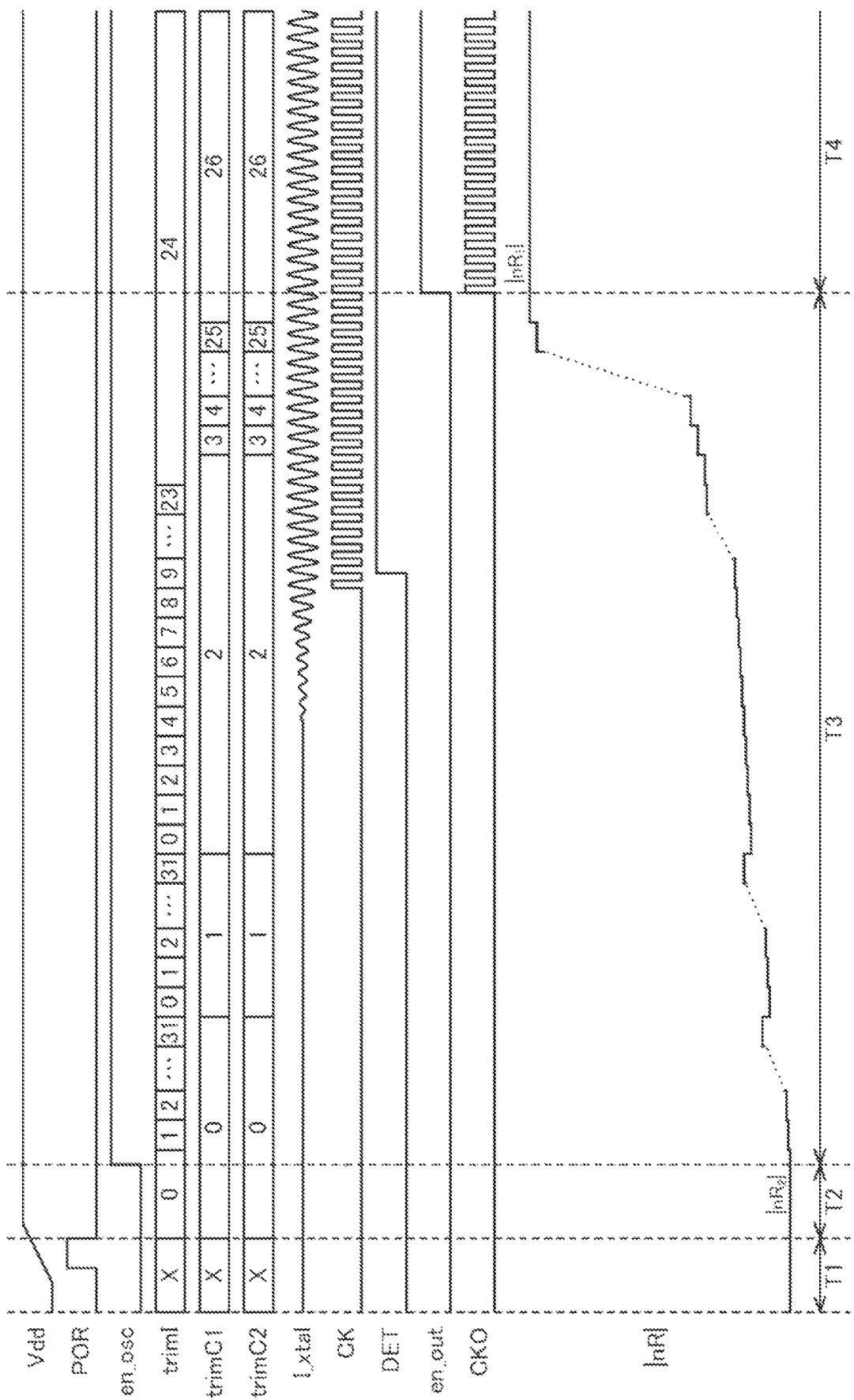
FIG. 24 is a waveform chart illustrating an example of a sequence according to the fifth embodiment.

FIG. 24 is a waveform chart illustrating another example of the sequence in the fifth embodiment in which a state where the power is supplied to the oscillator circuit 2 is shifted to the normal operation mode. In the example of FIG. 24, when the power is supplied to the oscillator 1, the reset period T1 starts, the power supply voltage Vdd rises from 0 V to a predetermined voltage value, the power-on reset signal POR is changed from a low level to a high level, and the logic circuit 42 is initialized. Thereafter, when the power-on reset signal POR is changed from the high level to the low level, the reset period T1 ends, and a memory load period T2 starts.

In the memory load period T2, various information stored in the non-volatile memory 71 is transferred to the register 72. After the transfer ends, the logic circuit 42 changes the oscillation enable signal en_osc from the low level to the high level. In this manner, the memory load period T2 ends, and a start period T3 starts.

In the start period T3, the logic circuit 42 first sets and holds each of the capacitance adjustment data trimC1[4:0] and trimC2[4:0] at the start value, and gradually increases the current adjustment data trimI[4:0] by any desired value from the start value to the end value. As a result, the value of the oscillation stage current Iosc gradually increases. For example, the start value of the capacitance adjustment data trimC1[4:0] and trimC2[4:0], and the start value or the end value of the current adjustment data trimI[4:0] may be written in the non-volatile memory 71 in advance so that the values can be set to any desired value. In the example of FIG. 24, the logic circuit 42 sets and holds each of the capacitance adjustment data trimC1[4:0] and trimC2[4:0] at 0 of the start value, and gradually increases the current adjustment data trimI[4:0] by 1 from 0 of the start value to 31 of the end value. As a result, in a state where each of the capacitance values $C_1$ and $C_2$ is $31C_0$, the oscillation stage current Iosc increases in a stepwise manner from $I_b$ which is the third value to $I_b+31I_0$ which is the fourth value, and the negative resistance value |nR| of the oscillating circuit 10 increases in a stepwise manner from the second value $|nR_2|$.

Next, the logic circuit 42 changes the current adjustment data trimI[4:0] to 0 of the start value, and thereafter, increases each value of the capacitance adjustment data trimC1[4:0] and trimC2[4:0] by any desired value. In the example of FIG. 24, each value of the capacitance adjustment data trimC1[4:0] and trimC2[4:0] is set and held at 1 which is a value increased by 1 from 0, and the current adjustment data trimI[4:0] is gradually increased again by 1 from 0 of the start value to 31 of the end value. As a result, in a state where each of the capacitance values $C_1$ and $C_2$ is decreased to $30C_0$, the oscillation stage current Iosc increases in a stepwise manner from $I_b$ which is the third value to $I_b+31I_0$ which is the fourth value, and the negative resistance value |nR| of the oscillating circuit 10 increases in a stepwise manner.

Next, the logic circuit 42 changes the current adjustment data trimI[4:0] to 0 of the start value, and thereafter, increases each value of the capacitance adjustment data trimC1[4:0] and trimC2[4:0] by any desired value. In the example of FIG. 24, each value of the capacitance adjustment data trimC1[4:0] and trimC2[4:0] is set and held at 2 which is a value increased by 1 from 1, and the current adjustment data trimI[4:0] is gradually increased again by 1 from 0 of the start value to 31 of the end value. As a result, in a state where each of the capacitance values $C_1$ and $C_2$ is decreased to $29C_0$, the oscillation stage current Iosc increases in a stepwise manner from $I_b$ which is the third value to $I_b+31I_0$ which is the fourth value, and the negative resistance value |nR| of the oscillating circuit 10 increases in a stepwise manner. When the negative resistance value |nR| becomes greater than $R_{Lm}$ and smaller than $R_{Ls}$, the vibrator 3 starts resonance with the main vibration, and an amplitude of a current I_xtal output from the vibrator 3 increases. Then, when the amplitude of the current I_xtal exceeds a predetermined threshold value, a pulse is generated in the oscillation signal CK. In addition, when the amplitude of the current I_xtal output from the vibrator 3 reaches a predetermined value, for example, when the value of the current adjustment data trimI[4:0] is 9, and the values of the capacitance adjustment data trimC1[4:0] and trimC2[4:0] are both 2, the detection signal DET is changed from the low level to the high level.

Next, the logic circuit 42 receives the detection signal DET in the high level, and gradually changes the value of the current adjustment data trimI[4:0] by any desired value to the setting value in the normal operation mode. In the example of FIG. 24, when the detection signal DET is in the high level, the value of the current adjustment data trimI[4:0] is 9. Accordingly, the logic circuit 42 gradually increases the value of the current adjustment data trimI[4:0] by 1 from 9. Then, when the value of the current adjustment data trimI[4:0] reaches 24 which is a value transferred to the register 72 in the memory load period T2, the logic circuit 42 holds the value of the current adjustment data trimI[4:0] at 24, and the value of the oscillation stage current Iosc becomes $I_b+24I_0$. Furthermore, the logic circuit 42 gradually changes each value of the capacitance adjustment data trimC1[4:0] and trimC2[4:0] by any desired value to the setting value in the normal operation mode. In the example of FIG. 24, when the detection signal DET is in the high level, each value of the capacitance adjustment data trimC1[4:0] and trimC2[4:0] is 2. Accordingly, the logic circuit 42 gradually increases each value of the capacitance adjustment data trimC1[4:0] and trimC2[4:0] by 1 from 2. Then, when each value of the capacitance adjustment data trimC1[4:0] and trimC2[4:0] reaches 26 which is the value transferred to the register 72 in the memory load period T2, the logic circuit 42 holds each value of the capacitance adjustment data trimC1[4:0] and trimC2[4:0] at 26, and each of the capacitance values $C_1$ and $C_2$ becomes $5C_0$. The value of the oscillation stage current Iosc becomes $I_b+24I_0$, and each of the capacitance values $C_1$ and $C_2$ becomes $5C_0$. In this manner, the negative resistance value |nR| becomes the first value $|nR_1|$. The negative resistance value |nR| becomes greater than $R_{Ls}$ until the negative resistance value |nR| becomes the first value $|nR_1|$. However, at this time, the oscillation of the oscillating circuit 10 sufficiently grows by the resonance with the main vibration of the vibrator 3. Accordingly, the resonance with the sub-vibration of the vibrator 3 does not occur. Then, the logic circuit 42 changes the output enable signal en_out from the low level to the high level. In this manner, the start period T3 ends, and the normal operation period T4 starts.

In the normal operation period T4, the output enable signal en_out is in the high level. Accordingly, the oscillation signal CK is buffered, and a pulse is generated in the oscillation signal CKO.

In the start period T3, both the capacitance values $C_1$ and $C_2$ are decreased by increasing both the capacitance adjustment data trimC1[4:0] and trimC2[4:0]. However, one of the capacitance adjustment data trimC1[4:0] and trimC2[4:0]

may be fixed, and the other may be increased. In this manner, one of the capacitance values $C_1$ and $C_2$ may be fixed, and the other may be decreased.

In the example of FIG. 24, the operation mode in the start period T3 is the start mode, and the operation mode in the normal operation period T4 is the normal operation mode. Alternatively, the operation mode in the reset period T1, the memory load period T2, and the start period T3 is the start mode.

The flowchart illustrating the procedure of the method for controlling the oscillator circuit 2 in the fifth embodiment is the same as that in FIG. 12. Accordingly, illustration and description thereof will be omitted. However, in the fifth embodiment, the procedure of the start step S3 in FIG. 12 is different from that of each of the above-described embodiments.

Figure 25:
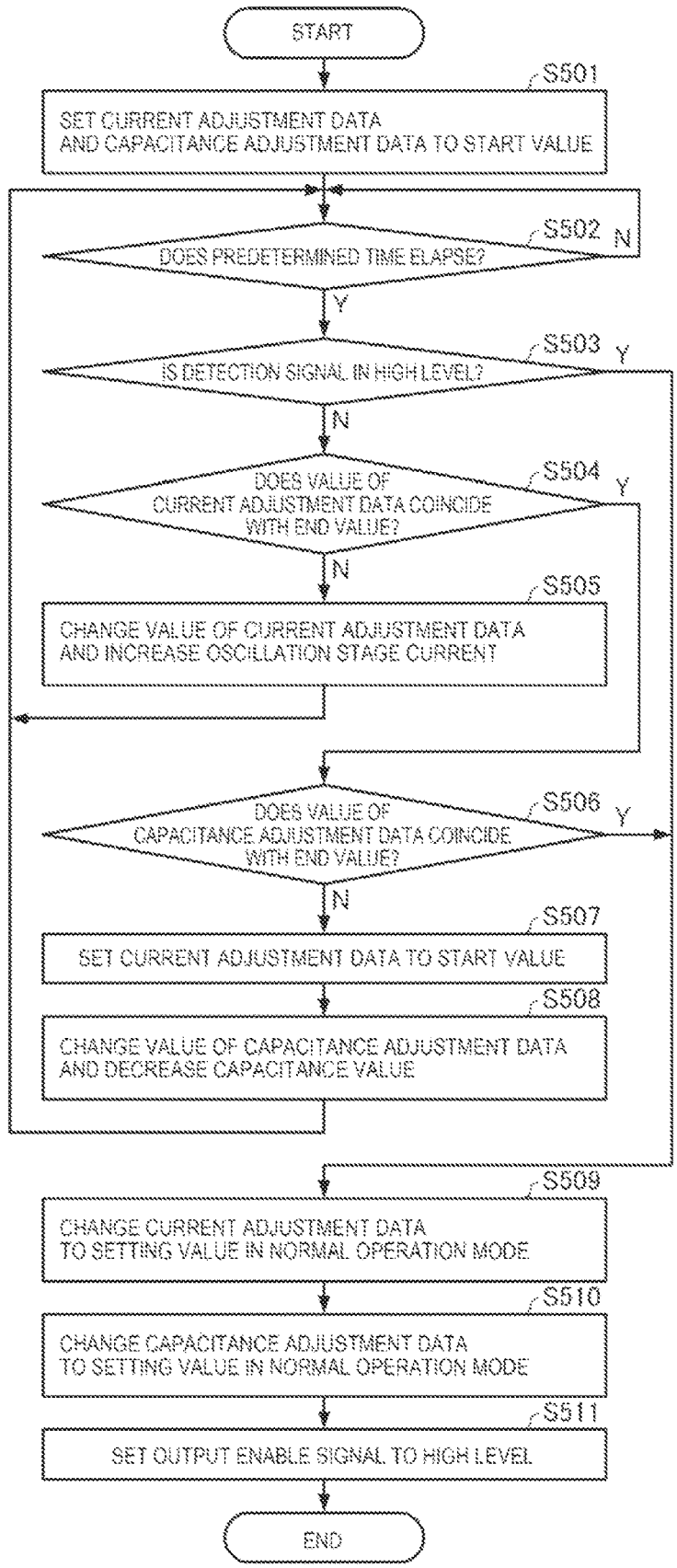
FIG. 25 is a flowchart illustrating an example of a procedure of a start step according to the fifth embodiment.

FIG. 25 is a flowchart illustrating an example of the procedure of the start step S3 in FIG. 12 in the fifth embodiment. The procedure illustrated in FIG. 25 corresponds to an operation of the start period T3 in FIG. 24. As illustrated in FIG. 25, in Step S501, the logic circuit 42 first sets the current adjustment data trimI[4:0] and the capacitance adjustment data trimC1[4:0] and trimC2[4:0] to the start value. In the example of FIG. 24, the start value of the current adjustment data trimI[4:0] is 0, and the start value of the capacitance adjustment data trimC1[4:0] and trimC2[4:0] is 0. Since the current adjustment data trimI[4:0] and the capacitance adjustment data trimC1[4:0] and trimC2[4:0] are set to the start value, the negative resistance value |nR| of the oscillating circuit 10 becomes the second value $|nR_2|$.

Next, when a predetermined time elapses in Step S502, and when the detection signal DET is in the low level in Step S503, the logic circuit 42 determines in Step S504 whether or not the value of the current adjustment data trimI[4:0] coincides with the end value. In the example of FIG. 24, the end value of the current adjustment data trimI[4:0] is 31.

When the value of the current adjustment data trimI[4:0] does not coincide with the end value in Step S504, the logic circuit 42 changes the value of the current adjustment data trimI[4:0] in Step S505, and increases the oscillation stage current Iosc.

As long as the detection signal DET is in the low level in Step S503, Steps S502, S504, and S505 are repeatedly performed until the value of the current adjustment data trimI[4:0] coincides with the end value. When the value of the current adjustment data trimI[4:0] coincides with the end value, the logic circuit 42 determines in Step S506 whether or not each value of the capacitance adjustment data trimC1[4:0] and trimC2[4:0] coincides with the end value. In the example of FIG. 24, the end values of the capacitance adjustment data trimC1[4:0] and trimC2[4:0] are both 31.

When the value of the capacitance adjustment data trimC1[4:0] and trimC2[4:0] does not coincide with the end value in Step S506, the logic circuit 42 sets the current adjustment data trimI[4:0] to the start value in Step S507. In addition, in Step S508, the logic circuit 42 changes the value of the capacitance adjustment data trimC1[4:0] and trimC2[4:0], and decreases each of the capacitance values $C_1$ and $C_2$.

As long as the detection signal DET is in the low level in Step S503, Steps S502, S504, S505, S506, S507, and S508 are repeatedly performed until the value of the capacitance adjustment data trimC1[4:0] and trimC2[4:0] coincides with the end value.

When the detection signal DET is in the high level in Step S503, or when the value of the capacitance adjustment data trimC1[4:0] and trimC2[4:0] coincides with the end value in Step S506, in Step S509, the logic circuit 42 changes the current adjustment data trimI[4:0] to the setting value in the normal operation mode. In addition, in Step S510, the logic circuit 42 changes the capacitance adjustment data trimC1[4:0] and trimC2[4:0] to the setting value in the normal operation mode.

Then, in Step S511, the logic circuit 42 sets the output enable signal en_out to the high level, and the start step S3 ends.

The logic circuit 42 may fix one value of the capacitance adjustment data trimC1[4:0] and trimC2[4:0], and may change the other value. In this manner, one of the capacitance values $C_1$ and $C_2$ may be fixed, and the other may be decreased.

FIGS. 24 and 25 correspond to a sequence and a flowchart when the oscillation detection circuit 80 is added to the oscillator 1 of the fourth embodiment. Although the sequence and the flowchart are omitted in the illustration, the oscillation detection circuit 80 may be added to the oscillator 1 of the first to third embodiments.

In the oscillator 1 of the fifth embodiment described above, in the start mode, when the oscillation detection circuit 80 detects that the signal output from the vibrator 3 has a predetermined or larger amplitude, the negative resistance value |nR| is set to the first value $|nR_1|$ to be shifted to the normal operation mode. Accordingly, a start time can be shortened.

6. Sixth Embodiment

Hereinafter, with regard to the oscillator 1 of a sixth embodiment, the same reference numerals will be assigned to configurations the same as those of any one of the above-described embodiments, and description the same as that of any one of the above-described embodiments will be omitted or simplified. Contents different from those of any one of the above-described embodiments will be mainly described.

Configurations of the oscillator 1 of the sixth embodiment are the same as those in FIGS. 1 to 4. Accordingly, illustration and description thereof will be omitted. In addition, a configuration of the oscillating circuit 10 in the sixth embodiment is the same as that in FIG. 5. Accordingly, illustration and description thereof will be omitted.

In each of the above-described embodiments, in the start mode, the negative resistance value |nR| of the oscillating circuit 10 is controlled, based on control data having weighted multiple bits which is output from the control circuit 40.

For example, according to the first embodiment or the fourth embodiment, in the start mode, the negative resistance value |nR| is controlled by the current adjustment data trimI[4:0] which is the control data in which a larger bit is more weighted. For example, when the logic level of trimI[0] is inverted, the oscillation stage current Iosc increases or decreases by $I_0$. In contrast, when the logic level of trimI[4] is inverted, the oscillation stage current Iosc increases or decreases by $16 \times I_0$. Therefore, for example, when the current adjustment data trimI[4:0] is changed from 15 to 16, if trimI[4] is changed from the high level to the low level before each of trimI[0], trimI[1], trimI[2], and trimI[3] is changed from the high level to the low level, the oscillation stage current Iosc instantaneously increases by $16 \times I_0$. In this manner, when the negative resistance value |nR| becomes greater than the load series resistance value $R_{Ls}$ when the vibrator 3 resonates with the sub-vibration, a risk factor of abnormal oscillation caused by the vibrator 3 resonating with the sub-vibration increases.

In addition, for example, in the second embodiment or the fourth embodiment, in the start mode, the negative resistance value |nR| is controlled by the capacitance adjustment data trimC1[4:0] and trimC2[4:0] which are the control data in which the larger bit is more weighted. For example, when the logic level of trimC1[0] and trimC2[0] is inverted, each of the capacitance values $C_1$ and $C_2$ increases or decreases by $C_0$. In contrast, when the logic level of trimC1[4] and trimC2[4] is inverted, each of the capacitance values $C_1$ and $C_2$ increases or decreases by $16 \times C_0$. Therefore, for example, when the capacitance adjustment data trimC1[4:0] and trimC2[4:0] are changed from 15 to 16, if trimC1[4] is changed from the high level to the low level before each of trimC1[0], trimC1[1], trimC1[2], and trimC1[3] is changed from the high level to the low level, the capacitance value $C_1$ instantaneously increases by $16 \times C_0$. In this manner, when the negative resistance value |nR| becomes greater than the load series resistance value $R_{Ls}$ when the vibrator 3 resonates with the sub-vibration, a risk factor of abnormal oscillation caused by the vibrator 3 resonating with the sub-vibration increases. The same is applied to the capacitance adjustment data trimC2[4:0].

Therefore, in the sixth embodiment, in order to reduce the risk factor of abnormal oscillation, the control circuit 40 is configured as follows. In the control data for controlling the negative resistance value |nR| of the oscillating circuit 10 in the start mode, the logic level of a less weighted bit is changed faster.

Figure 26:
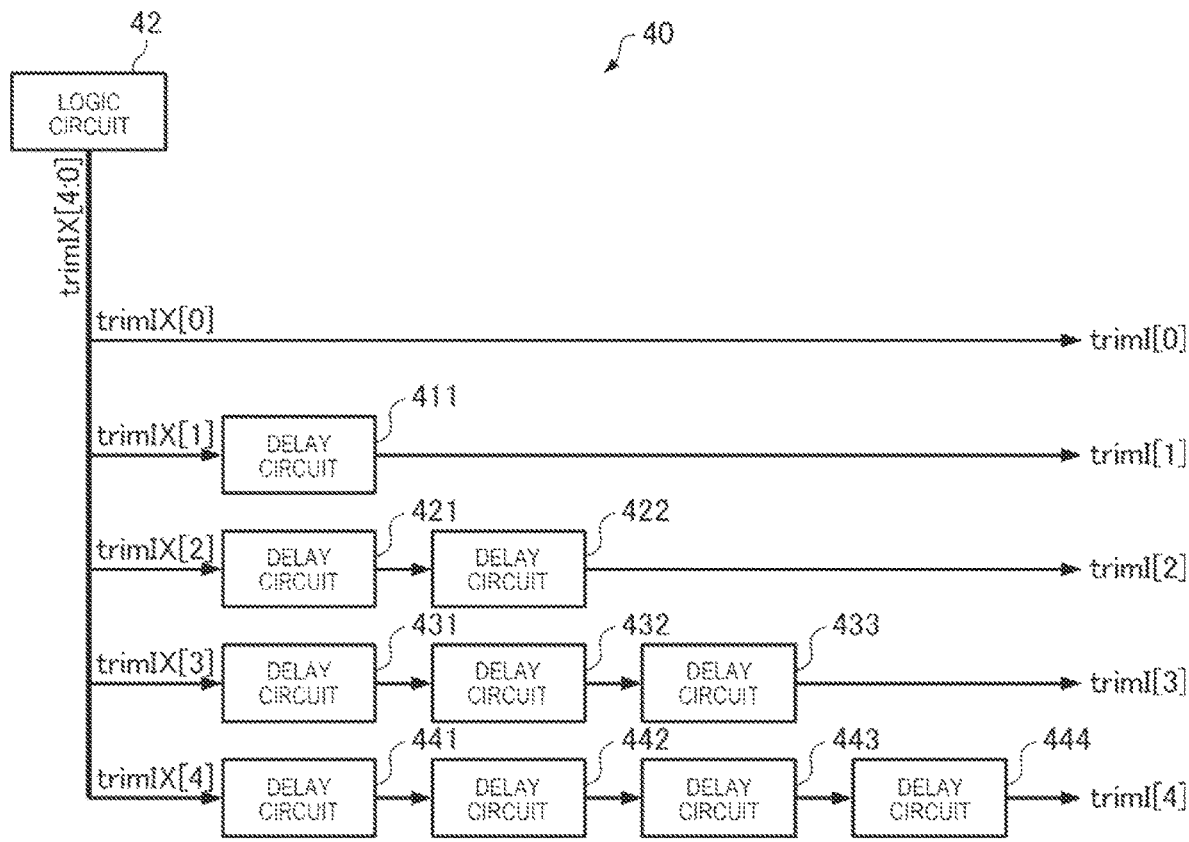
FIG. 26 is a view illustrating a configuration example of a control circuit according to a sixth embodiment.

FIG. 26 is a view illustrating a configuration example of the control circuit 40 according to the sixth embodiment. FIG. 26 illustrates the configuration example of the control circuit 40 when the control data for controlling the negative resistance value |nR| of the oscillating circuit 10 in the start mode is the current adjustment data trimI[4:0]. In the example of FIG. 26, the control circuit 40 includes the logic circuit 42 and ten delay circuits 411, 421, 422, 431, 432, 433, 441, 442, 443, and 444. As in each of the above-described embodiments, the control circuit 40 also includes the voltage control circuit 41, but the illustration is omitted in FIG. 26.

The logic circuit 42 outputs current adjustment data trimIX[4:0]. TrimIX[0] is output as trimI[0]. TrimIX[1] is output as trimI[1] after propagating through the delay circuit 411. TrimIX[2] is output as trimI[2] after propagating through the delay circuits 421 and 422. TrimIX[3] is output as trimI[3] after propagating through the delay circuits 431, 432, and 433. TrimIX[4] is output as trimI[4] after propagating through the delay circuits 441, 442, 443, and 444.

Figure 27:
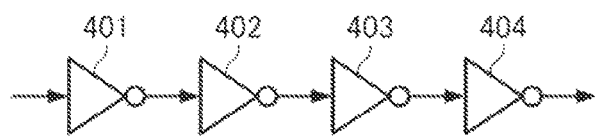
FIG. 27 is a view illustrating a configuration example of a delay circuit.

For example, as illustrated in FIG. 27, the delay circuits 411, 421, 422, 431, 432, 433, 441, 442, 443, and 444 each are a circuit in which the four CMOS inverters 401, 402, 403, and 404 are coupled to each other in series. The number of the CMOS inverters is not limited to four, and may be an even number.

Figure 28:
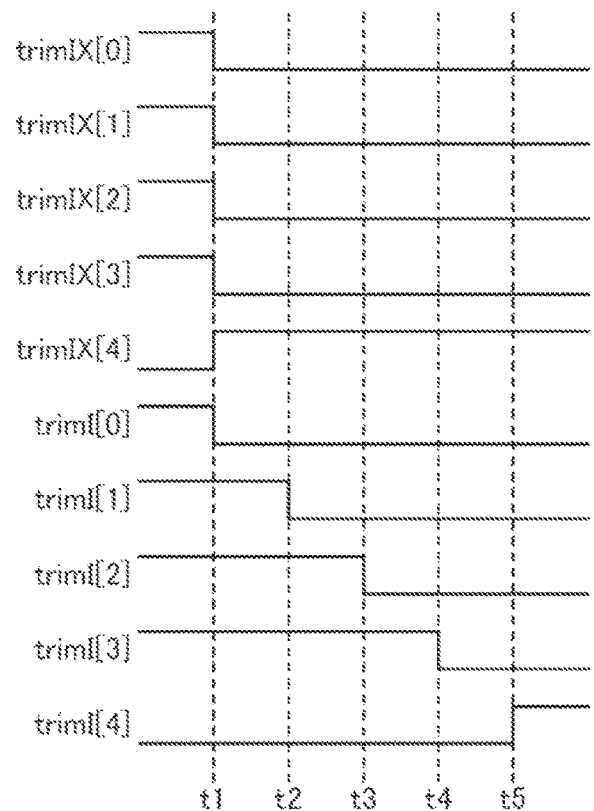
FIG. 28 is a view illustrating an example of a waveform of each bit of current adjustment data.

FIG. 28 is a view illustrating an example of a waveform of each bit of the current adjustment data trimIX[4:0] and trimI[4:0]. In the example of FIG. 28, the waveform of each bit when the current adjustment data trimIX[4:0] is changed from 15 to 16 is illustrated.

In the example of FIG. 28, the logic level of each bit of the current adjustment data trimIX[4:0] is simultaneously changed at time t1. Specifically, each of trimIX[0], trimIX[1], trimIX[2], and trimIX[3] is changed from the high level to the low level, and trimIX[4] is changed from the low level to the high level.

TrimIX[0] is output as the trimI[0] without propagating through the delay circuit. Accordingly, trimI[0] is changed from the high level to the low level at time t1. In addition, after the time t1, the low level of trimIX[1] propagates through the delay circuit 411, and at time t2, trimI[1] is changed from the high level to the low level. In addition, after time t1, the low level of trimIX[2] propagates through the delay circuits 421 and 422, and at time t3, trimI[2] is changed from the high level to the low level. In addition, after time t1, the low level of trimIX[3] propagates through the delay circuits 431, 432, and 433, and at time t4, trimI[3] is changed from the high level to the low level. In addition, after time t1, the high level of trimIX[4] propagates through the delay circuits 441, 442, 443, and 444, and at time t5, trimI[4] is subsequently changed from the low level to the high level.

In this way, in the current adjustment data trimI[4:0] output to the oscillating circuit 10, the logic level is changed in the order of trimI[0], trimI[1], trimI[2], trimI[3], and trimI[4], that is, the logic level of the less weighted bit is changed faster.

Although the illustration is omitted, when the control data for controlling the negative resistance value |nR| of the oscillating circuit 10 in the start mode is the capacitance adjustment data trimC1[4:0] and trimC2[4:0], the control circuit 40 is also configured in the same manner as in FIG. 26.

Other configurations of the oscillator 1 of the sixth embodiment are the same as those of each of the above-described embodiments. Accordingly, illustration and description thereof will be omitted.

In the oscillator 1 of the sixth embodiment described above, in the start mode, when the negative resistance value |nR| of the oscillating circuit 10 is increased, in the current adjustment data trimI[4:0] and the capacitance adjustment data trimC1[4:0] and trimC2[4:0], the logic level of the less weighted bit is changed faster. Therefore, according to the oscillator 1 of the sixth embodiment, when the negative resistance value |nR| of the oscillating circuit 10 is increased, the negative resistance value |nR| does not transiently or rapidly increase. Accordingly, it is possible to reduce a possibility that the oscillation based on the resonance with the sub-vibration of the vibrator 3 may grow to cause abnormal oscillation.

7. Seventh Embodiment

Hereinafter, with regard to the oscillator 1 of a seventh embodiment, the same reference numerals will be assigned to configurations the same as those of any one of the above-described embodiments, and description the same as that of any one of the above-described embodiments will be omitted or simplified. Contents different from those of any one of the above-described embodiments will be mainly described.

Configurations of the oscillator 1 of the seventh embodiment are the same as those in FIGS. 1 to 4. Accordingly, illustration and description thereof will be omitted.

In each of the above-described embodiments, in the start mode, the negative resistance value |nR| of the oscillating circuit 10 is controlled, based on the control data having the weighted multiple bits which is output from the control circuit 40. Therefore, as described above, except for the sixth embodiment, the risk factor of abnormal oscillation caused by the vibrator 3 resonating with the sub-vibration increases.

Therefore, in the seventh embodiment, in order to reduce the risk factor of abnormal oscillation, in the start mode, the negative resistance value |nR| of the oscillating circuit 10 is controlled, based on the control data having unweighted multiple bits which is output from the control circuit 40. The control data having the unweighted multiple bits may be data represented by a thermometer code.

For example, in the start mode, the oscillation stage current Iosc output from the variable current source 12 of the oscillating circuit 10 may be controlled, based on current adjustment data trimI[31:0] having unweighted 32 bits. In this manner, the negative resistance value |nR| may be controlled. In addition, for example, in the start mode, the capacitance values $C_1$ and $C_2$ of the variable capacitance circuits 14 and 15 of the oscillating circuit 10 may be controlled, based on the capacitance adjustment data trimC1[31:0] and trimC2[31:0] having the unweighted 32 bits. In this manner, the negative resistance value |nR| may be controlled.

Figure 29:
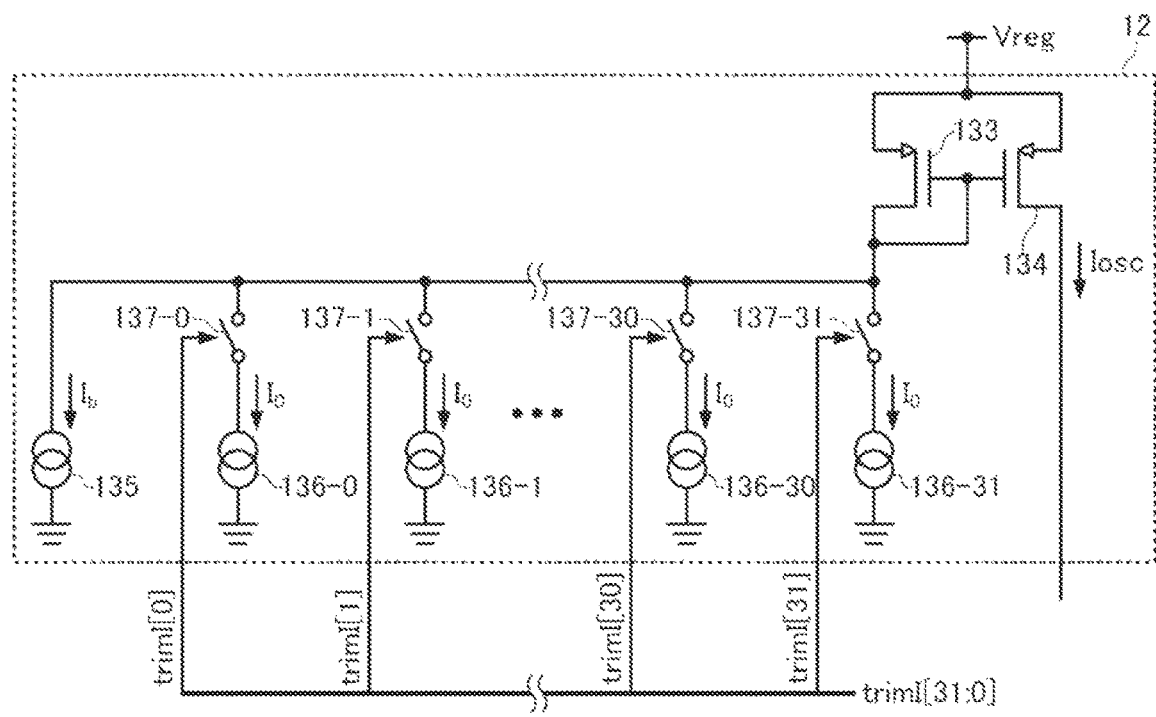
FIG. 29 is a view illustrating a configuration example of a variable current source according to a seventh embodiment.

FIG. 29 is a view illustrating a configuration example of the variable current source 12 controlled by the current adjustment data trimI[31:0] having the unweighted 32 bits. In the example of FIG. 29, the variable current source 12 includes a current source 135, 32 current sources 136-0 to 136-31, 32 switch elements 137-0 to 137-31, and two P-channel type MOS transistors 133 and 134.

In the P-channel type MOS transistor 133, the gate and the drain are coupled to each other, and the voltage Vreg is supplied to the source. In the P-channel type MOS transistor 134, the gate is coupled to the gate of the P-channel type MOS transistor 133, the voltage Vreg is supplied to the source, and the drain is coupled to the collector of the amplifier element 11 in FIG. 5.

One end of the current source 135 is coupled to the drain of the P-channel type MOS transistor 133, and the other end is grounded. A constant bias current $I_b$ flows. For each integer i of 0 or more and 31 or less, one end of a current source 136-$i$ is coupled to the drain of the P-channel type MOS transistor 133 via a switch element 137-$i$, and the other end is grounded. A constant current $I_0$ flows when the switch element 137-$i$ is in a conductive state. For example, the current sources 135 and 136-0 to 136-31 may be configured by using a depletion type N-channel type MOS transistor, or may be configured by using a current mirror circuit.

For each integer i of 0 or more and 31 or less, the switch element 137-$i$ is conductive when data trimI[i] of a bit i of the current adjustment data trimI[31:0] is input to the control terminal and the data trimI[i] is in the high level, and is not conductive when the data trimI[i] is in the low level. For example, the switch elements 137-0 to 137-31 may be the N-channel type MOS transistors, or may be the transmission gates.

FIG. 30 is a view illustrating a relationship between a value of each bit of the current adjustment data trimI[31:0] and a value of the oscillation stage current Iosc output from the variable current source 12 illustrated in FIG. 29. 0 in each bit corresponds to the low level, and 1 in each bit corresponds to the high level. For example, when the bit 0 of the current adjustment data trimI[31:0] is 1 and the bits 1 to 31 are 0, only the switch element 137-0 is conductive, and the oscillation stage current Iosc=$I_b$+$I_0$ is satisfied. In addition, for example, when the bits 0 and 1 of the current adjustment data trimI[31:0] are 1 and the bits 2 to 31 are 0, only the two switch elements 137-0 and 137-1 are conductive, and the oscillation stage current Iosc=$I_b$+2$I_0$ is satisfied. In general, when the number of bits having a value of 1 is defined as N and the number of bits having a value of 0 is defined as 32-N out of 32 bits of the current adjustment data trimI[31:0], the oscillation stage current Iosc=$I_b$+N×$I_0$ is satisfied. In the code illustrated in FIG. 30, the values of the bits 0 to 31 are all 0, or the values of the bits 0 to 31 are all 1. Alternatively, for any integer j of 0 or more and 30 or less, the values of the bits 0 to j are all 1, or the values of the bits j+1 to 31 are all 0. This code is called a thermometer code.

Although the illustration is omitted, the codes of the variable capacitance circuits 14 and 15 or the capacitance adjustment data trimC1[31:0] and trimC2[31:0] when the capacitance values $C_1$ and $C_2$ of the variable capacitance circuits 14 and 15 of the oscillating circuit 10 are controlled, based on the capacitance adjustment data trimC1[31:0] and trimC2[31:0] having the unweighted 32 bits in the start mode are configured in the same manner as in FIG. 29 or 30.

Other configurations of the oscillator 1 of the seventh embodiment are the same as those of each of the above-described embodiments. Accordingly, illustration and description thereof will be omitted.

In the oscillator 1 of the seventh embodiment described above, when the negative resistance value |nR| of the oscillating circuit 10 is increased in the start mode, the current adjustment data trimI[31:0] and the capacitance adjustment data trimC1[31:0] and trimC2[31:0] are unweighted data, for example, data represented by the thermometer code. Therefore, according to the oscillator 1 of the seventh embodiment, when the negative resistance value |nR| of the oscillating circuit 10 is increased, the negative resistance value |nR| does not transiently or rapidly increase. Accordingly, it is possible to reduce a possibility that the oscillation based on the resonance with the sub-vibration of the vibrator 3 may grow to cause abnormal oscillation.

8. Modification Example

In the oscillator 1 of the first embodiment or the fourth embodiment described above, in the start mode, the logic circuit 42 increases the value of the oscillation stage current Iosc in a stepwise manner to control the negative resistance value |nR| to increase in a stepwise manner. However, the value of the oscillation stage current Iosc may be continuously increased to control the negative resistance value |nR| to continuously increase.

In addition, in the oscillator 1 of the second embodiment or the fourth embodiment described above, in the start mode, the logic circuit 42 increases at least one of the capacitance values $C_1$ and $C_2$ of the variable capacitance circuits 14 and 15 in a stepwise manner to control the negative resistance value |nR| to increase in a stepwise manner. However, the logic circuit 42 may continuously increase at least one of the capacitance values $C_1$ and $C_2$ of the variable capacitance circuits 14 and 15 to control the negative resistance value |nR| to continuously increase.

In addition, the oscillator 1 of each of the above-described embodiments is an oscillator having a frequency control function such as a voltage controlled crystal oscillator (VCXO). However, the oscillator 1 may be an oscillator having a temperature compensation function such as a temperature compensated crystal oscillator (TCXO), an oscillator having a temperature compensation function and a frequency control function such as a voltage controlled temperature compensated crystal oscillator (VC-TCXO), a simple oscillator having no a temperature compensation function and frequency control function such as a simple packaged crystal oscillator (SPXO), or an oscillator having a temperature control function such as an oven controlled crystal oscillator (OCXO). The VCXO is an abbreviation for the voltage controlled crystal oscillator. The TCXO is an abbreviation for the temperature compensated crystal oscillator. The VC-TCXO is an abbreviation for the voltage controlled temperature compensated crystal oscillator. The SPXO is an abbreviation for the simple packaged crystal oscillator. The OCXO is an abbreviation for the oven controlled crystal oscillator. When the oscillator 1 is the oscillator having the temperature compensation function or the oscillator having the temperature compensation function and the frequency control function, in the start mode, a temperature compensation circuit may increase the negative resistance value by decreasing the capacitance value of the variable capacitance circuit.

The present disclosure is not limited to the present embodiment, and various modification examples can be made within the scope of the concept of the present disclosure.

The above-described embodiments and modification examples are merely examples, and the present disclosure is not limited thereto. For example, each of the embodiments and each of the modification examples can be combined with each other as appropriate.

The present disclosure includes configurations that are substantially the same as the configurations described in the embodiments, for example, configurations that have the same functions, methods, and results, or configurations that achieves the same object and advantageous effect. In addition, the present disclosure includes a configuration in which a non-essential element of the configuration described in the embodiments is replaced. In addition, the present disclosure includes a configuration that achieves an advantageous effect the same as that of the configuration described in the embodiments or a configuration that can achieve the same object. In addition, the present disclosure includes a configuration in which a known technique is added to the configuration described in the embodiments.

The following contents can be derived from the above-described embodiments and modification examples.

An oscillator circuit according to an aspect of the present disclosure includes an oscillating circuit coupled to a vibrator, and a control circuit that controls the oscillating circuit. The oscillator circuit has a normal operation mode in which the oscillating circuit oscillates in a state where a negative resistance value is a first value, and a start mode in which the oscillator circuit shifts from a state where oscillation is stopped to the normal operation mode. The control circuit controls the negative resistance value to increase from a second value which is smaller than the first value in the start mode.

In the oscillator circuit, in the start mode until a state where the oscillating circuit stops the oscillation is shifted to a normal operation mode in which the oscillating circuit oscillates in a state where the negative resistance value of the oscillating circuit is the first value, the negative resistance value of the oscillating circuit increases from the second value which is smaller than the first value. A load series resistance value $R_{Lm}$ when the vibrator resonates with main vibration is smaller than a load series resistance value $R_{Ls}$ when the vibrator resonates with sub-vibration. Accordingly, the negative resistance value of the oscillating circuit increases from the second value, and becomes a value greater than $R_{Lm}$ and smaller than $R_{Ls}$. Therefore, in the start mode, the oscillation based on the resonance with the main vibration of the vibrator grows before the oscillation based on the resonance with the sub-vibration of the vibrator. Therefore, according to the oscillator circuit, a possibility of abnormal oscillation can be reduced even when the characteristics of the coupled vibrator vary.

In an aspect of the oscillator circuit, in the start mode, the control circuit may control the negative resistance value to increase in a stepwise manner.

In the oscillator circuit, in the start mode, the negative resistance value of the oscillating circuit increases in a stepwise manner from the second value. Accordingly, a time during which the negative resistance value becomes the value greater than $R_{Lm}$ and smaller than $R_{Ls}$ is further lengthened. Therefore, the oscillation based on the resonance with the main vibration of the vibrator grows before the oscillation based on the resonance with the sub-vibration of the vibrator. Therefore, according to the oscillator circuit, a possibility of abnormal oscillation can be reduced even when the characteristics of the coupled vibrator vary.

In an aspect of the oscillator circuit, in the start mode, the control circuit may control the negative resistance value to continuously increase.

In the oscillator circuit, in the start mode, the negative resistance value of the oscillating circuit continuously increases from the second value. Accordingly, a time during which the negative resistance value becomes the value greater than $R_{Lm}$ and smaller than $R_{Ls}$ is further lengthened. Therefore, the oscillation based on the resonance with the main vibration of the vibrator grows before the oscillation based on the resonance with the sub-vibration of the vibrator. Therefore, according to the oscillator circuit, a possibility of abnormal oscillation can be reduced even when the characteristics of the coupled vibrator vary.

In an aspect of the oscillator circuit, the first value may be equal to or greater than a maximum value of the negative resistance value in the start mode.

According to the oscillator circuit, in the start mode, the negative resistance value of the oscillating circuit is not greater than the first value. Accordingly, a time during which the negative resistance value of the oscillating circuit becomes a value greater than the load series resistance value $R_{Ls}$ when the vibrator resonates with the sub-vibration is short, and the resonance with the sub-vibration of the vibrator is less likely to occur.

In an aspect of the oscillator circuit, the oscillating circuit may include an amplifier element and a variable current source that supplies a current to the amplifier element. In the start mode, the control circuit may increase the negative resistance value by increasing a value of the current.

According to the oscillator circuit, for example, a variable current source for setting the current supplied to the amplifier element to a desired value corresponding to the resonance frequency of the vibrator in the normal operation mode can also be used to increase the negative resistance value of the oscillating circuit in the start mode.

In an aspect of the oscillator circuit, the oscillating circuit may include a variable capacitance circuit coupled to a node coupled to the vibrator. In the start mode, the control circuit may increase the negative resistance value by decreasing a capacitance value of the variable capacitance circuit.

According to the oscillator circuit, for example, the variable capacitance circuit for setting the oscillation frequency of the oscillating circuit to a target frequency in the normal operation mode can also be used to increase the negative resistance value of the oscillating circuit in the start mode.

In an aspect of the oscillator circuit, the oscillating circuit may include an amplifier element, a variable current source that supplies a current to the amplifier element, and a variable capacitance circuit coupled to a node coupled to the vibrator. In the start mode, the control circuit may increase the negative resistance value by increasing a value of the current and decreasing a capacitance value of the variable capacitance circuit.

According to the oscillator circuit, for example, the variable current source for setting the current supplied to the amplifier element to a desired value corresponding to the resonance frequency of the vibrator in the normal operation mode, and the variable capacitance circuit for setting the oscillation frequency of the oscillating circuit to a target frequency can also be used to increase the negative resistance value of the oscillating circuit in the start mode. In addition, according to the oscillator circuit, in the start mode, the value of the current supplied to the amplifier element is increased, and the capacitance value of the variable capacitance circuit is decreased. Accordingly, it is possible to reduce a possibility that the oscillating circuit may not oscillate since the capacitance value of the variable capacitance circuit is excessively great, or the value of the current supplied to the amplifier element is excessively small.

In an aspect of the oscillator circuit, in the start mode, the control circuit may increase the value of the current from a third value to a fourth value greater than the third value without changing the capacitance value, and thereafter, may repeatedly control the capacitance value to decrease and the value of the current to be changed to the third value.

According to the oscillator circuit, in the start mode, while the oscillator circuit changes the capacitance value of the variable capacitance circuit, the oscillator circuit repeatedly performs control for increasing the value of the current supplied to the amplifier element from the third value to an upper limit value. Accordingly, it is possible to reduce a possibility that the oscillating circuit may not oscillate since the capacitance value of the variable capacitance circuit is excessively great, or the value of the current supplied to the amplifier element is excessively small. Furthermore, in the oscillator circuit, the control circuit increases the value of the current supplied to the amplifier element from the third value to the fourth value, and thereafter, the control circuit changes the value of the current supplied to the amplifier element to the third value before decreasing the capacitance value of the variable capacitance circuit. In this manner, it is possible to reduce a possibility that the vibrator may resonate with the sub-vibration since the negative resistance value suddenly increases when the capacitance value of the variable capacitance circuit is decreased.

In an aspect of the present disclosure, the oscillator circuit may include an oscillation detection circuit that detects that a signal output from the vibrator has a predetermined or larger amplitude, in the start mode, and outputs a detection signal. The control circuit may set the negative resistance value to the first value, based on the detection signal.

According to the oscillator circuit, when the oscillating circuit oscillates in the start mode, the negative resistance value is set to the first value so that the mode is shifted to the normal operation mode. Accordingly, a start time can be shortened.

In an aspect of the oscillator circuit, the negative resistance value may be controlled, based on control data having weighted multiple bits. In the control data, a logic level of a less weighted bit may be changed faster.

According to the oscillator circuit, when the negative resistance value of the oscillating circuit is increased, the negative resistance value does not transiently or rapidly increase. Accordingly, it is possible to reduce a possibility that the oscillation based on the resonance with the sub-vibration of the vibrator may grow to cause abnormal oscillation.

In an aspect of the oscillator circuit, the negative resistance value may be controlled, based on control data having unweighted multiple bits.

According to the oscillator circuit, when the negative resistance value of the oscillating circuit is increased, the negative resistance value does not transiently or rapidly increase. Accordingly, it is possible to reduce a possibility that the oscillation based on the resonance with the sub-vibration of the vibrator may grow to cause abnormal oscillation.

In an aspect of the oscillator circuit, the control data may be data represented by a thermometer code.

An oscillator according to another aspect of the present disclosure includes the aspect of the oscillator circuit, and the vibrator.

In the oscillator, in the oscillator circuit, in the start mode until a state where the oscillating circuit stops the oscillation is shifted to the normal operation mode in which the oscillating circuit oscillates in a state where the negative resistance value of the oscillating circuit is the first value, the negative resistance value of the oscillating circuit increases from the second value which is smaller than the first value. The load series resistance value $R_{Lm}$ when the vibrator resonates with the main vibration is smaller than the load series resistance value $R_{Ls}$ when the vibrator resonates with the sub-vibration. Accordingly, the negative resistance value of the oscillating circuit increases from the second value, and becomes a value greater than $R_{Lm}$ and smaller than $R_{Ls}$. Therefore, in the start mode, the oscillation based on the resonance with the main vibration of the vibrator grows before the oscillation based on the resonance with the sub-vibration of the vibrator. Therefore, according to the oscillator, a possibility of abnormal oscillation can be reduced even when the characteristics of the vibrator vary.

A method for controlling an oscillator circuit according to still another aspect of the present disclosure is a method for controlling an oscillator circuit coupled to a vibrator. The oscillator circuit has a normal operation mode in which the oscillating circuit oscillates in a state where a negative resistance value is a first value, and a start mode until a state where the oscillating circuit stops oscillation is shifted to the normal operation mode. The method includes controlling the negative resistance value to increase from a second value which is smaller than the first value in the start mode.

In the method for controlling the oscillator circuit, in the start mode until a state where the oscillating circuit stops the oscillation is shifted to the normal operation mode in which the oscillating circuit oscillates in a state where the negative resistance value of the oscillating circuit is the first value, the negative resistance value of the oscillating circuit increases from the second value which is smaller than the first value. The load series resistance value $R_{Lm}$ when the vibrator resonates with the main vibration is smaller than the load series resistance value $R_{Ls}$ when the vibrator resonates with the sub-vibration. Accordingly, the negative resistance value of the oscillating circuit increases from the second value, and becomes a value greater than $R_{Lm}$ and smaller than $R_{Ls}$. Therefore, in the start mode, the oscillation based on the resonance with the main vibration of the vibrator grows before the oscillation based on the resonance with the sub-vibration of the vibrator. Therefore, according to the method for controlling the oscillator circuit, a possibility of abnormal oscillation can be reduced even when the characteristics of the coupled vibrator vary.

What is claimed is:
1. An oscillator circuit comprising:
an oscillating circuit coupled to a vibrator; and a control circuit that controls the oscillating circuit,
wherein the oscillator circuit has a normal operation mode in which the oscillating circuit oscillates in a state where a negative resistance value is a first value, and a start mode in which the oscillator circuit shifts from a state where oscillation is stopped to the normal operation mode,
in the start mode, the control circuit controls the negative resistance value to increase from a second value which is smaller than the first value, and
the negative resistance value is an absolute value of negative resistance of the oscillating circuit.

2. The oscillator circuit according to claim 1,
wherein in the start mode, the control circuit controls the negative resistance value to increase in a stepwise manner.

3. The oscillator circuit according to claim 1,
wherein in the start mode, the control circuit controls the negative resistance value to continuously increase.

4. The oscillator circuit according to claim 1,
wherein the first value is equal to or greater than a maximum value of the negative resistance value in the start mode.

5. The oscillator circuit according to claim 1,
wherein the oscillating circuit includes an amplifier element and a variable current source that supplies a current to the amplifier element, and
in the start mode, the control circuit increases the negative resistance value by increasing a value of the current.

6. The oscillator circuit according to claim 1,
wherein the oscillating circuit includes a variable capacitance circuit coupled to a node coupled to the vibrator, and
in the start mode, the control circuit increases the negative resistance value by decreasing a capacitance value of the variable capacitance circuit.

7. The oscillator circuit according to claim 1,
wherein the oscillating circuit includes an amplifier element, a variable current source that supplies a current to the amplifier element, and a variable capacitance circuit coupled to a node coupled to the vibrator, and
in the start mode, the control circuit increases the negative resistance value by increasing a value of the current and decreasing a capacitance value of the variable capacitance circuit.

8. The oscillator circuit according to claim 7,
wherein in the start mode, the control circuit increases the value of the current from a third value to a fourth value greater than the third value without changing the capacitance value, and thereafter, repeatedly performs control for decreasing the capacitance value and changing the value of the current to be changed to the third value.

9. The oscillator circuit according to claim 1, further comprising:
an oscillation detection circuit that detects that a signal output from the vibrator has a predetermined or larger amplitude, in the start mode, and outputs a detection signal,
wherein the control circuit sets the negative resistance value to the first value, based on the detection signal.

10. The oscillator circuit according to claim 1,
wherein the negative resistance value is controlled, based on control data having weighted multiple bits, and
in the control data, a logic level of a less weighted bit is changed faster.

11. The oscillator circuit according to claim 1,
wherein the negative resistance value is controlled, based on control data having unweighted multiple bits.

12. The oscillator circuit according to claim 11,
wherein the control data is data represented by a thermometer code.

13. An oscillator comprising:
the oscillator circuit according to claim 1; and
the vibrator.

14. A method for controlling an oscillator circuit including an oscillating circuit coupled to a vibrator, and having a normal operation mode in which the oscillating circuit oscillates when a negative resistance value is a first value, and a start mode until a state where the oscillating circuit stops oscillation is shifted to the normal operation mode,
the method comprising:
controlling the negative resistance value to increase from a second value which is smaller than the first value in the start mode,
wherein the negative resistance value is an absolute value of negative resistance of the oscillating circuit.

\* \* \* \* \*